US010680414B2

(12) United States Patent
Takayama et al.

(10) Patent No.: US 10,680,414 B2
(45) Date of Patent: Jun. 9, 2020

(54) NITRIDE-BASED LIGHT-EMITTING DEVICE

(71) Applicant: PANASONIC INTELLECTUAL PROPERTY MANAGEMENT CO., LTD., Osaka (JP)

(72) Inventors: Toru Takayama, Toyama (JP); Tougo Nakatani, Toyama (JP); Takashi Kano, Shiga (JP); Katsuya Samonji, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/181,993

(22) Filed: Nov. 6, 2018

(65) Prior Publication Data

US 2019/0074665 A1 Mar. 7, 2019

Related U.S. Application Data

(63) Continuation of application No. PCT/JP2017/014061, filed on Apr. 4, 2017.

(30) Foreign Application Priority Data

May 13, 2016 (JP) .................................. 2016-097459

(51) Int. Cl.
*H01S 5/20* (2006.01)
*H01S 5/343* (2006.01)
(Continued)

(52) U.S. Cl.
CPC ........ *H01S 5/34333* (2013.01); *H01L 33/145* (2013.01); *H01S 5/2009* (2013.01);
(Continued)

(58) Field of Classification Search
CPC .. H01S 5/34333; H01S 5/34346; H01S 5/343; H01S 5/042; H01S 5/2009;
(Continued)

(56) References Cited

U.S. PATENT DOCUMENTS 6,555,403 B1 4/2003 Domen et al.
8,451,877 B1 * 5/2013 Crawford .............. H01S 5/3413
372/45.01
(Continued)

FOREIGN PATENT DOCUMENTS

JP 11-340580 A 12/1999
JP 2002-270971 A 9/2002
(Continued)

OTHER PUBLICATIONS

Bojarska et al. "Role of electron blocking layer in the graded-index separate confinement heterostructure nitride laser diodes" Superlattices and Microstructures 2018, pp. 114-121. (Year: 2018).*
(Continued)

*Primary Examiner* — Jessica S Manno
*Assistant Examiner* — Delma R. Fordé
(74) *Attorney, Agent, or Firm* — McDermott Will & Emery LLP

(57) ABSTRACT

A nitride-based light-emitting device includes, on a GaN substrate: a first-conductivity-side first semiconductor layer; an active layer; and a second-conductivity-side first semiconductor layer, in the stated order, and further includes an electron barrier layer of a second conductivity type between the active layer and the second-conductivity-side first semiconductor layer, the electron barrier layer including a nitride-based semiconductor containing at least Al. The electron barrier layer has a first region in which an Al composition changes. The Al composition in the first region monotonically increases in a direction from the active layer
(Continued)

to the second-conductivity-side first semiconductor layer. An impurity concentration in the second-conductivity-side first semiconductor layer is lower in a region nearer the electron barrier layer than in a region farther from the electron barrier layer.

20 Claims, 26 Drawing Sheets

(51) Int. Cl.
    *H01S 5/30*     (2006.01)
    *H01L 33/14*     (2010.01)
    *H01L 33/32*     (2010.01)
    *H01S 5/22*     (2006.01)
    *F21Y 115/30*     (2016.01)
    *F21S 41/176*     (2018.01)
    *F21S 41/16*     (2018.01)

(52) U.S. Cl.
    CPC ........ *H01S 5/3054* (2013.01); *H01S 5/34346* (2013.01); *F21S 41/16* (2018.01); *F21S 41/176* (2018.01); *F21Y 2115/30* (2016.08); *H01L 33/32* (2013.01); *H01S 5/22* (2013.01)

(58) Field of Classification Search
CPC .. H01S 5/2003; H01S 5/32341; H01S 5/2216; H01S 5/3013; H01S 5/3063; H01S 5/22–5/2226; H01S 5/3407; H01S 5/3409; F21Y 2115/30; F21S 41/16; F21S 41/176; H01L 33/145; H01L 33/32; H01L 33/14; H01L 33/325; H01L 33/0025
See application file for complete search history.

(56) References Cited

U.S. PATENT DOCUMENTS 9,214,788 B2 * 12/2015 Kawaguchi ............. H01L 33/04
10,164,408 B2 * 12/2018 Takayama ................ H01S 5/22
2002/0053676 A1 * 5/2002 Kozaki .................. B82Y 20/00
    257/88
2006/0118820 A1 * 6/2006 Gaska .................... B82Y 20/00
    257/189
2007/0290230 A1 * 12/2007 Kawaguchi ............ B82Y 20/00
    257/196
2008/0137701 A1     6/2008 Freund
2010/0008391 A1 * 1/2010 Nakagawa ............. B82Y 20/00
    372/45.011
2012/0269222 A1     10/2012 Kyono et al.
2013/0069034 A1 * 3/2013 Hirayama ............... H01L 33/04
    257/13
2014/0191192 A1 * 7/2014 Han ........................ H01L 33/04
    257/13
2015/0179881 A1 * 6/2015 Senes ..................... H01L 33/06
    257/94
2015/0255670 A1 * 9/2015 Furuyama .............. H01L 33/06
    257/13
2016/0149078 A1 * 5/2016 Takeuchi .............. H01S 5/3202
    257/13
2016/0240734 A1 * 8/2016 Avramescu ............ H01L 33/04

FOREIGN PATENT DOCUMENTS

JP     2010-512666 A     4/2010
JP     2012-227492 A     11/2012
JP     2014-003329 A     1/2014

OTHER PUBLICATIONS

Muziol et al. "Aluminum-free nitride laser diodes: waveguiding, electrical and degradation properties" Optics Express vol. 25, No. 26, Dec. 25, 2017, pp. 33113-33121. (Year: 2017).*

Johnson et al. "Blues Diodes laser" American Institute of Physics, Oct. 2000, pp. 31-33 (Year: 2000).*

International Search Report (ISR) and Written Opinion dated Jul. 4, 2017 in International (PCT) Application No. PCT/JP2017/014061; with partial English translation.

* cited by examiner

NITRIDE-BASED LIGHT-EMITTING DEVICE

CROSS REFERENCE TO RELATED APPLICATIONS

This application is a U.S. continuation application of PCT International Patent Application Number PCT/JP2017/014061 filed on Apr. 4, 2017, claiming the benefit of priority of Japanese Patent Application Number 2016-097459 filed on May 13, 2016, the entire contents of which are hereby incorporated by reference.

BACKGROUND

1. Technical Field

The present disclosure relates to a nitride-based light-emitting device.

2. Description of the Related Art

As light sources for vehicle headlights, halogen lamps, high-intensity discharge (HID) headlamps, and light-emitting diode (LED) lamps are widely used today. HID is currently dominant for headlights, and is used in fog lamps, vehicle dress-up light sources, and the like.

Laser headlight light sources that use, as light-emitting devices higher in light emission intensity than LEDs, laser diodes (LDs) to enhance light emission intensity are attracting attention recently. As a light-emitting device used in a headlight light source, for example, an ultrahigh-power blue semiconductor laser capable of long-term operation of thousands of hours or more even in watt-class high-power operation at a high temperature of 85° C. in the 450 nm wavelength band is in demand.

To realize such a light-emitting device, the self-heating of the light-emitting device during laser oscillation operation needs to be reduced as much as possible. Moreover, the light-emitting device needs to achieve ultra-low power consumption operation by low operating current and low-voltage operation.

To achieve low operating current, it is important to suppress leakage current in the light-emitting device, i.e. electrons injected into an active layer as a light-emitting layer being thermally excited and leaking from the active layer to a P-type cladding layer. For example, the techniques described in Japanese Unexamined Patent Application Publication No. 2002-270971 and Japanese Unexamined Patent Application Publication No. 2014-3329 use, between the P-type cladding layer and the active layer, an electron barrier layer higher in bandgap energy than the cladding layer, in order to suppress leakage current.

SUMMARY

To reduce power consumption in the light-emitting device as much as possible, merely suppressing leakage current is not sufficient, and it is necessary to simultaneously reduce waveguide loss, suppress leakage current, and reduce operating voltage.

The present disclosure has an object of providing a light-emitting device that can simultaneously reduce waveguide loss, suppress leakage current, and reduce operating voltage.

A nitride-based light-emitting device according to one aspect of the present disclosure includes, on a GaN substrate: a first-conductivity-side first semiconductor layer including a nitride-based semiconductor of a first conductivity type; an active layer including a nitride-based semiconductor containing Ga or In; and a second-conductivity-side first semiconductor layer including a nitride-based semiconductor of a second conductivity type, in the stated order, and further includes an electron barrier layer of the second conductivity type between the active layer and the second-conductivity-side first semiconductor layer, the electron barrier layer including a nitride-based semiconductor containing at least Al, wherein the electron barrier layer has a first region in which an Al composition changes, the Al composition in the first region monotonically increases in a direction from the active layer to the second-conductivity-side first semiconductor layer, and an impurity concentration in the second-conductivity-side first semiconductor layer is lower in a region nearer the electron barrier layer than in a region farther from the electron barrier layer.

According to the present disclosure, a light-emitting device that can simultaneously reduce waveguide loss, suppress leakage current, and reduce operating voltage can be provided.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

Figure 1A:
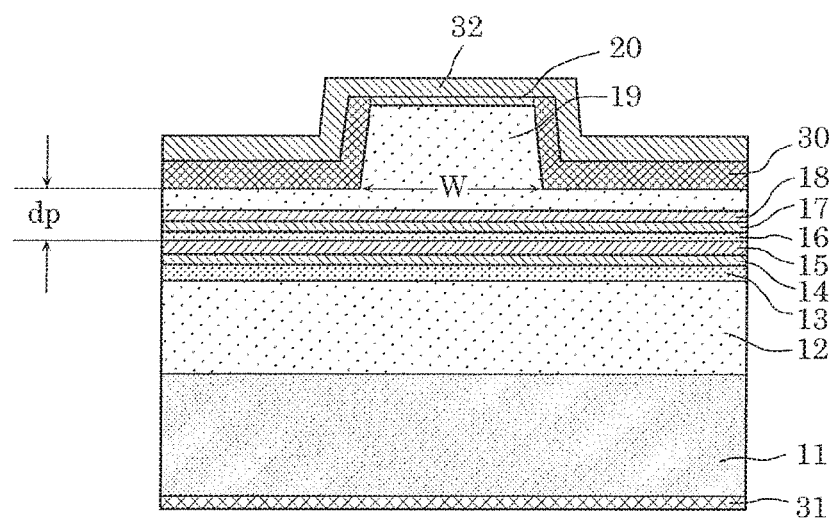
FIG. 1A is a sectional view illustrating the sectional structure of a light-emitting device according to Embodiment 1 of the present disclosure.

DETAILED DESCRIPTION OF THE EMBODIMENTS (Underlying Knowledge Forming Basis of the Present Disclosure)

Prior to the description of the embodiments, underlying knowledge forming basis of the present disclosure is explained below.

As light sources for vehicle headlights, halogen lamps, high-intensity discharge (HID) headlamps, and light-emitting diode (LED) lamps are widely used today.

Halogen lamps use light emitted when applying current to an internal filament to become white-hot, with a small amount of halogen gas being added to inert gas such as nitrogen or argon sealed into the bulb. Halogen lamps are conventionally widely used. HID lamps, unlike halogen lamps, have no filament, and emit light as long as discharge is possible without the bulb being burnt out. HID lamps are typically more expensive than halogen lamps, but have advantages such as high luminance and long life with low power consumption. LED lamps have long life, are easily replaceable as only the bulb needs to be changed, consume lower power than HID, and have a low amount of heat generation. However, LED lamps are less bright than HID. Accordingly, HID is currently dominant for headlights, and is used in fog lamps, vehicle dress-up light sources, and the like. Laser headlight light sources that use, as light-emitting devices higher in light emission intensity than LEDs, laser diodes (LDs) as light sources to enhance light emission intensity are attracting attention recently. As a light-emitting device used in a headlight light source, an ultrahigh-power blue semiconductor laser capable of long-term operation of thousands of hours or more even in watt-class high-power operation at a high temperature of 85° C. in the 450 nm wavelength band is in demand. If yellow light can be obtained by exciting phosphors with such an ultrahigh-power blue semiconductor laser, an ultrahigh-power light source of white color as whole irradiation light can be realized.

To realize such a high-reliability ultrahigh-power blue semiconductor laser, the self-heating of the device during laser oscillation operation needs to be reduced as much as possible. Moreover, the device needs to achieve ultra-low power consumption operation by low operating current and low-voltage operation.

A semiconductor laser typically has a double heterojunction (DH) structure in which an active layer as a light-emitting layer is interposed between N-type and P-type cladding layers higher in bandgap energy than the active layer. To achieve low operating current in the semiconductor laser, it is important to suppress reactive current (leakage current), i.e. electrons injected into the active layer being thermally excited and leaking from the active layer to the P-type cladding layer, even in high-temperature operation of 85° C.

An effective way of suppressing leakage current is to use, between the P-type cladding layer and the active layer, an electron barrier layer higher in bandgap energy than the cladding layer, as described in Japanese Unexamined Patent Application Publication No. 2002-270971 and Japanese Unexamined Patent Application Publication No. 2014-3329.

With such a structure, electrons injected into the active layer are prevented from passing through the electron barrier layer having high bandgap energy, even when thermally excited. Leakage current in the semiconductor laser can therefore be suppressed.

Thus, an effective way of suppressing leakage current is to use, between the P-type cladding layer and the active layer, an electron barrier layer higher in bandgap energy than the cladding layer.

Figure 28:
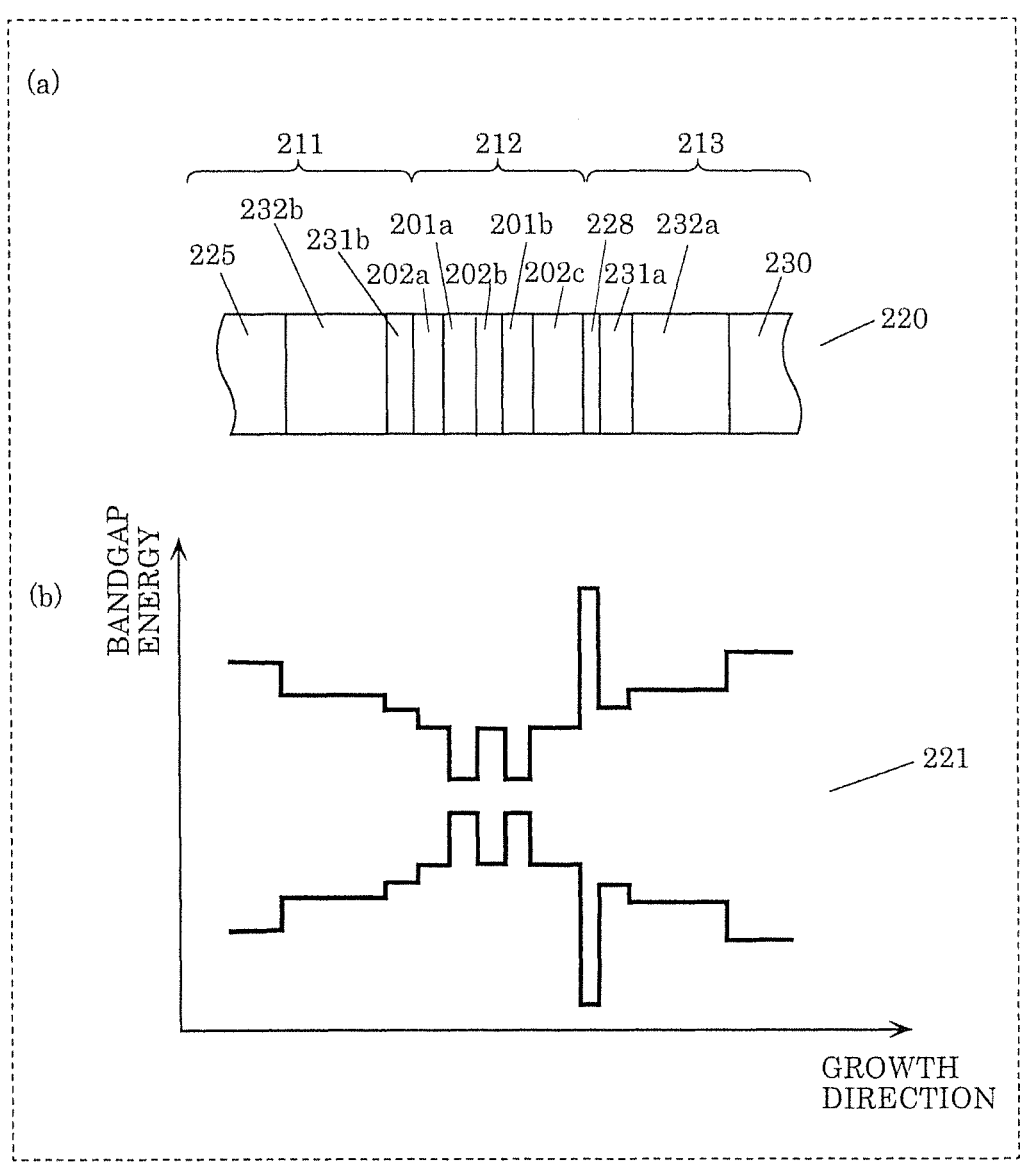
FIG. 28 is a diagram illustrating, in (a), the structure of a conventional light-emitting device, and in (b), its band structure.

For example, in a structure according to Japanese Unexamined Patent Application Publication No. 2002-270971, active layer 212 is interposed between N-type layer 211 and P-type layer 213, and P-side electron confinement layer 228 higher in bandgap energy than upper cladding layer 230 is provided between active layer 212 and upper cladding layer 230, as illustrated in (a) and (b) in FIG. 28. In this structure, electrons injected into active layer 212 are unlikely to leak to upper cladding layer 230 even in high-temperature operation, due to an energy barrier of P-side electron confinement layer 228 made of AlGaN.

Figure 29A:
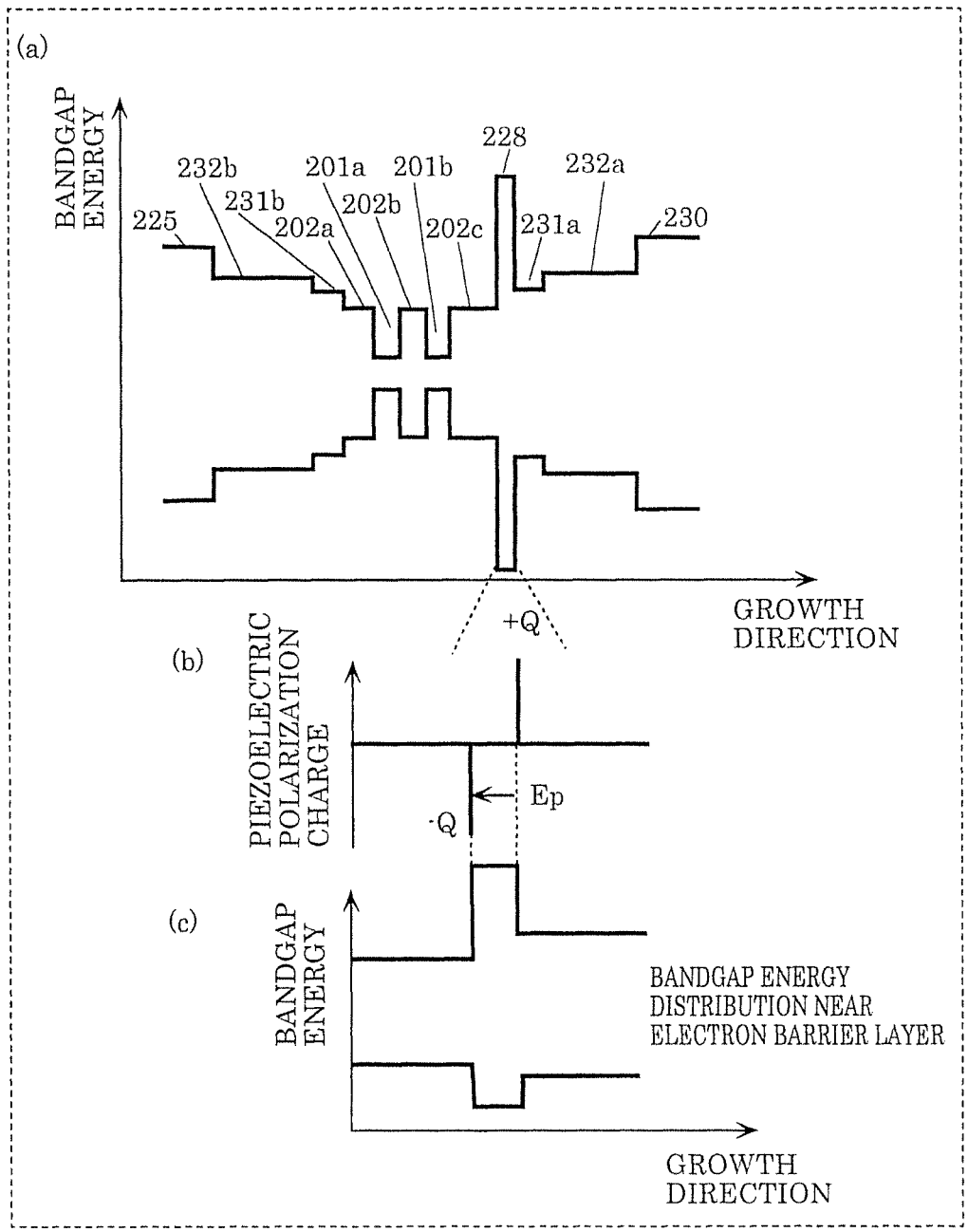
FIG. 29A is a diagram illustrating, in (a), the bandgap energy distribution in the growth layer direction of the conventional light-emitting device, in (b), a piezoelectric polarization charge, and in (c), the bandgap energy distribution near an electron barrier layer.
Figure 29B:
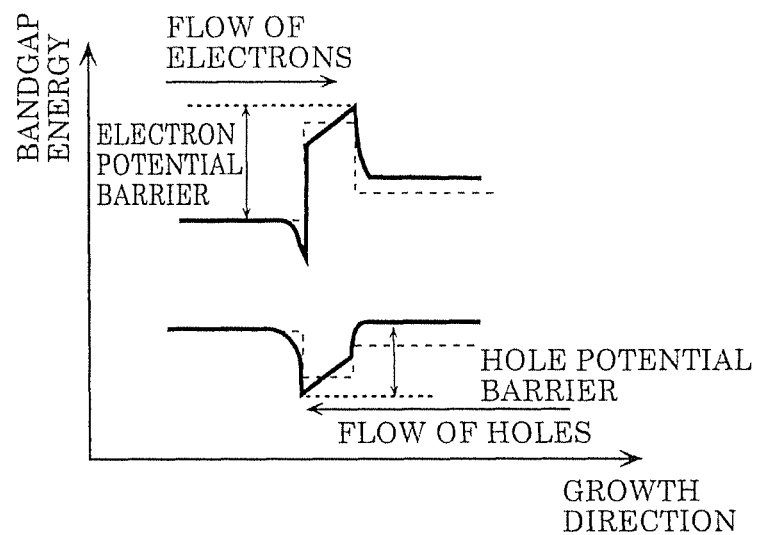
FIG. 29B is a diagram illustrating the band structure change of the electron barrier layer due to a piezoelectric field.

Nitride-based material is known to have piezoelectricity (piezoelectric effect) as physical property from an atomic arrangement of a wurtzite (WZ)-type crystal structure in the case where (0001) plane (C plane) of GaN crystal is used in a substrate, because GaN has the WZ-type crystal structure. In this case, when the crystal is subjected to stress, a new electric field is generated in the crystal by polarization in response to the stress. In detail, as illustrated in FIGS. 29A and 29B, there is lattice mismatch between GaN and P-side electron confinement layer 228 made of AlGaN, which causes stress. As a result, the crystal structure of GaN and P-side electron confinement layer 228 made of AlGaN is strained. This generates an electric field by piezoelectric effect, and deforms the band structure of P-side electron confinement layer 228. Here, the band structure of P-side electron confinement layer 228 deforms so as to increase energy on the P side, as illustrated in (b) and (c) in FIG. 29A and FIG. 29B. When such deformation occurs, the energy barrier in P-side electron confinement layer 228 against holes injected into active layer 212 from P-type cladding layer 230 increases, whereas the energy barrier against electrons leaking from active layer 212 to P-type cladding layer 230 decreases. Consequently, the operating voltage and leakage current of the device increase, leading to an increase in power consumption.

Figure 30:
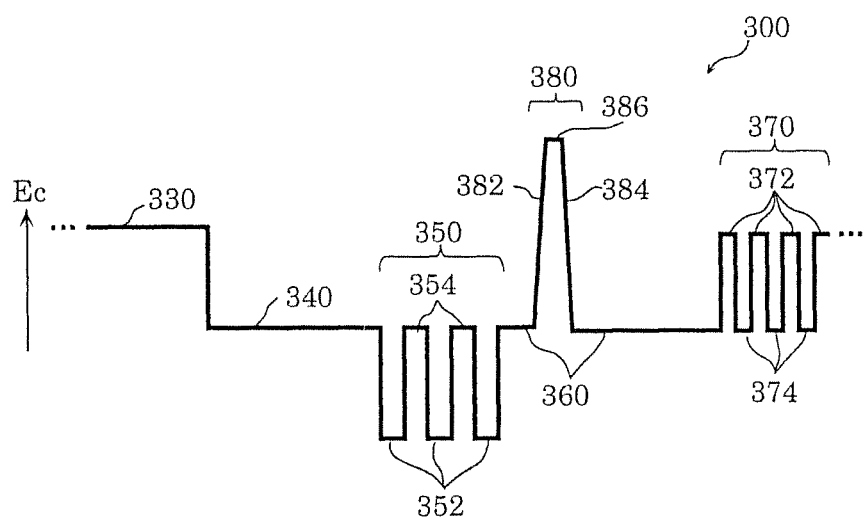
FIG. 30 is a diagram illustrating the band structure of a conventional light-emitting device.

Japanese Unexamined Patent Application Publication No. 2014-3329 discloses a structure in which P-type AlGaN electron barrier layer 380 is formed between active layer 350 and cladding layer 370 and the Al composition is gradually changed in both interface regions 382 and 384 of P-type AlGaN electron barrier layer 380, as illustrated in FIG. 30. In this structure, the Al composition in both interface regions of P-type AlGaN electron barrier layer 380 are gradually changed to disperse stress generated in both interface regions 382 and 384, thus reducing stress applied to active layer 350.

When the Al composition is gradually changed in an interface of P-type AlGaN electron barrier layer 380, a piezoelectric field formed in the interface is dispersed in the region in which the Al composition changes. Thus, the change in the band structure of P-type AlGaN electron barrier layer 380 due to the piezoelectric field can be controlled.

By gradually increasing the Al composition on the N-type cladding layer side of P-type AlGaN electron barrier layer 380 in the direction from the active layer to the P-type cladding layer, the piezoelectric field and the bandgap energy can be changed gradually. Here, if compensation can be made so that the change in the band structure of the valence band by the piezoelectric field and the change in the bandgap energy cancel each other out, the energy barrier against electrons can be increased without increasing the energy barrier against holes in the electron barrier layer.

Since the energy barrier against electrons in P-type AlGaN electron barrier layer 380 needs to be increased to suppress leakage current, the Al composition in P-type AlGaN electron barrier layer 380 needs to be at least as high as about 20%. When the Al composition in P-type AlGaN electron barrier layer 380 is high, the activation rate of Mg used as a P-type dopant tends to decrease. This makes it necessary to increase the ionization acceptor density to increase the conduction band energy of P-type AlGaN electron barrier layer 380. Thus, the doping concentration of Mg in P-type AlGaN electron barrier layer 380 needs to be increased relative to other P-type layers. In this case, if the film thickness of P-type AlGaN electron barrier layer 380 is excessively thick, the influence of free carrier loss in P-type AlGaN electron barrier layer 380 on the light distribution formed in the laser waveguide increases. This decreases the ratio (slope efficiency) of the change of light output to injection current in current-light output characteristics, leading to an increase in operating current value.

If P-type AlGaN electron barrier layer 380 is excessively thin, on the other hand, the film thickness of P-type AlGaN electron barrier layer 380 in interface region 382 in which the Al composition is sloped decreases. It is therefore difficult to control the Al composition and the film thickness so that the change in the band structure of the valence band by the piezoelectric field and the change in the bandgap energy cancel each other out.

Hence, simply changing the Al composition in interface regions 382 and 384 of Al composition slope electron barrier layer 380 is not sufficient to suppress an increase in the waveguide loss in P-type AlGaN electron barrier layer 380, suppress an increase in the energy barrier against holes in P-type AlGaN electron barrier layer 380, and increase the energy barrier against electrons. Japanese Unexamined Patent Application Publication No. 2014-3329 does not address the influence of the Al composition slope of P-type AlGaN electron barrier layer 380 on leakage current, operating voltage, and waveguide loss.

As a nitride-based blue semiconductor laser used for a light source of a vehicle headlight, an ultrahigh-power blue semiconductor laser capable of long-term operation of thousands of hours or more even in watt-class high-power operation at a high temperature of 85° C. is in demand. There is thus a need to reduce the power consumption of an ultra-high dimming output blue semiconductor laser as much as possible. It is therefore necessary to simultaneously reduce waveguide loss, suppress leakage current, and reduce operating voltage.

Each nitride-based light-emitting device described below can realize a low-power-consumption, high-reliability watt-class ultrahigh-power laser with little leakage current even in high-temperature operation of 85° C.

The following describes embodiments of the present disclosure with reference to drawings. The embodiments described below each show a specific example of the present disclosure. The numerical values, shapes, materials, structural elements, the arrangement and connection of the structural elements, steps, the order of steps, etc. shown in the following embodiments are mere examples, and do not limit the scope of the present disclosure. Of the structural elements in the embodiments described below, the structural elements not recited in any one of the independent claims representing the broadest concepts of the present disclosure are described as optional structural elements.

Each drawing is a schematic and does not necessarily provide precise depiction. The substantially same structural elements are given the same reference marks throughout the drawings, and repeated description is omitted or simplified.

Embodiment 1

FIG. 1A illustrates the sectional structure of a nitride-based light-emitting device (hereafter also simply referred to as "light-emitting device") according to Embodiment 1. FIG. 1A is a sectional view of a light-emitting device including GaN substrate 11, and, on GaN substrate 11: N-type AlGaN cladding layer 12 (film thickness: 1.2 μm); second light guide layer 13 (100 nm) made of N-type GaN; third light guide layer 14 (film thickness: 185 nm) made of undoped InGaN; undoped multiquantum well active layer 15; first light guide layer 16 (film thickness: 100 nm) made of undoped InGaN; intermediate layer 17 (film thickness: 5 nm) made of P-type GaN; P-type electron barrier layer 18; P-type AlGaN cladding layer 19 (film thickness: 660 nm); P-type GaN contact layer 20 (film thickness: 0.1 μm); current block layer 30 transparent to a light distribution; N-type electrode 31; and P-type electrode 32. The width (W) of the ridge is 16.0 μm.

The distance between the ridge upper portion of P-type AlGaN cladding layer 19 and multiquantum well active layer 15 is 0.87 μm, and the distance between the ridge lower end of P-type AlGaN cladding layer 19 and multiquantum well active layer 15 is dp (0.2 μm).

N-type AlGaN cladding layer 12 corresponds to a first-conductivity-side first semiconductor layer in the present disclosure, and includes at least a nitride-based semiconductor ($Al_xGa_{1-x-y}In_yN$) of N type which is a first conductivity type.

Multiquantum well active layer 15 corresponds to an active layer in the present disclosure, and is made of a material of a nitride-based semiconductor containing at least Ga or In.

P-type AlGaN cladding layer 19 corresponds to a second-conductivity-side first semiconductor layer in the present disclosure, and includes at least a nitride-based semiconductor ($Al_xGa_{1-x-y}In_yN$) of P type which is a second conductivity type.

P-type electron barrier layer 18 includes a nitride-based semiconductor containing at least Al. Electron barrier layer 18 has Al composition increase region (first region) 18a in which the Al composition changes. The Al composition in Al composition increase region 18a monotonically increases in the direction from multiquantum well active layer 15 to P-type AlGaN cladding layer 19. The impurity concentration in P-type AlGaN cladding layer 19 is lower in low-doped region 19a nearer electron barrier layer 18 than in high-doped region 19b farther from the electron barrier layer. The structure of electron barrier layer 18 will be described in detail later.

In this embodiment, the Al composition in N-type AlGaN cladding layer 12 and P-type AlGaN cladding layer 19 is 0.035 (3.5%), to confine light in multiquantum well active layer 15 in the vertical direction (substrate normal direction). When the Al composition in N-type AlGaN cladding layer 12 and P-type AlGaN cladding layer 19 is high, a large refractive index difference between multiquantum well active layer 15 and each of N-type AlGaN cladding layer 12 and P-type AlGaN cladding layer 19 can be obtained. This enhances vertical light confinement in multiquantum well active layer 15, with it being possible to reduce the oscillation threshold current value. If the Al composition in AlGaN cladding layer 12 is excessively high, however, a lattice defect occurs due to the difference in thermal expansion coefficient between N-type AlGaN cladding layer 12 and GaN substrate 11, leading to a decrease in reliability. Accordingly, the device needs to be produced with the Al composition in AlGaN cladding layer 12 being limited to 0.05 (5%) or less.

Figure 1B:
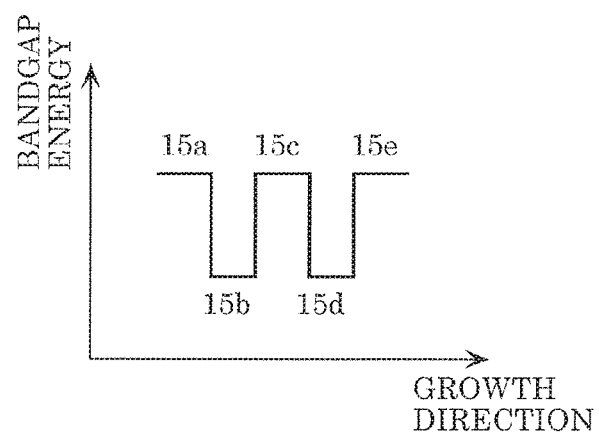
FIG. 1B is a diagram illustrating the bandgap energy distribution in the growth layer direction of the light-emitting device according to Embodiment 1 of the present disclosure.

Multiquantum well active layer 15 in this embodiment has a double quantum well (DQW) structure having two InGaN well layers 15b and 15d with a thickness of 30 Å and an In composition of 0.16 (16%) in order to obtain laser oscillation of 450 nm in wavelength, as illustrated in FIG. 1B. Barrier layers 15a, 15c, and 15e in multiquantum well active layer 15 are InGaN with a thickness of 7 nm and an In composition of 0.008 (0.8%).

The In composition in InGaN well layers 15b and 15d needs to be a high composition of 15% or more, in order to obtain laser oscillation light in the 450 nm band. In this case, the lattice misfit with GaN is 1.7% or more. If the film thicknesses of InGaN well layers 15b and 15d are excessively thick, a lattice defect occurs. If the film thicknesses of InGaN well layers 15b and 15d are excessively thin, the vertical light confinement coefficient to InGaN well layers 15b and 15d decreases, and the oscillation threshold and the operation career density increase. This causes an increase in leakage current in high-temperature operation. The film thicknesses of InGaN well layers 15b and 15d may therefore be in a range of 27 Å or more and 33 Å or less.

If the In composition in first light guide layer 16 and third light guide layer 14 is low, the vertical light confinement to InGaN well layers 15b and 15d decreases, and the oscillation threshold and the operation career density increase. This causes an increase in leakage current in high-temperature operation. If the In composition in first light guide layer 16 and third light guide layer 14 is high, a lattice defect tends to occur due to an increase in lattice misfit between InGaN and GaN. Therefore, to increase the vertical light confinement coefficient to InGaN well layers 15b and 15d without causing a lattice defect, the In composition in first light guide layer 16 and third light guide layer 14 may be 0.03 (3%) or more and 0.06 (6%) or less.

In this embodiment, the In composition in first light guide layer 16 and third light guide layer 14 is set to 0.03 (3%), thus increasing the vertical light confinement coefficient to InGaN well layers 15b and 15d while preventing a lattice defect.

Current block layer 30 (0.1 μm) of a dielectric made of $SiO_2$ is formed on the ridge side surface. In this structure, current injected from P-type GaN contact layer 20 is constricted only to the ridge portion by current block layer 30, and concentrated into multiquantum well active layer 15 located below the ridge lower end. The population inversion state of careers necessary for laser oscillation is achieved by an injection current of about 100 mA. Regarding light emitted as a result of recombination of careers made up of electrons and holes injected into multiquantum well active layer 15, light in the direction vertical to multiquantum well active layer 15 is confined by first light guide layer 16, third light guide layer 14, N-type AlGaN cladding layer 12, and P-type AlGaN cladding layer 19. Light in the direction (hereafter, horizontal direction) parallel to multiquantum well active layer 15 is confined because current block layer 30 is lower in refractive index than N-type AlGaN cladding layer 12 and P-type AlGaN cladding layer 19. Moreover, since current block layer 30 is transparent to laser oscillation light, no light absorption is performed, so that a low-loss waveguide can be achieved. In addition, the light distribution propagating through the waveguide can greatly infiltrate into current block layer 30, so that ΔN (the difference in vertical effective refractive index between the inside and the outside of the ridge) on the order of $1 \times 10^{-3}$ suitable for high-power operation can be obtained easily. Further, the value of ΔN can be controlled precisely on the order of $1 \times 10^{-3}$, based on the distance (dp) between current block layer 30 and multiquantum well active layer 15. Hence, a high-power light-emitting device with low operating current can be obtained while precisely controlling the light distribution. In this embodiment, the value of ΔN is set to $5 \times 10^{-3}$ to confine light in the horizontal direction.

Figure 2A:
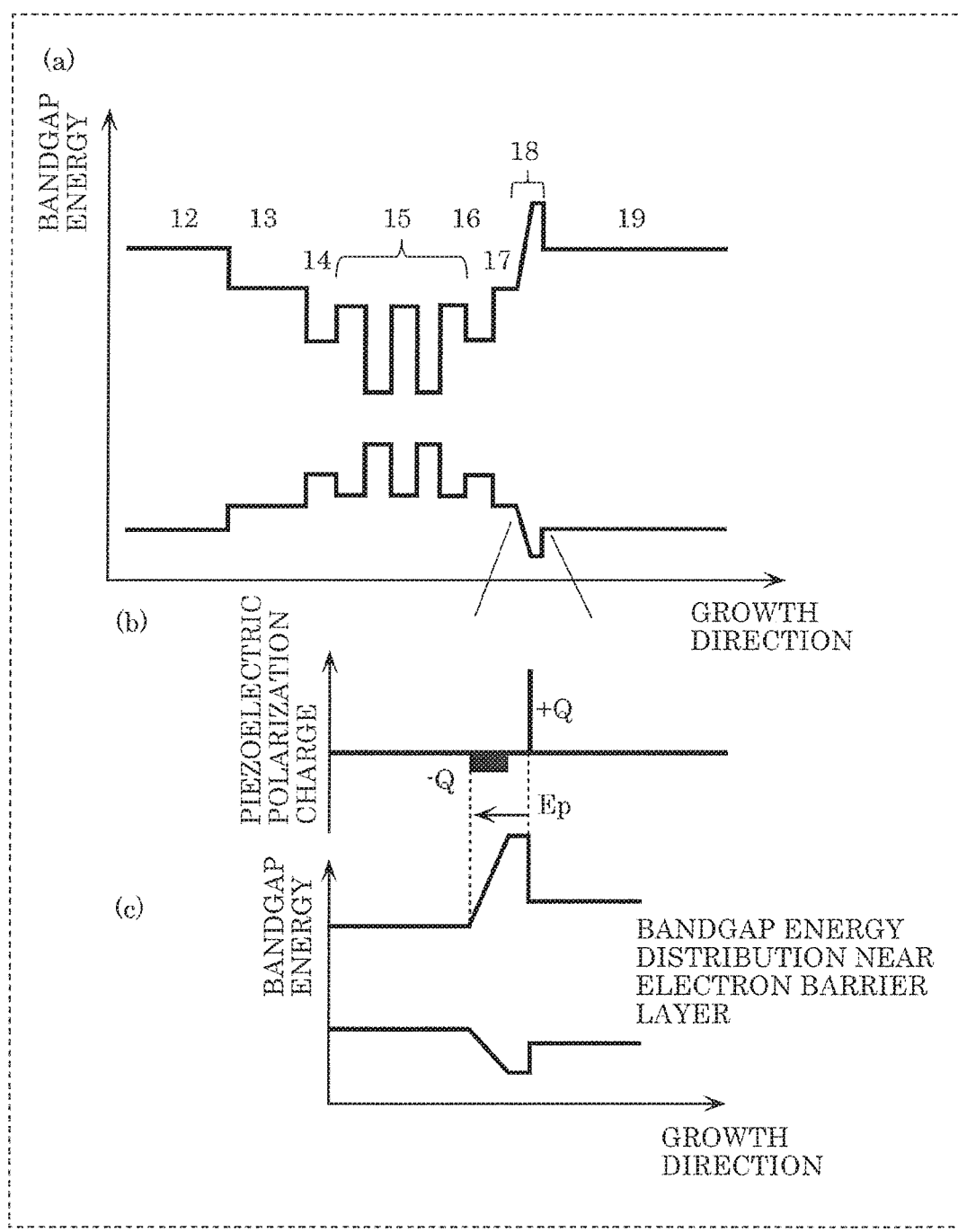
FIG. 2A is a diagram illustrating, in (a), the bandgap energy distribution in the growth layer direction of the light-emitting device according to Embodiment 1 of the present disclosure, in (b), a piezoelectric polarization charge, and in (c), the bandgap energy distribution near an electron barrier layer.

(a) in FIG. 2A illustrates the bandgap energy distribution in the growth layer direction of the structure according to this embodiment.

As illustrated in (a) in FIG. 2A, E1>E2, where E1 is the bandgap energy of N-type AlGaN cladding layer 12 and E2 is the bandgap energy of second light guide layer 13. Moreover, E2>E3, where E2 is the bandgap energy of second light guide layer 13 and E3 is the bandgap energy of third light guide layer 14.

Nitride-based semiconductor material has a property of increasing in lattice constant and refractive index when the bandgap energy is high. An effective way of decreasing the oscillation threshold current value necessary for laser oscillation to reduce the operating current value is to enhance vertical light confinement to the active layer. An effective way of enhancing the vertical light confinement to the active layer is to increase the refractive index difference between the active layer and the cladding layer, or to form a light guide layer higher in refractive index than the cladding layer between the active layer and the cladding layer to facilitate the concentration of the vertical light distribution into the active layer.

In this embodiment, AlGaN with a low refractive index is used in N-type cladding layer 12 to enhance the vertical light confinement, in order to increase the refractive index difference from InGaN well layers 15b and 15d included in multiquantum well active layer 15. Moreover, third light guide layer 14 with a relatively low bandgap energy and a relatively high refractive index is formed between multiquantum well active layer 15 and N-type AlGaN cladding layer 12, to further enhance the vertical light confinement. With such a structure, the vertical light confinement coefficient can be enhanced to reduce the oscillation threshold current value and the operating current value, as compared with the case where multiquantum well active layer 15 is formed on N-type AlGaN cladding layer 12.

If third light guide layer 14 is formed on N-type AlGaN cladding layer 12 in contact with N-type AlGaN cladding layer 12, their large difference in lattice constant increases the stress in the interface, which facilitates a lattice defect. In the case where a lattice defect occurs, non-light-emitting recombination not contributing to laser oscillation becomes dominant, as a result of which the oscillation threshold current value and the operating current value increase. This significantly hinders guaranteed long-term reliability operation in a high-temperature high-power state.

In this embodiment, second light guide layer 13 whose bandgap energy E2 is between E1 and E3 is provided between N-type AlGaN cladding layer 12 and third light guide layer 14, in order to prevent a lattice defect. In this case, since the lattice constant of second light guide layer 13 is between the lattice constant of N-type AlGaN cladding layer 12 and the lattice constant of third light guide layer 14, the stress caused by the difference in lattice constant between N-type AlGaN cladding layer 12 and third light guide layer 14 can be reduced. A lattice defect in the interface can thus be prevented.

The refractive index of second light guide layer 13 is also between the refractive index of N-type AlGaN cladding layer 12 and the refractive index of third light guide layer 14, as with the lattice constant. If the film thickness of second light guide layer 13 is excessively thick, the distance of N-type AlGaN cladding layer 12 from multiquantum well active layer 15 increases, which weakens the vertical light confinement. Accordingly, in this embodiment, the film thickness of second light guide layer 13 is thinner than the film thickness of third light guide layer 14, to prevent a lattice defect in the interface and also increase the vertical light confinement to multiquantum well active layer 15.

Electron barrier layer 18 is made of AlGaN, and includes: Al composition increase region 18a in which the Al composition gradually increases in a range of a film thickness of 5 nm from GaN where the Al composition is 0 (0%) to AlGaN where the Al composition is 0.35 (35%); and region 18b (film thickness: 2 nm) in which the Al composition is constant at 0.35 (35%). Thus, the bandgap energy of electron barrier layer 18 on the multiquantum well active layer 15 side gradually increases along the vertical direction, as illustrated in (a) in FIG. 2A.

As illustrated in (a) in FIG. 29A, when electron barrier layer (P-side electron confinement layer) 228 is AlGaN that is constant in composition, a charge by piezoelectric polarization as illustrated in (b) in FIG. 29A is applied to both interfaces of electron barrier layer 228, due to tensile strain. In this case, electron barrier layer 228 is subjected to electric field Ep as illustrated in (b) in FIG. 29A, and the band structure of electron barrier layer 228 changes as illustrated in FIG. 29B, where the potential barrier against holes increases and the potential barrier against electrons decreases. As a result, the operating voltage increases, the power consumption of the device increases, and the self-heating of the device increases. Particularly in high-temperature operation, electrons injected into multiquantum well active layer 212 tend to pass through electron barrier layer 228 and leak to the cladding layer 230 side. This impairs the temperature characteristics.

Figure 2B:
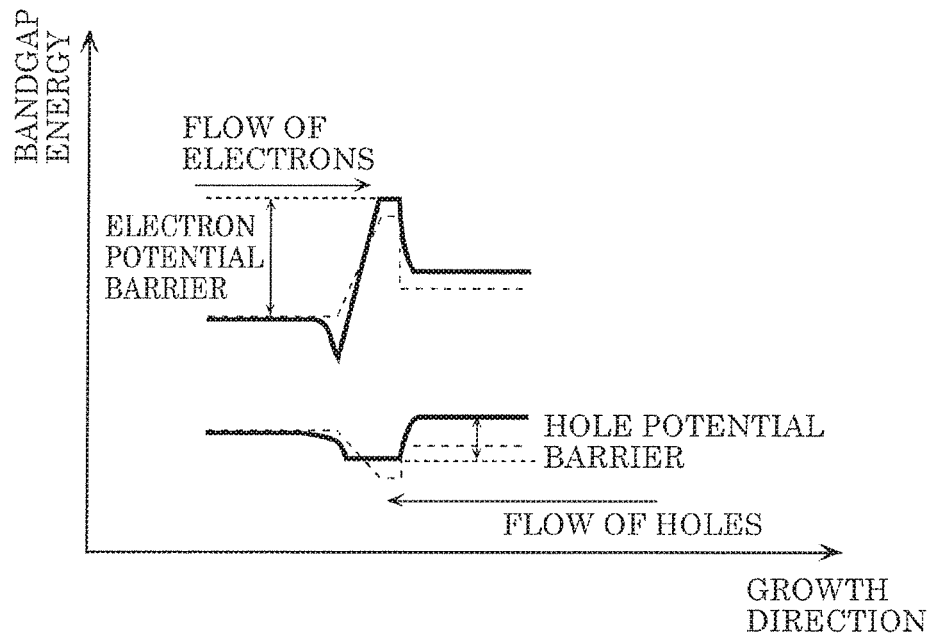
FIG. 2B is a diagram illustrating the band structure change of the electron barrier layer due to a piezoelectric field.

On the other hand, in electron barrier layer 18 in the structure according to this embodiment illustrated in (a) in FIG. 2A, the Al composition gradually changes in the interface on the multiquantum well active layer 15 side as illustrated in (b) and (c) in FIG. 2A. Thus, in region 18a on the multiquantum well active layer 15 side in which the Al composition changes, the piezoelectric polarization charge generated in electron barrier layer 18 is dispersed, and the magnitude of the electric field (piezoelectric field) generated by the piezoelectric polarization charge gradually changes, too. When the Al composition gradually changes, the bandgap energy gradually changes, too. Therefore, the change in the band structure of the valence band of electron barrier layer 18 caused by the piezoelectric field can be effectively canceled out by the change in the valence band structure caused by the composition change of electron barrier layer 18, as schematically illustrated in FIG. 2B. Here, by suppressing an increase in the energy barrier of electron barrier layer 18 against holes, the operating voltage of light-emitting device 1 can be decreased, and the energy barrier against electrons can be increased.

Detailed estimation by numerical calculation of the dependence of the operating voltage of light-emitting device 1 on the Al composition distribution state in electron barrier layer 18 is given below. In this embodiment, intermediate layer 17 is doped with Mg of $1\times10^{10}$ cm$^{-3}$, electron barrier layer 18 is doped with Mg of $2\times10^{19}$ cm$^{-3}$, P-type AlGaN cladding layer 19 is doped with Mg of $1\times10^{19}$ cm$^{-3}$, and P-type GaN contact layer 20 is doped with Mg of $1\times10^{20}$ cm$^{-3}$, as a P-type impurity. N-type AlGaN cladding layer 12 and second light guide layer 13 are doped with Si of $1\times10^{18}$ cm$^{-3}$, as an N-type impurity. Intermediate layer 17 is doped with high-concentration Mg as in electron barrier layer 18, to suppress an increase in operating voltage caused by spikes in the interface between intermediate layer 17 and electron barrier layer 18. The operating voltage of the light-emitting device is estimated using these structural conditions.

An effective way of preventing spikes in the P-type interface between intermediate layer 17 and electron barrier layer 18 is to limit the bandgap energy of intermediate layer 17 to be less than or equal to the bandgap energy of the region in electron barrier layer 18 nearest multiquantum well active layer 15 and greater than the bandgap of first light guide layer 16 and doping intermediate layer 17 with high-concentration Mg of $1\times10^{19}$ cm$^{-3}$ or more. For AlGaN, GaN, and InGaN, the lattice constant decreases when the bandgap energy is high. With this structure, the lattice constant of intermediate layer 17 is greater than or equal to the lattice constant of electron barrier layer 18 and less than the lattice constant of first light guide layer 16. The piezoelectric polarization due to the lattice misfit between electron barrier layer 18 and first light guide layer 16 is dispersed in such intermediate layer 17 that is composed of a crystal lattice whose lattice constant is between the lattice constant of electron barrier layer 18 and the lattice constant of first light guide layer 16. This can decrease the barrier potential of spikes in the band structure of the valence band of electron barrier layer 18 caused by the piezoelectric field, and suppress an increase in operating voltage. In this embodiment, intermediate layer 17 is P-type GaN.

Figure 3:
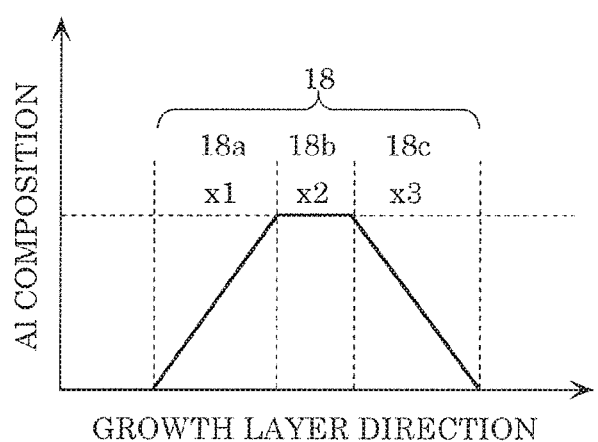
FIG. 3 is a diagram illustrating the Al composition distribution of the electron barrier layer.

Electron barrier layer 18 has three regions, namely, Al composition increase region 18a, Al composition constant region 18b, and Al composition decrease region 18c, depending on the Al composition. Al composition increase region 18a and Al composition decrease region 18c are also collectively referred to as an Al composition change region, depending on the Al composition. In the calculation, the Al composition distribution of electron barrier layer 18 is set where the width of Al composition increase region 18a on the multiquantum well active layer 15 side is x1, the width of Al composition constant region 18b is x2, and the width of Al composition decrease region 18c on the P-type AlGaN cladding layer 19 side is x3, as illustrated in FIG. 3. For width x1 of Al composition increase region 18a, the Al composition changes from 0% to 35%. For width x2 of Al composition constant region 18b, the Al composition is 35%. For width x3 of Al composition decrease region 18c, the Al composition changes from 35% to 0%.

Further, the stripe width, i.e. the width of the ridge lower end, is 15 μm, and the resonator length is 1150 μm. Under these conditions, the current-voltage characteristics are estimated, and the voltage corresponding to current flow of 100 mA is calculated as the operating voltage in 100 mA operation.

In the case where the Al composition of electron barrier layer 18 is at least as high as 20%, spikes in the band structure of the valence band of electron barrier layer 18 increase and the potential barrier against holes increases unless the doping concentration of Mg is increased to $1\times10^{19}$ cm$^{-3}$ or more. If the film thickness of electron barrier layer 18 is increased, not only the operating voltage increases due to an increase in spikes in the valence band structure of electron barrier layer 18 caused by the piezoelectric field, but also the waveguide loss for guided wave increases, leading to an increase in operating current value. If the film thickness of electron barrier layer 18 is thin, a tunneling effect facilitates the passage of electrons and holes through the energy barrier of electron barrier layer 18, as a result of which leakage current occurs. In view of this, conventional electron barrier layer 18 has a film thickness in a range of 5 nm to 10 nm, and typically has a film thickness of 7 nm. In the structure of electron barrier layer 18 in which the Al composition is constant at 35%, in the case where the film thickness of electron barrier layer 18 is 5 nm and 7 nm, the operating voltage is 3.65 V and 3.7 V respectively.

Figure 4:
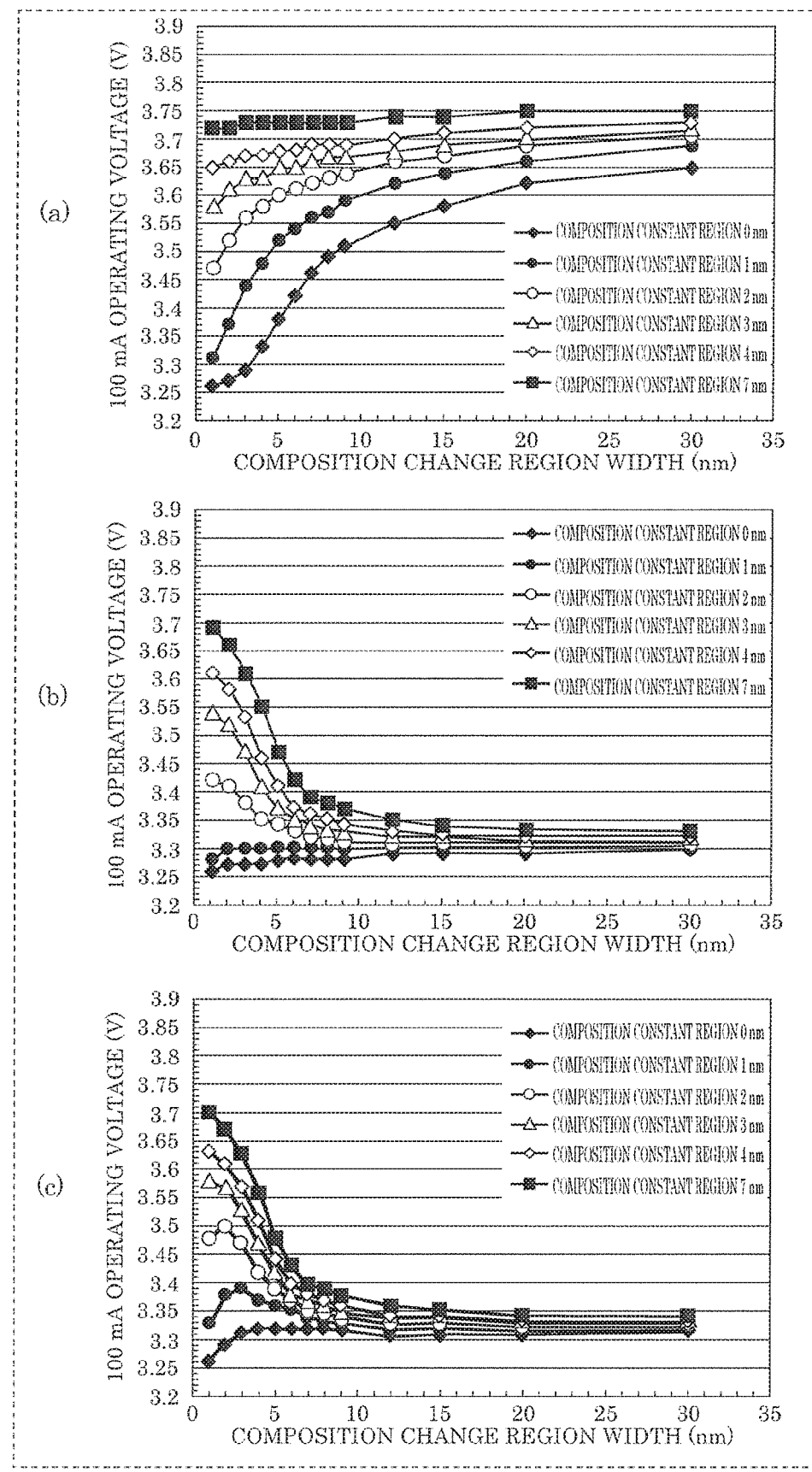
FIG. 4 is a diagram illustrating, in (a), a calculation result of 100 mA operating voltage when changing the width (x3) of an Al composition change region, in (b), a calculation result of 100 mA operating voltage when changing the width (x1) of an Al composition change region, and in (c), a calculation result of 100 mA operating voltage when changing the widths (x1 and x3) of the Al composition change regions.

(a) in FIG. 4 illustrates a calculation result of the operating voltage in the case where width x3 of Al composition decrease region 18c is changed from 1 nm to 30 nm in structures in which Al composition decrease region 18c is formed only on the P-type AlGaN cladding layer 19 side in electron barrier layer 18 and width x2 of Al composition constant region 18b is 0 nm, 1 nm, 2 nm, 3 nm, 4 nm, and 7 nm.

As illustrated in (a) in FIG. 4, when width x3 of Al composition decrease region 18c or width x2 of Al composition constant region 18b is small, the voltage reduction effect for light-emitting device 1 is achieved. When width x2 of Al composition constant region 18b and width x3 of Al composition decrease region 18c are increased, however, the operating voltage in 100 mA operation increases. This is because, when Al composition decrease region 18c is provided on the P-type AlGaN cladding layer 19 side, the potential barrier against holes increases due to the piezoelectric field in the energy band structure of the valence band. The result illustrated in (a) in FIG. 4 indicates that, when width x2 of Al composition constant region 18b is 2 nm or less and width x3 of Al composition decrease region 18c is 5 nm or less, the operating voltage in 100 mA operation is 3.6 V or less, exhibiting the voltage reduction effect.

Further, when width x2 of Al composition constant region 18b is 1 nm or less and width x3 of Al composition decrease region 18c is 3 nm or less, the operating voltage is 3.45 V or less, achieving a voltage reduction effect of about 0.2 V or more as compared with the conventional electron barrier layer. In this case, the total film thickness of electron barrier layer 18 is excessively thin, i.e. 4 nm or less, with there being a possibility of leakage current due to a tunneling effect. Thus, in the case where Al composition decrease region 18c is provided only on the P-type AlGaN cladding layer 19 side, the operating voltage of the light-emitting device can be reduced stably while suppressing leakage current. The voltage reduction effect is about 0.2 V.

(b) in FIG. 4 illustrates a calculation result of the operating voltage in the case where width x1 of Al composition increase region 18a is changed from 1 nm to 30 nm in structures in which Al composition increase region 18a is formed only on the multiquantum well active layer 15 side in electron barrier layer 18 and width x2 of Al composition constant region 18b is 0 nm, 1 nm, 2 nm, 3 nm, 4 nm, and 7 nm.

As illustrated in (b) in FIG. 4, when width x1 of Al composition increase region 18a is increased, the change of the operating voltage of the light-emitting device is slight in the case where width x2 of Al composition constant region 18b is 1 nm or less, but the operating voltage of the light-emitting device is reduced in the case where width x2 of Al composition constant region 18b is 2 nm or more.

In the case where width x2 of Al composition constant region 18b is less than 2 nm, the width of Al composition constant region 18b is very small, so that the energy band distribution of electron barrier layer 18 is likely to be determined substantially by Al composition increase region 18a. In this case, the change in the band structure of the valence band of electron barrier layer 18 caused by the piezoelectric field is canceled out by the change in the valence band structure caused by the composition change of electron barrier layer 18, so that spikes in the band structure of the valence band decrease and the operating voltage becomes approximately constant.

In the case where width x2 of Al composition constant region 18b is 2 nm or more, if width x1 of the Al composition increase region is small, the operating voltage of the light-emitting device increases due to spikes in the band structure of the valence band caused by the piezoelectric effect in Al composition constant region 18b. If width x1 of the Al composition increase region is increased, however, the change in the band structure of the valence band of electron barrier layer 18 caused by the piezoelectric field is effectively canceled out by the change in the valence band structure caused by the composition change of electron barrier layer 18, and the potential barrier of electron barrier layer 18 against holes decreases. This reduces the operating voltage of the light-emitting device. The operating voltage reduction effect can be achieved if width x1 of Al composition increase region 18a is 5 nm or more. When width x1 of Al composition increase region 18a is 10 nm or more, the operating voltage of the light-emitting device becomes approximately constant. Thus, when width x1 of Al composition increase region 18a is 5 nm or more and 10 nm or less, the operating voltage is reduced to 3.35 V or less. This achieves a voltage reduction effect of about 0.3 V as compared with the structure of the conventional electron barrier layer.

In the case where width x1 of Al composition increase region 18a is 5 nm or more and 10 nm or less, if width x2 of Al composition constant region 18b is 7 nm or less, the operating voltage of the light-emitting device is reduced. To further reduce the operating voltage of the light-emitting device, width x2 of Al composition constant region 18b may be preferably 4 nm or less, and further preferably 2 nm or less.

(c) in FIG. 4 illustrates a calculation result of the operating voltage in the case where width x1 of Al composition increase region 18a and width x3 of Al composition decrease region 18c are each changed from 1 nm to 30 nm in structures in which Al composition increase region 18a is formed on the multiquantum well active layer 15 side and Al composition decrease region 18c is formed on the P-type AlGaN cladding layer 19 side in electron barrier layer 18 and width x2 of Al composition constant region 18b is 0 nm, 1 nm, 2 nm, 3 nm, 4 nm, and 7 nm.

As illustrated in (c) in FIG. 4, when width x1 of Al composition increase region 18a and width x3 of Al composition decrease region 18c are increased, the change of the operating voltage of the light-emitting device is slight in the case where width x2 of Al composition constant region 18b is 0 nm, but the operating voltage of the light-emitting device is reduced in the case where width x2 of Al composition constant region 18b is 1 nm or more.

In the case where width x2 of Al composition constant region 18b is 0 nm, spikes occur in the band structure of the valence band due to the piezoelectric field in Al composition decrease region 18c on the P-type AlGaN cladding layer 19 side. Because of such spikes, the operating voltage of the light-emitting device increases in the case where width x1 of Al composition increase region 18a and width x3 of Al composition decrease region 18c are each 5 nm or less. In the case where width x1 of Al composition increase region 18a and width x3 of Al composition decrease region 18c are each 5 nm or more, the change in the band structure of the valence band of electron barrier layer 18 caused by the piezoelectric field is canceled out by the change in the valence band structure caused by the composition change of electron barrier layer 18. This makes the magnitudes of the spikes in the band structure of the valence band constant, so that the operating voltage is approximately constant even when width x1 of Al composition increase region 18a and width x3 of Al composition decrease region 18c are increased.

In the case where width x2 of Al composition constant region 18b is 1 nm or more, if width x1 of the Al composition increase region is small, the operating voltage of the light-emitting device increases due to spikes in the energy distribution of the valence band caused by the piezoelectric effect in Al composition constant region 18b. If width x1 of Al composition increase region 18a is increased, however, the change in the band structure of the valence band of electron barrier layer 18 caused by the piezoelectric field is effectively canceled out by the change in the valence band structure caused by the composition change of electron barrier layer 18, and thus the potential barrier of electron barrier layer 18 against holes decreases. This reduces the operating voltage of the light-emitting device. The operating voltage reduction effect can be achieved if width x1 of Al composition increase region 18a is 5 nm or more. When width x1 of Al composition increase region 18a is 10 nm or more, the operating voltage of the light-emitting device becomes approximately constant. Thus, when width x1 of Al composition increase region 18a is 5 nm or more and 10 nm or less, the operating voltage of the light-emitting device is reduced to 3.4 V or less. This achieves a voltage reduction effect of about 0.25 V as compared with the conventional electron barrier layer.

In the case where width x1 of Al composition increase region 18a is 5 nm or more and 10 nm or less, if width x2 of Al composition constant region 18b is 7 nm or less, the operating voltage of the light-emitting device is reduced. To further reduce the operating voltage, width x2 of Al composition constant region 18b may be preferably 4 nm or less, and further preferably 2 nm or less.

Here, the Al composition of electron barrier layer 18 is high, and spikes in the band structure of the valence band of electron barrier layer 18 increase and the potential barrier against holes increases unless the doping concentration of Mg is increased to $1 \times 10^{19}$ cm$^{-3}$ or more as described later. If the total film thickness of electron barrier layer 18 is increased, the waveguide loss for guided wave increases, leading to an increase in operating current value. To achieve both low operating voltage and low waveguide loss, the total film thickness of electron barrier layer 18 is desirably thin, and Al composition increase region 18a may be formed only on the multiquantum well active layer 15 side.

The results illustrated in (a) to (c) in FIG. 4 demonstrate that the waveguide loss and the operating voltage can both be reduced by forming the Al composition change region in electron barrier layer 18 only on the multiquantum well active layer 15 side.

Figure 5:
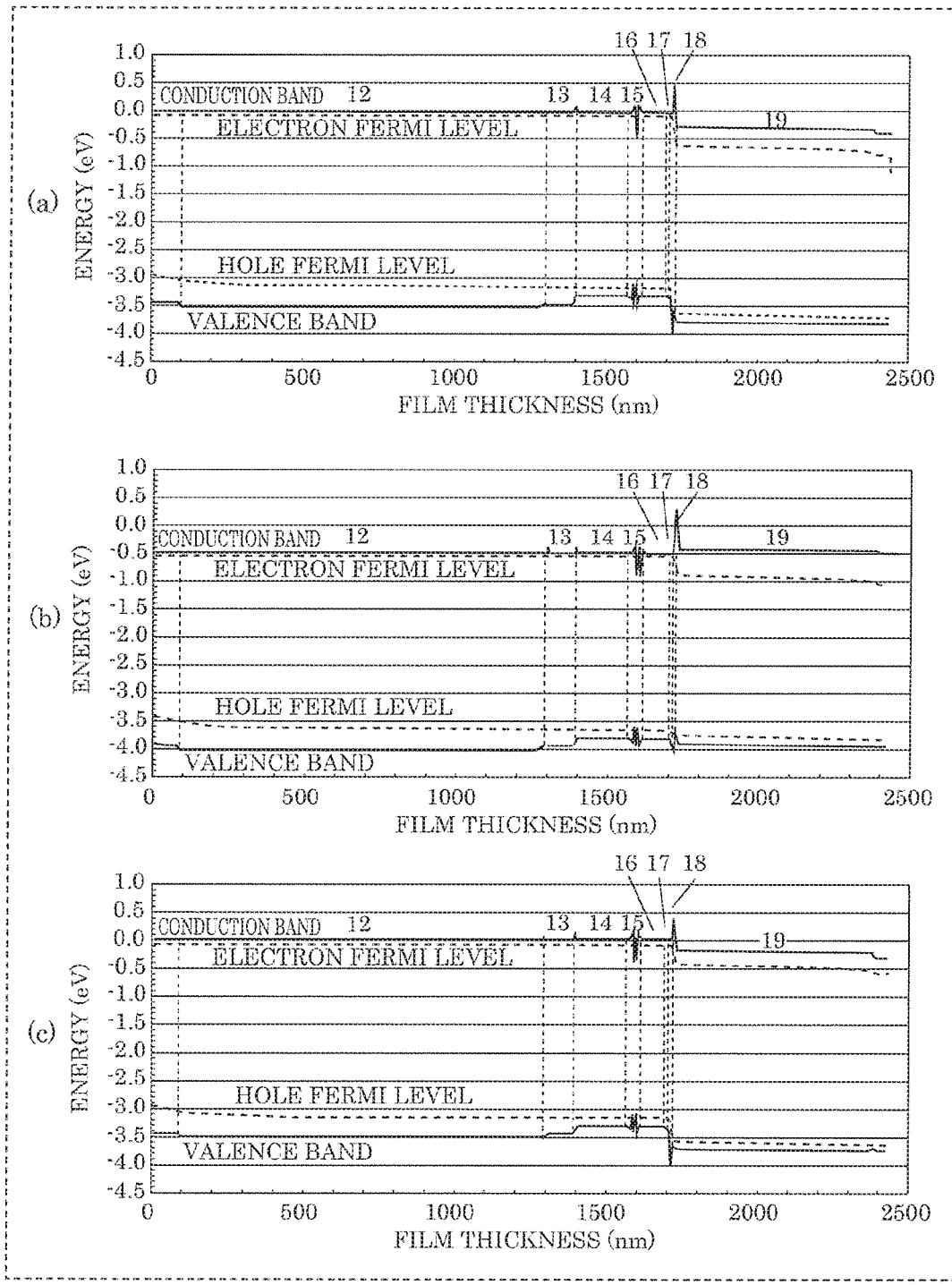
FIG. 5 is a diagram illustrating, in (a), a calculation result of a band structure in the case where width x2 of an Al composition constant region (35%) is 7 nm, in (b), a calculation result of the band structure in the case where width x1 of an Al composition increase region (change from 0% to 35%) is 5 nm and width x2 of the Al composition constant region (35%) is 2 nm, and in (c), a calculation result of the band structure in 100 mA operation in the case where width x3 of an Al composition decrease region (change from 35% to 0%) is 5 nm and width x2 of the Al composition constant (35%) region is 2 nm.

(a) in FIG. 5 illustrates a detailed calculation result of the band structure when the operating current value is 100 mA, in the case where Al composition increase region 18a and Al composition decrease region 18c are not provided and width x2 of Al composition constant region 18b (35%) is 7 nm. (b) in FIG. 5 illustrates a detailed calculation result of the band structure when the operating current value is 100 mA, in the case where Al composition increase region 18a (change from 0% to 35%) of 5 nm is formed on the multiquantum well active layer 15 side and width x2 of Al composition constant (35%) region 18b is 2 nm. (c) in FIG. 5 illustrates a detailed calculation result of the band structure when the operating current value is 100 mA, in the case where Al composition decrease region 18c (change from 35% to 0%) of 5 nm is formed on the P-type AlGaN cladding layer 19 side and the width of Al composition constant region 18b (35%) is 2 nm.

In (a) in FIG. 5, in electron barrier layer 18 composed only of Al composition constant region 18b, the band structure of the valence band changes so as to increase the potential barrier against holes due to the electric field by the piezoelectric effect.

In (b) in FIG. 5, in the band structure of the valence band of electron barrier layer 18, the deformation due to the electric field by the piezoelectric effect and the change in the bandgap energy due to the change of the Al composition cancel each other out effectively to decrease the potential barrier against holes. Moreover, the potential barrier against electrons increases, so that leakage current is unlikely to occur.

In (c) in FIG. 5, the band structure of the valence band changes so as to increase the potential barrier against holes due to the electric field by the piezoelectric effect, as in electron barrier layer 18 composed only of Al composition constant region 18b.

The results illustrated in (a) to (c) in FIG. 5 demonstrate that the reduction of the operating voltage of the light-emitting device and the suppression of leakage current can be effectively achieved by forming the Al composition change region in electron barrier layer 18 only on the multiquantum well active layer 15 side.

The following describes width x1 of Al composition increase region 18a and width x2 of Al composition constant region 18b for achieving all of voltage reduction, waveguide loss reduction, and leakage current suppression in the case where Al composition constant region 18b in electron barrier layer 18 is formed only on the multiquantum well active layer 15 side.

Figure 6A:
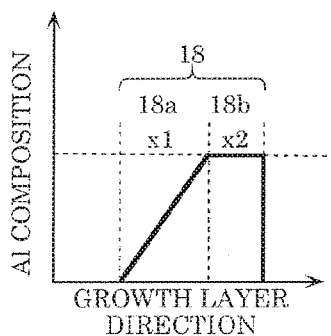
FIG. 6A is a diagram illustrating the Al composition distribution of the electron barrier layer.
Figure 6B:
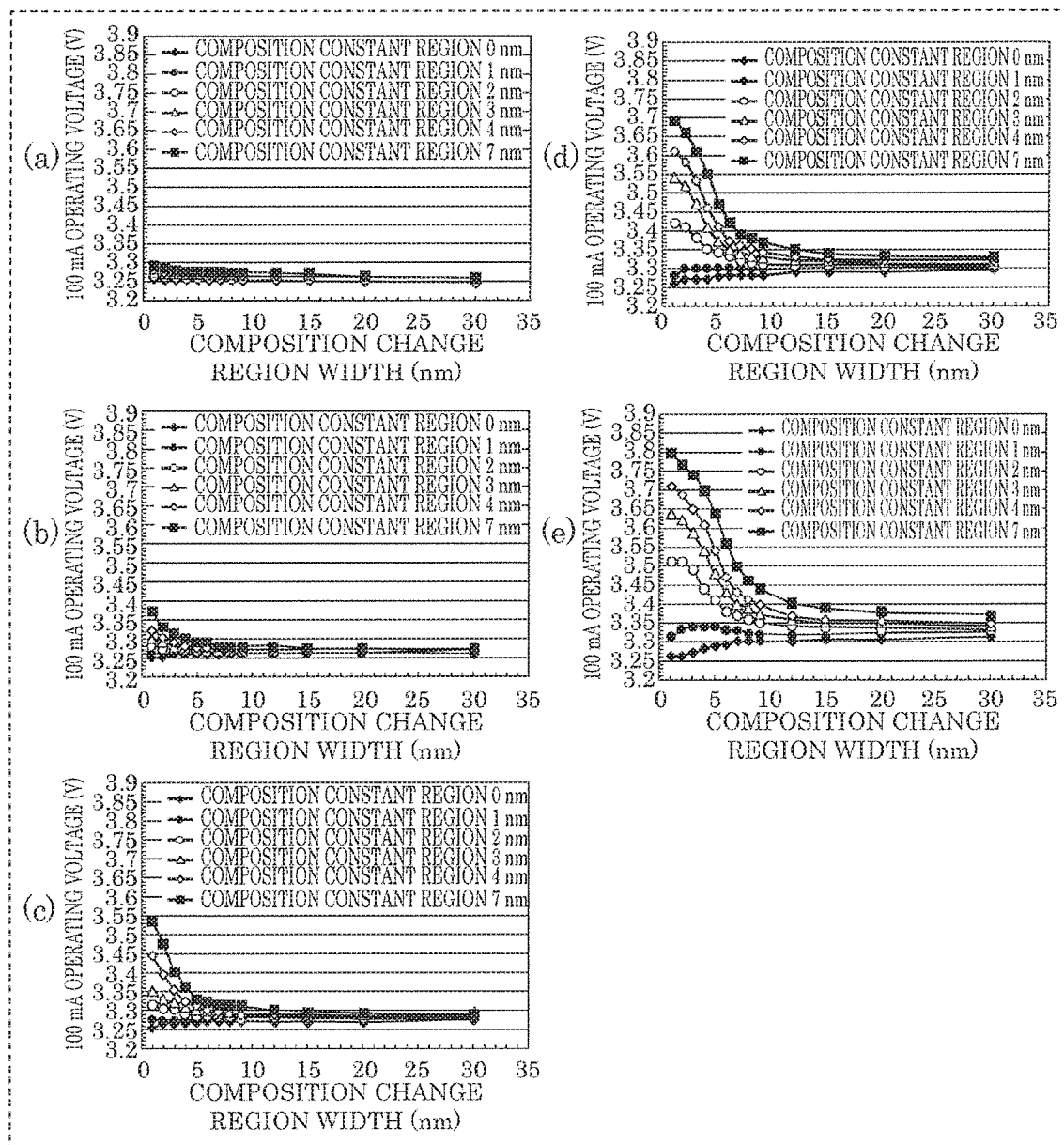
FIG. 6B is a diagram illustrating, in (a), a calculation result of the dependence of the operating voltage in 100 mA operation on x1 and x2 in the case where the Al composition of the Al composition constant region in the light-emitting device according to Embodiment 1 of the present disclosure is 20%, in (b), a calculation result of the dependence of the operating voltage in 100 mA operation on x1 and x2 in the case where the Al composition of the Al composition constant region in the light-emitting device according to Embodiment 1 of the present disclosure is 25%, in (c), a calculation result of the dependence of the operating voltage in 100 mA operation on x1 and x2 in the case where the Al composition of the Al composition constant region in the light-emitting device according to Embodiment 1 of the present disclosure is 30%, in (d), a calculation result of the dependence of the operating voltage in 100 mA operation on x1 and x2 in the case where the Al composition of the Al composition constant region in the light-emitting device according to Embodiment 1 of the present disclosure is 35%, and in (e), a calculation result of the dependence of the operating voltage in 100 mA operation on x1 and x2 in the case where the Al composition of the Al composition constant region in the light-emitting device according to Embodiment 1 of the present disclosure is 40%.

FIG. 6A and (a) to (e) in FIG. 6B illustrate calculation results of the dependence of the operating voltage in 100 mA operation on width x1 of Al composition increase region 18a and width x2 of Al composition constant region 18b in the case where the Al composition of Al composition constant region 18b in the structure according to this embodiment is 20%, 25%, 30%, 35%, and 40%.

FIG. 6A is a diagram illustrating the Al composition distribution of the electron barrier layer. In electron barrier layer 18, Al composition increase region 18a is formed on the multiquantum well active layer 15 side. The composition in Al composition increase region 18a gradually changes from the Al composition 0% (GaN) to the Al composition of Al composition constant region 18b. The other structural parameters are the same as those of the structure used for the calculation in (a) to (c) in FIG. 4.

As illustrated in (a) to (e) in FIG. 6B, in the case where the Al composition in Al composition constant region 18b is 25% or more, the effect of reducing the operating voltage of the light-emitting device is achieved.

In the case of using electron barrier layer 18 composed only of Al composition constant region 18b as in the conventional structure, the operating voltage of the light-emitting device is 3.3 V, 3.4 V, 3.55 V, 3.7 V, and 3.8 V respectively for an Al composition of 20%, 25%, 30%, 35%, and 40% where the thickness of electron barrier layer 18 is 7 nm, from the results illustrated in (a) to (e) in FIG. 6B.

In the case where width x1 of Al composition increase region 18a is 5 nm to 10 nm and width x2 of Al composition constant region 18b is 4 nm or less, on the other hand, the operating voltage is 3.27 V or less, 3.28 V or less, 3.32 V or less, 3.42 V or less, and 3.54 V or less respectively for an Al composition of 20%, 25%, 30%, 35%, and 40%. The voltage reduction effect is therefore 0.023 V or more, 0.12 V or more, 0.23 V or more, 0.28 V or more, and 0.26 V or more respectively for an Al composition of 20%, 25%, 30%, 35%, and 40%.

In the case where width x1 of Al composition increase region 18a is 5 nm to 10 nm and width x2 of Al composition constant region 18b is 2 nm or less, the operating voltage is 3.26 V or less, 3.27 V, 3.3 V, 3.34 V, and 3.41 V or less respectively for an Al composition of 20%, 25%, 30%, 35%, and 40%. The voltage reduction effect is therefore 0.04 V or more, 0.13 V or more, 0.25 V or more, 0.36 V or more, and 0.39 V or more respectively for an Al composition of 20%, 25%, 30%, 35%, and 40%.

Thus, an operating voltage reduction effect of 0.12 V or more can be achieved by setting the Al composition in Al composition constant region 18b to 25% or more, width x1 of Al composition increase region 18a to 5 nm to 10 nm, and width x2 of Al composition constant region 18b to 4 nm or less.

An operating voltage reduction effect of 0.23 V or more can be achieved by setting the Al composition in Al composition constant region to 30% or more, width x1 of Al composition increase region 18a to 5 nm to 10 nm, and width x2 of Al composition constant region 18b to 4 nm or less.

An operating voltage reduction effect of 0.13 V or more can be achieved by setting the Al composition in Al composition constant region to 25% or more, width x1 of Al composition increase region 18a to 5 nm to 10 nm, and width x2 of Al composition constant region 18b to 2 nm or less.

An operating voltage reduction effect of 0.25 V or more can be achieved by setting the Al composition in Al composition constant region to 30% or more, width x1 of Al composition increase region 18a to 5 nm to 10 nm, and width x2 of Al composition constant region 18b to 4 nm or less.

In the case of performing high-power operation of 3 W or more in a high-temperature operation state of 85° C. or more, light output is thermally saturated easily with a slight increase in the amount of heat generation. It is therefore very important to reduce the operating voltage.

Figure 7:
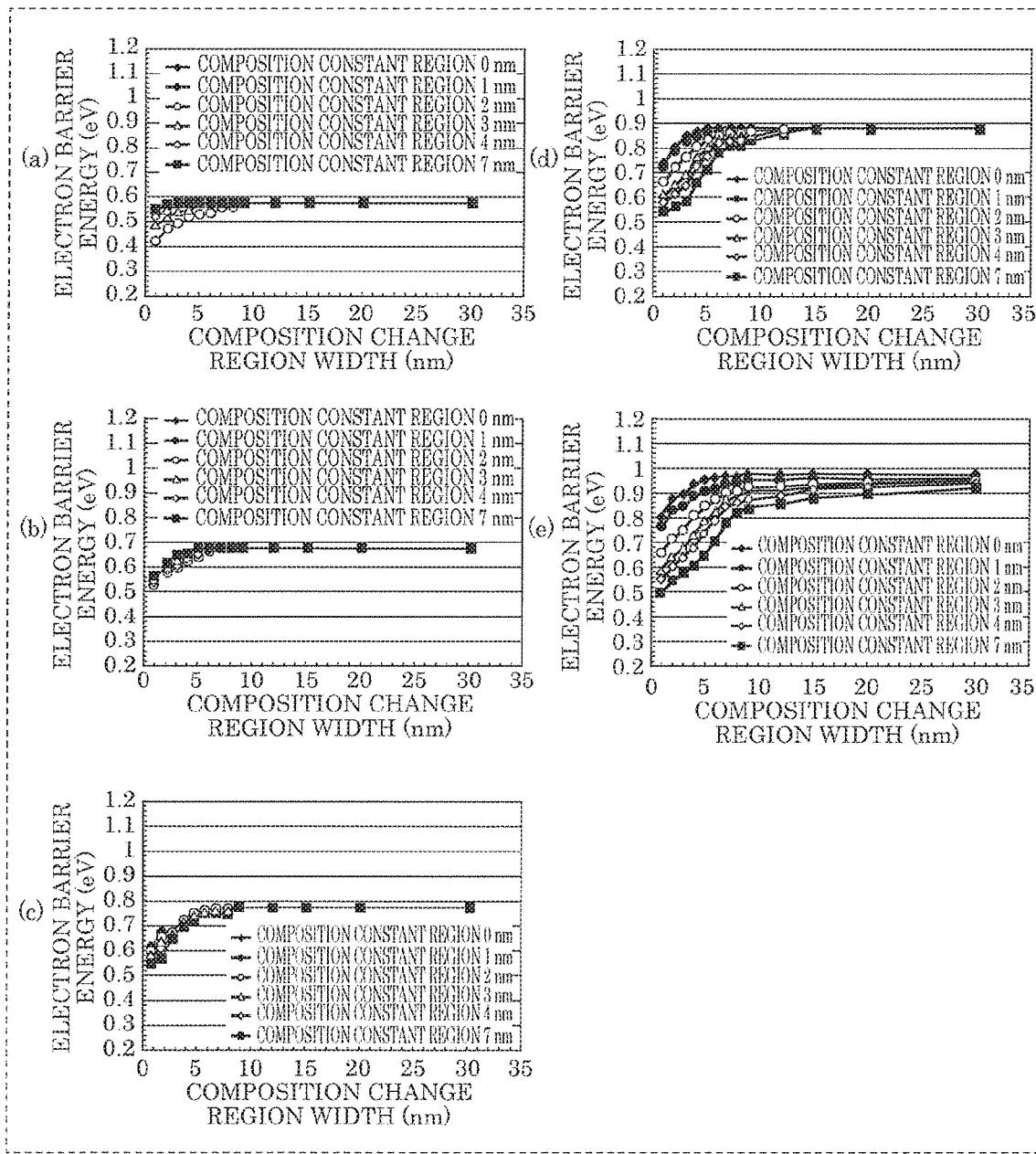
FIG. 7 is a diagram illustrating, in (a), a calculation result of the dependence of the electron barrier energy ($\Delta E$) of the electron barrier layer on x1 and x2 in the case where the Al composition of the Al composition constant region in the light-emitting device according to Embodiment 1 of the present disclosure is 20%, in (b), a calculation result of the dependence of the electron barrier energy ($\Delta E$) of the electron barrier layer on x1 and x2 in the case where the Al composition of the Al composition constant region in the light-emitting device according to Embodiment 1 of the present disclosure is 25%, in (c), a calculation result of the dependence of the electron barrier energy ($\Delta E$) of the electron barrier layer on x1 and x2 in the case where the Al composition of the Al composition constant region in the light-emitting device according to Embodiment 1 of the present disclosure is 30%, in (d), a calculation result of the dependence of the electron barrier energy ($\Delta E$) of the electron barrier layer on x1 and x2 in the case where the Al composition of the Al composition constant region in the light-emitting device according to Embodiment 1 of the present disclosure is 35%, and in (e), a calculation result of the dependence of the electron barrier energy ($\Delta E$) of the electron barrier layer on x1 and x2 in the case where the Al composition of the Al composition constant region in the light-emitting device according to Embodiment 1 of the present disclosure is 40%.

(a) to (e) in FIG. 7 illustrate calculation results of the dependence of the electron barrier energy (ΔE) of the electron barrier layer in 100 mA operation on width x1 of Al composition increase region 18a and width x2 of Al composition constant region 18b in the case where the Al composition in the structure according to this embodiment is 20%, 25%, 30%, 35%, and 40%. In electron barrier layer 18, Al composition increase region 18a is formed on the multiquantum well active layer 15 side. For each Al composition, the composition in Al composition increase region 18a changes from the Al composition 0% (GaN) to the Al composition of Al composition constant region 18b. The other structural parameters are the same as those of the structure used for the calculation in FIG. 4.

As illustrated in (a) to (e) in FIG. 7, ΔE increases with an increase in width x1 of Al composition increase region 18a, and becomes approximately constant when width x1 reaches 10 nm. Moreover, when the Al composition in Al composition constant region 18b is 25% or more, the effect of increasing ΔE by Al composition increase region 18a is enhanced. This is because, although an increase in the Al composition in Al composition constant region 18b causes a greater piezoelectric field by the piezoelectric effect, an increase in the bandgap energy of Al composition increase region 18a serves to cancel out the spikes created in the valence band, so that the bandgap energy increase effectively contributes to higher ΔE.

In the case where the Al composition is 25% or more, the ΔE increase effect is greater when width x2 of Al composition constant region 18b is smaller. Width x2 of Al composition constant region 18b may be preferably 4 nm or less, and further preferably 2 nm or less.

In the case of using electron barrier layer 18 composed only of Al composition constant region 18b, ΔE is 0.53 eV, 0.54 eV, 0.52 eV, 0.52 eV, and 0.48 eV respectively for an Al composition of 20%, 25%, 30%, 35%, and 40% where the thickness of electron barrier layer 18 is 7 nm, from the results illustrated in (a) to (e) in FIG. 7. Thus, in electron barrier layer 18 composed only of Al composition constant region 18b, even when the Al composition of electron barrier layer 18 is increased, ΔE is saturated at about 0.54 eV, and decreases subsequently. The results illustrated in (a) to (e) in FIG. 6B indicate that the operating voltage increases with an increase in the Al composition. Accordingly, in electron barrier layer 18 composed only of Al composition constant region 18b, when the Al composition of electron barrier layer 18 is increased, ΔE is saturated at an Al composition of about 25%. A subsequent increase in the Al composition is likely to increase the spikes in the band structure formed in the valence band. Hence, to increase ΔE while suppressing an increase in the operating voltage in electron barrier layer 18 composed only of Al composition constant region 18b, an Al composition of about 25% is desirable. In this case, the operating voltage is about 3.4 V, and ΔE is 0.54 eV.

On the other hand, ΔE of 0.62 eV or more can be achieved by setting width x2 of Al composition constant region 18b to 4 nm or less while the Al composition in Al composition constant region 18b is 25% and width x1 of Al composition increase region 18a is 5 nm or more and 10 nm or less. The operating voltage in this case is 3.28 V or less, from the result in (b) in FIG. 6B.

ΔE of 0.64 eV or more can be achieved by setting width x2 of Al composition constant region 18b to 2 nm or less while the Al composition in Al composition constant region 18b is 25% and width x1 of Al composition increase region 18a is 5 nm or more and 10 nm or less. The operating voltage of the light-emitting device in this case is 3.27 V or less, from the result in (b) in FIG. 6B.

Thus, by forming Al composition increase region 18a on the multiquantum well active layer 15 side when Al in Al composition constant region 18b is 25%, a voltage reduction of about 0.12 V and a ΔE increase of 0.08 eV can be achieved in the case where width x2 of Al composition constant region 18b is 4 nm or less, as compared with the structure of electron barrier layer 18 of Al composition constant region 18b (25%). In the case where width x2 of Al composition constant region 18b is 2 nm or less, a voltage reduction of about 0.13 V and a ΔE increase of 0.1 eV can be achieved.

ΔE of 0.7 eV or more can be achieved by setting width x2 of Al composition constant region 18b to 4 nm or less while the Al composition in Al composition constant region 18b is 30% and width x1 of Al composition increase region 18a is 5 nm or more and 10 nm or less, from the result in (c) in FIG. 7. The operating voltage in this case is 3.32 V or less, from the result in (c) in FIG. 6B.

ΔE of 0.7 eV or more can be achieved by setting width x2 of Al composition constant region 18b to 2 nm or less while the Al composition in Al composition constant region 18b is 30% and width x1 of Al composition increase region 18a is 5 nm or more and 10 nm or less. The operating voltage in this case is 3.3 V or less, from the result in (c) in FIG. 6B.

In the structure of electron barrier layer 18 composed only of Al composition constant region 18b (30%), in the case where the thickness is 7 nm, the operating voltage is about 3.55 V, and ΔE is 0.52 eV.

Thus, by forming Al composition increase region 18a on the multiquantum well active layer 15 side when Al in Al composition constant region 18b is 30%, a voltage reduction of about 0.24 V and a ΔE increase of 0.18 eV can be achieved in the case where width x2 of Al composition constant region 18b is 4 nm or less, as compared with the structure of electron barrier layer 18 composed of Al composition constant region 18b (30%). In the case where width x2 of Al composition constant region 18b is 2 nm or less, a voltage reduction of about 0.25 V and a ΔE increase of 0.18 eV can be achieved.

ΔE of 0.74 eV or more can be achieved by setting width x2 of Al composition constant region 18b to 4 nm or less while the Al composition in Al composition constant region 18b is 35% and width x1 of Al composition increase region 18a is 5 nm or more and 10 nm or less, from the result in (d) in FIG. 7. The operating voltage of the light-emitting device in this case is 3.42 V or less, from the result in (d) in FIG. 6B. ΔE of 0.82 eV or more can be achieved by setting width x2 of Al composition constant region 18b to 2 nm or less while the Al composition in Al composition constant region 18b is 35% and width x1 of Al composition increase region 18a is 5 nm or more and 10 nm or less. The operating voltage of the light-emitting device in this case is 3.34 V or less, from the result in (d) in FIG. 6B.

In the structure of electron barrier layer 18 composed only of Al composition constant region 18b (35%), in the case where the thickness is 7 nm, the operating voltage is about 3.7 V, and ΔE is 0.52 eV.

Thus, by forming Al composition increase region 18a on the multiquantum well active layer 15 side when Al in Al composition constant region 18b is 35%, a voltage reduction of about 0.28 V and a ΔE increase of 0.22 eV can be achieved in the case where width x2 of Al composition constant region 18b is 4 nm or less, as compared with the structure of electron barrier layer 18 composed of Al composition constant region 18b (35%). In the case where width x2 of Al composition constant region 18b is 2 nm or less, a voltage reduction of about 0.36 V and a ΔE increase of 0.3 eV can be achieved.

ΔE of 0.74 eV or more can be achieved by setting width x2 of Al composition constant region 18b to 4 nm or less while the Al composition in Al composition constant region 18b is 40% and width x1 of Al composition increase region 18a is 5 nm or more and 10 nm or less, from the result in (e) in FIG. 7. The operating voltage in this case is 3.54 V or less, from the result in (e) in FIG. 6B.

ΔE of 0.84 eV or more can be achieved by setting width x2 of Al composition constant region 18b to 2 nm or less while the Al composition in Al composition constant region 18b is 40% and width x1 of Al composition increase region 18a is 5 nm or more and 10 nm or less. The operating voltage in this case is 3.41 V or less, from the result in (e) in FIG. 6B.

In the structure of electron barrier layer 18 composed only of Al composition constant region 18b (40%), in the case where the thickness is 7 nm, the operating voltage is about 3.8 V, and ΔE is 0.48 eV.

Thus, by forming Al composition increase region 18a on the multiquantum well active layer 15 side when the Al composition in Al composition constant region 18b is 40%, a voltage reduction of about 0.26 V and a ΔE increase of 0.26 eV can be achieved in the case where width x2 of Al composition constant region 18b is 4 nm or less, as compared with the structure of electron barrier layer 18 of Al composition constant region 18b (40%). In the case where width x2 of Al composition constant region 18b is 2 nm or less, a voltage reduction of about 0.39 V and a ΔE increase of 0.36 eV can be achieved.

Thus, by forming Al composition increase region 18a on the multiquantum well active layer 15 side of electron barrier layer 18 and controlling the film thicknesses in a range where width x1 of Al composition increase region 18a is 5 nm or more and 10 nm or less and width x2 of Al composition constant region 18b is 4 nm or less and further preferably 2 nm or less, in the case where the Al composition in Al composition constant region 18b is 25% or more (the maximum Al composition of electron barrier layer 18 is 25% in the case where width x2 of Al composition constant region 18b is 0 nm), voltage reduction and ΔE improvement can both be achieved as compared with the structure of electron barrier layer 18 composed only of Al composition constant region 18b. The effect of voltage reduction and ΔE increase is greater when the Al composition of electron barrier layer 18 is higher. If the Al composition of electron barrier layer 18 exceeds 40%, however, the lattice misfit with GaN increases, which facilitates a lattice defect. The Al composition of electron barrier layer 18 in the structure according to this embodiment is therefore 40% or less.

Figure 8:
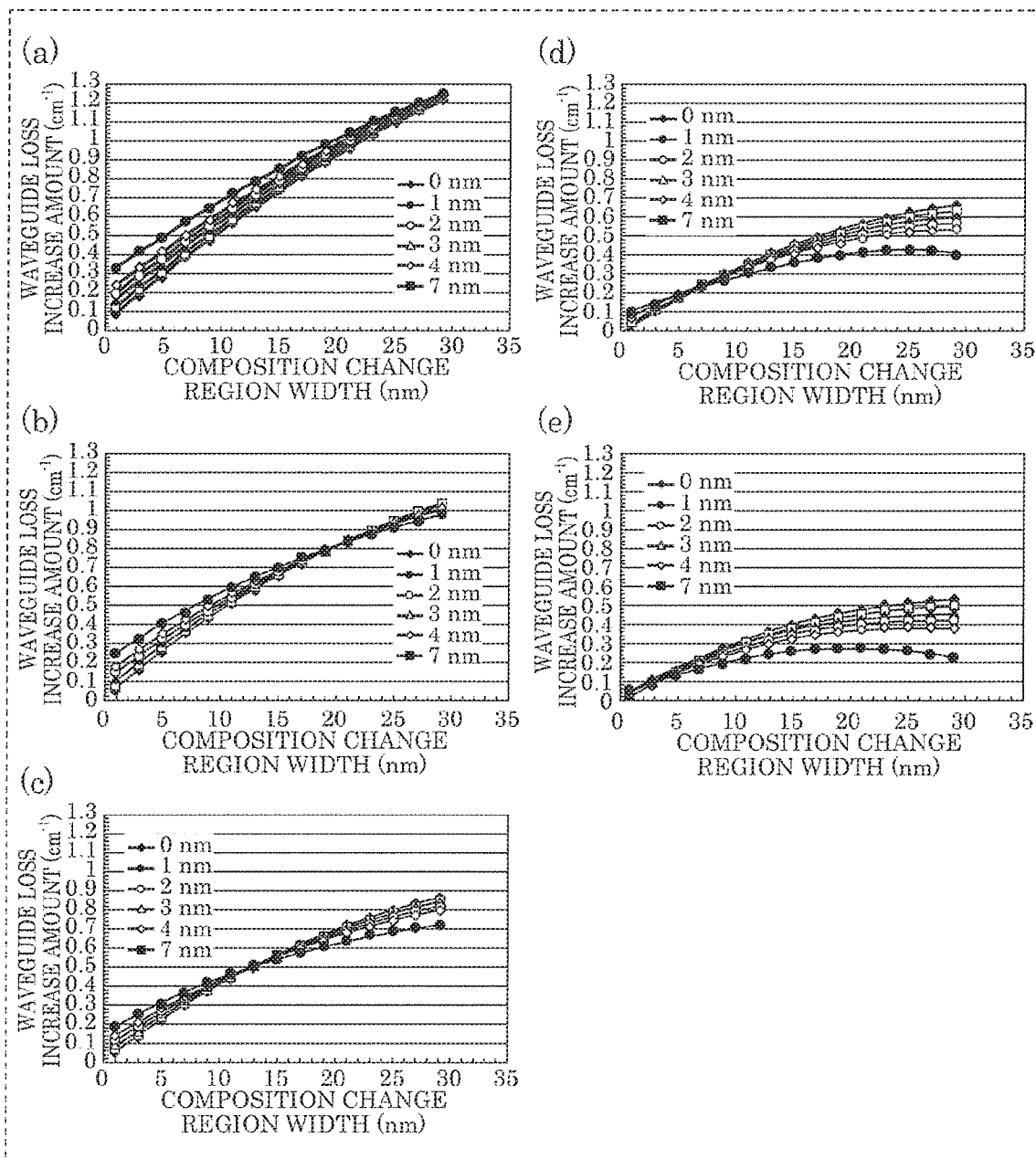
FIG. 8 is a diagram illustrating, in (a), a calculation result of the dependence of the waveguide loss on x1 and x2 in the case where the Al composition of the Al composition constant region in the light-emitting device according to Embodiment 1 of the present disclosure is 20%, in (b), a calculation result of the dependence of the waveguide loss on x1 and x2 in the case where the Al composition of the Al composition constant region in the light-emitting device according to Embodiment 1 of the present disclosure is 25%, in (c), a calculation result of the dependence of the waveguide loss on x1 and x2 in the case where the Al composition of the Al composition constant region in the light-emitting device according to Embodiment 1 of the present disclosure is 30%, in (d), a calculation result of the dependence of the waveguide loss on x1 and x2 in the case where the Al composition of the Al composition constant region in the light-emitting device according to Embodiment 1 of the present disclosure is 35%, and in (e), a calculation result of the dependence of the waveguide loss on x1 and x2 in the case where the Al composition of the Al composition constant region in the light-emitting device according to Embodiment 1 of the present disclosure is 40%.

(a) to (e) in FIG. 8 illustrate calculation results of the dependence of the waveguide loss on width x1 of Al composition increase region 18a and width x2 of Al composition constant region 18b in the case where the Al composition of Al composition constant region 18b in electron barrier layer 18 in the structure according to this embodiment is 20%, 25%, 30%, 35%, and 40%. In electron barrier layer 18, Al composition increase region 18a is formed only on the multiquantum well active layer 15 side. For each Al composition, the composition in Al composition increase region 18a changes from the Al composition 0% (GaN) to the Al composition of Al composition constant region 18b. The other structural parameters are the same as those of the structure used for the calculation in FIG. 4. For the waveguide loss, with respect to the waveguide loss of a structure in which width x1 of Al composition increase region 18a is 1 nm, width x2 of Al composition constant region 18b is 0 nm, and the Al composition in Al composition constant region 18b is 40%, i.e. the Al composition is changed from 0% to 40% when width x1 of Al composition increase region 18a is 1 nm, a calculation result of the waveguide loss increase amount in each other structure is indicated.

As illustrated in (a) to (e) in FIG. 8, the waveguide loss increases with an increase in width x1 of Al composition increase region 18a. In the case of using a high Al composition layer with an Al composition of 20% or more in electron barrier layer 18, such a high Al composition tends to cause a decrease in the activation rate of Mg used as a P-type dopant. Accordingly, the ionization acceptor density needs to be increased to enhance the energy of the conduction band of electron barrier layer 18. The doping concentration of Mg in electron barrier layer 18 therefore needs to be increased relative to other P-type layers. As an example, doping with high-concentration Mg of $1 \times 10^{19}$ cm$^{-3}$ or more is necessary. In the structure of the light-emitting device according to this embodiment, doping with Mg of $2 \times 10^{19}$ cm$^{-3}$ is performed. In this case, if the film thickness of electron barrier layer 18 is excessively thick, the free carrier loss in the electron barrier layer for the light distribution formed in the laser waveguide increases, and the waveguide loss increases. The increase of the waveguide loss causes a decrease of slope efficiency in current-light output characteristics, leading to an increase in operating current value. The waveguide loss thus causes lower high-temperature characteristics in particular. To suppress such a waveguide loss increase, the total film thickness of electron barrier layer 18 may be thin. When electron barrier layer 18 is formed with width x1 of Al composition increase region 18a being 10 nm or less and width x2 of Al composition constant region 18b being 4 nm or less, the waveguide loss increase can be limited to 0.5 cm$^{-1}$ or less in the case where the Al composition in Al composition constant region 18b is 25%. In the case where the Al composition in Al composition constant region 18b is 30%, the waveguide loss increase can be limited to 0.42 cm$^{-1}$ or less. In the case where the Al composition in Al composition constant region 18b is 35%, the waveguide loss increase can be limited to 0.32 cm$^{-1}$ or less. In the case where the Al composition in Al composition constant region 18b is 40%, the waveguide loss increase can be limited to 0.3 cm$^{-1}$ or less.

When electron barrier layer 18 is formed with width x1 of Al composition increase region 18a being 10 nm or less and width x2 of Al composition constant region 18b being 2 nm or less, the waveguide loss increase can be limited to 0.46 cm$^{-1}$ or less in the case where the Al composition in Al composition constant region 18b is 25%. In the case where the Al composition in the composition constant region is 30%, the waveguide loss increase can be limited to 0.41 cm$^{-1}$ or less. In the case where the Al composition in the composition constant region is 35%, the waveguide loss increase can be limited to 0.32 cm$^{-1}$ or less. In the case where the Al composition in the composition constant region is 40%, the waveguide loss increase can be limited to 0.3 cm$^{-1}$ or less.

Hence, to suppress the waveguide loss increase in electron barrier layer 18, a higher ratio of the Al composition of electron barrier layer 18 is desirable. If the Al composition in Al composition constant region 18b exceeds 40%, however, the lattice misfit with GaN increases, which facilitates a lattice defect. The Al composition of electron barrier layer 18 in the structure of the light-emitting device according to this embodiment is therefore 40% or less, as mentioned earlier.

The waveguide loss somewhat increases when Al composition increase region 18a is used in electron barrier layer 18, as described above. An increase in the waveguide loss causes an increase in the operating current value and thus an increase in the leakage current of self-heating of the light-emitting device, in a high-temperature operation state of 85° C. or more. In the case of performing high-power operation of 3 W or more, light output is thermally saturated easily with a slight increase in the amount of heat generation. It is therefore very important to reduce the waveguide loss.

Figure 9:
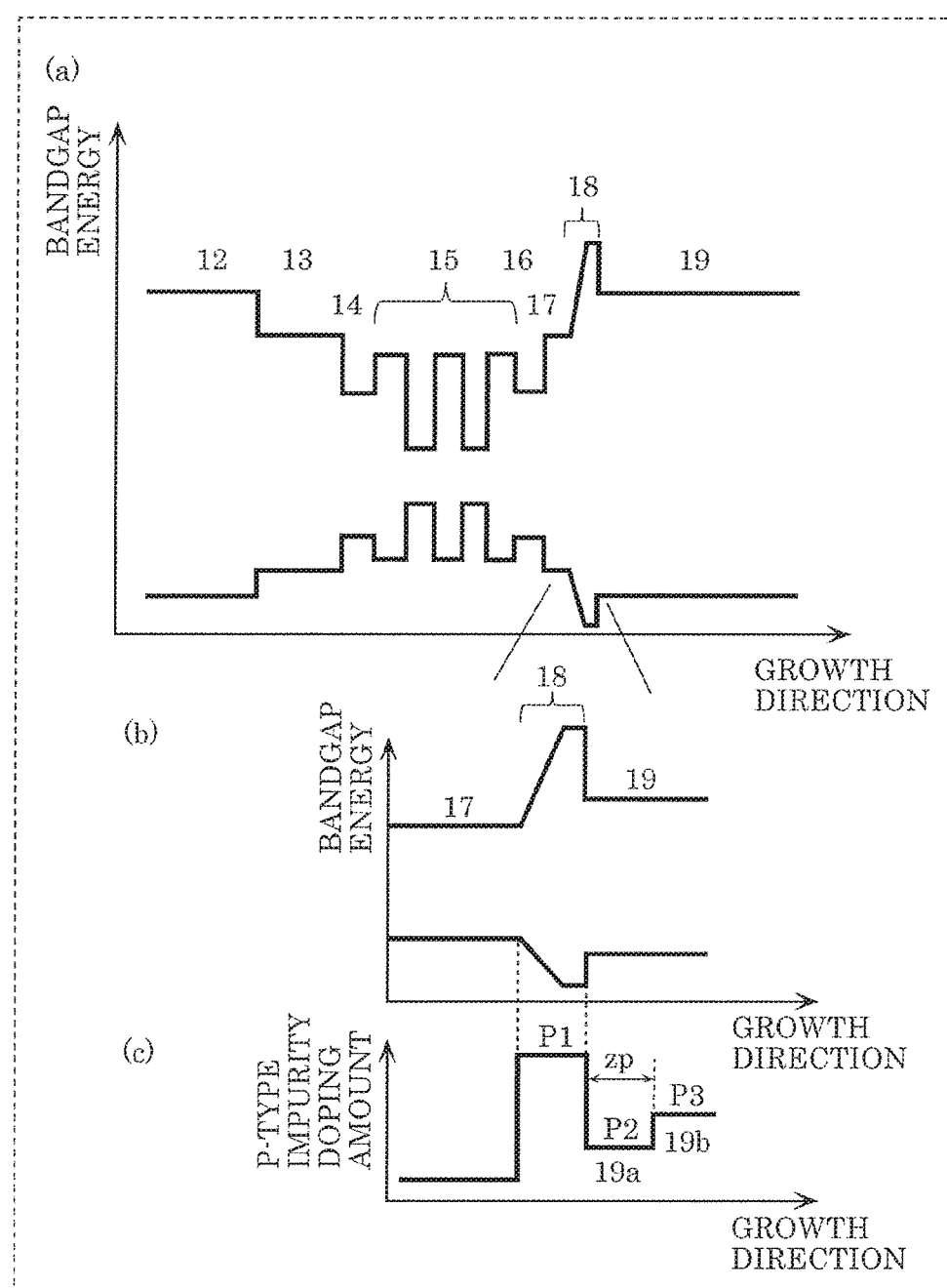
FIG. 9 is a diagram illustrating, in (a), the bandgap energy distribution in the growth layer direction of the light-emitting device according to Embodiment 1 of the present disclosure, in (b), the impurity concentration distribution in the electron barrier layer and a P-type AlGaN cladding layer of the light-emitting device according to Embodiment 1 of the present disclosure, and in (c), the bandgap energy distribution near the electron barrier layer.

Hence, the structure of the light-emitting device according to this embodiment includes low-doped region 19a, as illustrated in (c) in FIG. 9. Low-doped region 19a is a region where the doping amount of Mg as a P-type impurity in P-type AlGaN cladding layer 19 is lower in the vicinity of electron barrier layer 18 than in high-doped region 19b which is a P-type AlGaN cladding layer on the P-type GaN contact layer 20 side. Since electron barrier layer 18 is close to multiquantum well active layer 15, a large amount of light distribution is present even in low-doped region 19a. The influence of low-doped region 19a on the waveguide loss is therefore significant. With the provision of low-doped region 19a, the free carrier loss in P-type AlGaN cladding layer 19 can be reduced to reduce the waveguide loss. If the Mg doping amount is decreased excessively, however, the device resistance increases, leading to an increase in the operating voltage.

The dependence of the operating voltage in 100 mA operation on the film thickness (zp) of low-doped region 19a in the P-type AlGaN cladding layer and the Mg doping concentration is estimated below, as in the above-mentioned estimation.

In the calculation, the following structure is used: Al composition increase region 18a with a thickness of 5 nm is formed only on the multiquantum well active layer 15 side in electron barrier layer 18, and the film thickness of Al composition constant region 18b is 2 nm. The Al composition in Al composition constant region 18b is 35%, and the Al composition in Al composition increase region 18a is increased from 0% to 35%. Electron barrier layer 18 is doped with Mg of a concentration of $2 \times 10^{19}$ cm$^{-3}$, and high-doped region 19b is doped with Mg of a concentration of $1 \times 10^{19}$ cm$^{-3}$. This suppresses an increase in the series resistance of the device in high-doped region 19b. Typically, it is difficult in terms of crystal growth process to realize a step-like Mg concentration profile in low-doped region 19a as illustrated in (b) in FIG. 9. Accordingly, the average Mg doping amounts in electron barrier layer 18, low-doped region 19a, and high-doped region 19b are respectively regarded as P-type impurity concentrations P1, P2, and P3. P-type impurity concentration P1 is $2 \times 10^{19}$ cm$^{-3}$, and P-type impurity concentration P3 is $1 \times 10^{19}$ cm$^{-3}$.

Figure 10:
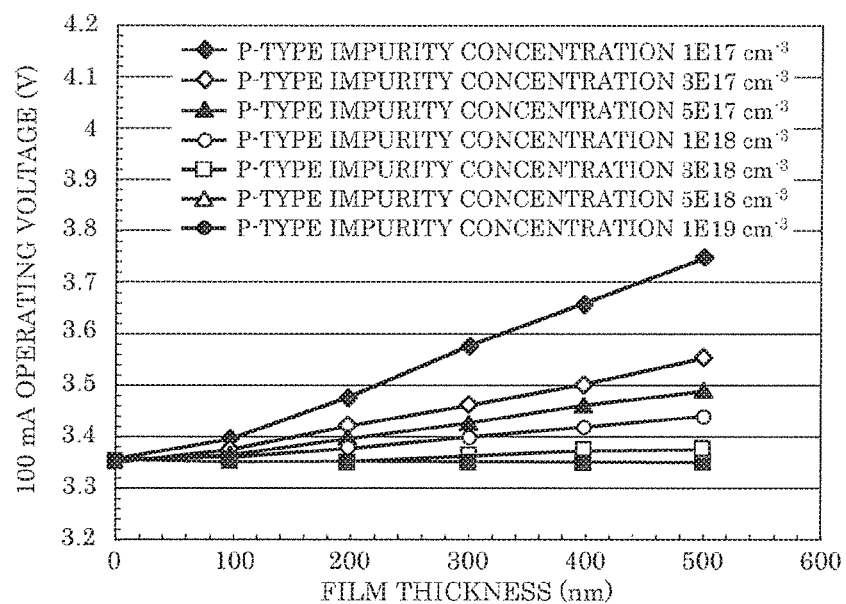
FIG. 10 is a calculation result of the operating voltage in 100 mA operation.

FIG. 10 illustrates a calculation result of the operating voltage of the light-emitting device in 100 mA operation in the case where film thickness zp is 0 nm or more and 500 nm or less and P-type impurity concentration P2 is $1 \times 10^{17}$ cm$^{-3}$ or more and $1 \times 10^{19}$ cm$^{-3}$ or less.

As illustrated in FIG. 10, an increase in film thickness zp causes an increase in the operating voltage. Therefore, in this embodiment, film thickness zp is set to 300 nm or less to suppress an increase in the operating voltage. In this case, even when film thickness zp is as thick as 300 nm, the operating voltage hardly changes as long as P-type impurity concentration P2 is $3 \times 10^{18}$ cm$^{-3}$ or more. Moreover, even when film thickness zp is as thick as 300 nm, the operating voltage increase can be limited to 0.05 V or less as long as P-type impurity concentration P2 is $1 \times 10^{18}$ cm$^{-3}$ or more.

Figure 11:
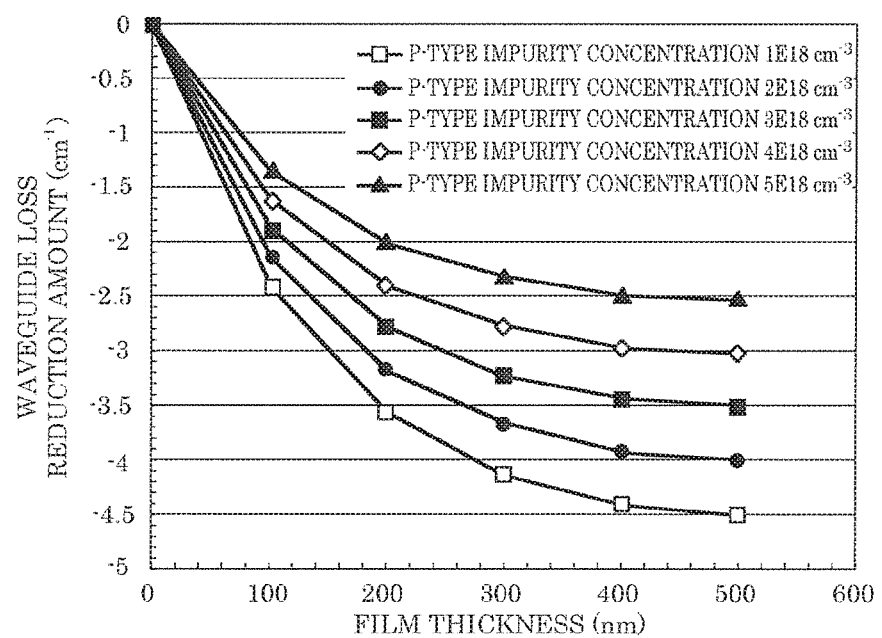
FIG. 11 is a calculation result of the waveguide loss reduction amount.

For the structure subjected to the calculation in FIG. 10, the waveguide loss reduction amount is estimated from the waveguide loss in the case where P-type impurity concentration P2 is increased from $1 \times 10^{18}$ cm$^{-3}$ to $5 \times 10^{18}$ cm$^{-3}$ in increments of $1 \times 10^{18}$ cm$^{-3}$ and P-type impurity concentration P3 is $1 \times 10^{19}$ cm$^{-3}$. FIG. 11 illustrates the relationship between the film thickness and the waveguide loss reduction amount in this case. As illustrated in FIG. 11, for each value of P-type impurity concentration P2, the waveguide loss reduction effect is greater when film thickness zp is larger.

The waveguide loss reduction effect can be achieved even when P-type impurity concentration P2 is $5 \times 10^{18}$ cm$^{-3}$ or less. If film thickness zp is 100 nm or more, a significant waveguide loss reduction effect is obtained. If film thickness zp is 200 nm or more, the waveguide loss can be reduced by 2 cm$^{-1}$ in the case where P-type impurity concentration P2 is $5 \times 10^{18}$ cm$^{-3}$.

However, an increase in film thickness zp causes an increase in the operating voltage of the light-emitting device, as illustrated in FIG. 10. Therefore, in the present disclosure, film thickness zp is set to 200 nm or more and 300 nm or less to suppress an increase in the operating voltage. By setting P-type impurity concentration P2 to $3 \times 10^{18}$ cm$^{-3}$ in this range of film thickness zp, the waveguide loss can be reduced by 2.8 cm$^{-1}$. Further, by setting P-type impurity concentration P2 to $1 \times 10^{18}$ cm$^{-1}$, the waveguide loss can be reduced by 3.6 cm$^{-1}$. Thus, by setting film thickness zp to 200 nm or more and 300 nm or less and P-type impurity concentration P2 to $3 \times 10^{18}$ cm$^{-3}$ or more and $5 \times 10^{18}$ cm$^{-3}$ or less, the waveguide loss can be reduced by 2 cm$^{-1}$ or more and 3.2 cm$^{-1}$ or less. In this case, the operating voltage hardly changes, from the result illustrated in FIG. 10.

Moreover, by setting film thickness zp to 200 nm or more and 300 nm or less and P-type impurity concentration P2 to $1 \times 10^{18}$ cm$^{-3}$ or more and $3 \times 10^{18}$ cm$^{-3}$ or less, the waveguide loss can be reduced by 2.8 cm$^{-1}$ or more and 4.2 cm$^{-1}$ or less. In this case, the operating voltage increases by about 0.05 V, from the result illustrated in FIG. 10. When width x1 of Al composition increase region 18a is 5 nm and width x2 of Al composition constant region 18b is 2 nm, a voltage reduction of about 0.36 V can be achieved in the case where the Al composition constant region has an Al composition of 35%. Subtracting, from this, a voltage increase amount of 0.05 V in the case where P-type impurity concentration P2 is $1 \times 10^{18}$ cm$^{-3}$ or more and $3 \times 10^{18}$ cm$^{-3}$ or less yields an expected voltage reduction effect of 0.31 V.

The waveguide loss reduction effect by low-doped region 19a can be achieved even in the conventional structure in which the Al composition of electron barrier layer 18 is constant, where the slope efficiency is increased to effectively achieve high-temperature high-power operation. By gradually increasing the Al composition of electron barrier layer 18 on the multiquantum well active layer 15 side as described in this embodiment, however, voltage reduction, waveguide loss reduction, and reduction of leakage current due to an increase in electron barrier energy can be achieved simultaneously. The structure of the light-emitting device according to this embodiment is thus much more effective in achieving high-temperature high-power operation of 85° C. or more than the structure of the conventional light-emitting device.

The result in (d) in FIG. 8 indicates that the waveguide loss increases by 0.2 cm$^{-1}$ in the case where width x1 of Al composition increase region 18a is 5 nm, width x2 of Al composition constant region 18b is 2 nm, and the Al composition of the Al composition constant region is 35%. However, by setting P-type impurity concentration P2 to $1 \times 10^{18}$ cm$^{-3}$ or more and $3 \times 10^{18}$ cm$^{-3}$ or less, the waveguide loss can be reduced by 2.8 cm$^{-1}$ or more and 4.2 cm$^{-1}$ or less. The resultant waveguide loss reduction is therefore 2.6 cm$^{-1}$ or more and 4.0 cm$^{-1}$ or less.

Thus, by forming the composition change region on the multiquantum well active layer 15 side and providing the low-doped region on the multiquantum well active layer 15 side of the P-type cladding layer as described in this embodiment, such a device that can achieve all of operating voltage reduction, waveguide loss reduction, and improvement of temperature characteristics by ΔE increase can be realized.

In this embodiment, film thickness zp is 250 nm, and P-type impurity concentration P2 is $3\times10^{18}$ cm$^{-3}$. With this structure, a loss reduction of about 3 cm$^{-1}$, a voltage reduction of 0.36 V, and a ΔE increase of 0.82 eV can be achieved. In such a case, the waveguide loss is reduced by 4.0 cm$^{-1}$.

Figure 12:
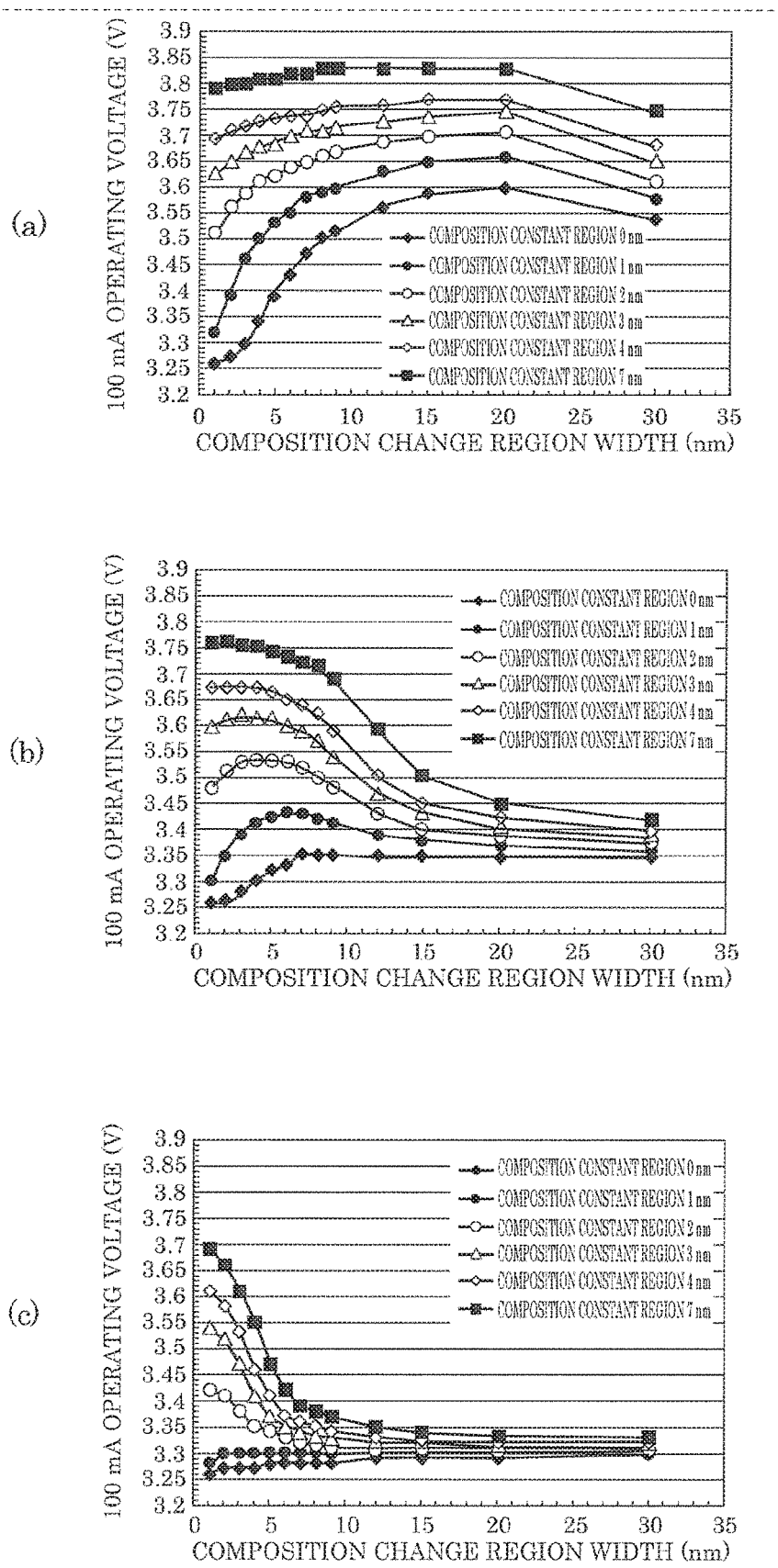
FIG. 12 is a diagram illustrating, in (a), a calculation result of the operating voltage in 100 mA operation in the case where the electron barrier layer is doped with Mg of $5\times10^{18}$ cm$^{-3}$, in (b), a calculation result of the operating voltage in 100 mA operation in the case where the electron barrier layer is doped with Mg of $1\times10^{19}$ cm$^{-3}$, and in (c), a calculation result of the operating voltage in 100 mA operation in the case where the electron barrier layer is doped with Mg of $2\times10^{19}$ cm$^{-3}$.

The doping amount of Mg for electron barrier layer 18 necessary for voltage reduction is described below. (a) to (c) in FIG. 12 each illustrate a calculation result of the operating voltage in the case where width x1 of the Al composition increase region is changed from 1 nm to 30 nm in structures in which Al composition increase region 18a is formed only on the multiquantum well active layer 15 side in the electron barrier layer and width x2 of Al composition constant region 18b (35%) is 0 nm, 1 nm, 2 nm, 3 nm, 4 nm, and 7 nm, in the structure in this embodiment. (a) in FIG. 12 illustrates a calculation result in the case where the electron barrier layer is doped with Mg of $5\times10^{18}$ cm$^{-3}$. (b) in FIG. 12 illustrates a calculation result in the case where the electron barrier layer is doped with Mg of $1\times10^{19}$ cm$^{-3}$. (c) in FIG. 12 illustrates a calculation result in the case where the electron barrier layer is doped with Mg of $2\times10^{19}$ cm$^{-3}$. P-type AlGaN cladding layer 19 is uniformly doped with Mg of $1\times10^{19}$ cm$^{-3}$. P-type GaN intermediate layer 17 is doped with the same amount of Mg as electron barrier layer 18.

As described above, in the case where electron barrier layer 18 is doped with Mg of $2\times10^{19}$ cm$^{-3}$ ((c) in FIG. 12), when width x1 of Al composition increase region 18a is 5 nm or more and 10 nm or less and width x2 of Al composition constant region 18b is 4 nm or less, the operating voltage in 100 mA operation is reduced to 3.4 V or less. When width x1 of Al composition increase region 18a is 10 nm or less and width x2 of Al composition constant region 18b is 2 nm or less, the operating voltage in 100 mA operation is reduced to 3.4 V or less.

In the case where the doping amount of Mg for the electron barrier layer is $5\times10^{18}$ cm$^{-3}$, on the other hand, when width x2 of Al composition constant region 18b is more than 1 nm, operating voltage in 100 mA operation is 3.4 V or more, as illustrated in (a) in FIG. 12. To limit the operating voltage in 100 mA operation to 3.4 V or less, width x1 of Al composition increase region 18a needs to be 2 nm or less in the case where width x2 of Al composition constant region 18b is 1 nm, and needs to be 5 nm or less in the case where width x2 of Al composition constant region 18b is 0 nm.

In the case where the doping amount of Mg for electron barrier layer 18 is $1\times10^{19}$ cm$^3$, to limit the operating voltage in 100 mA operation to 3.4 V or less, width x1 of Al composition increase region 18a needs to be 10 nm or more in the case where width x2 of Al composition constant region 18b is more than 2 nm, as illustrated in (b) in FIG. 12. In the case where width x2 of Al composition constant region 18b is 1 nm, the operating voltage is 3.42 V or less when x1 is 10 nm or less. Accordingly, width x1 of Al composition increase region 18a may be 10 nm or less in the case where width x2 of Al composition constant region 18b is 0 nm.

Thus, a high doping amount of Mg for electron barrier layer 18 is advantageous in voltage reduction, and the doping amount of Mg for electron barrier layer 18 needs to be $1\times10^{19}$ cm$^{-3}$ or more in order to stably achieve voltage reduction even when the constituent film thicknesses in electron barrier layer 18 vary. If the doping amount of Mg is excessively high, however, the waveguide loss increases.

In this embodiment, the doping amount of Mg for electron barrier layer 18 is $2\times10^{19}$ cm$^{-3}$, width x1 of Al composition increase region 18a is 5 nm, and width x2 of Al composition constant region 18b is 2 nm, thus achieving both low-voltage operation and low waveguide loss.

Figure 13:
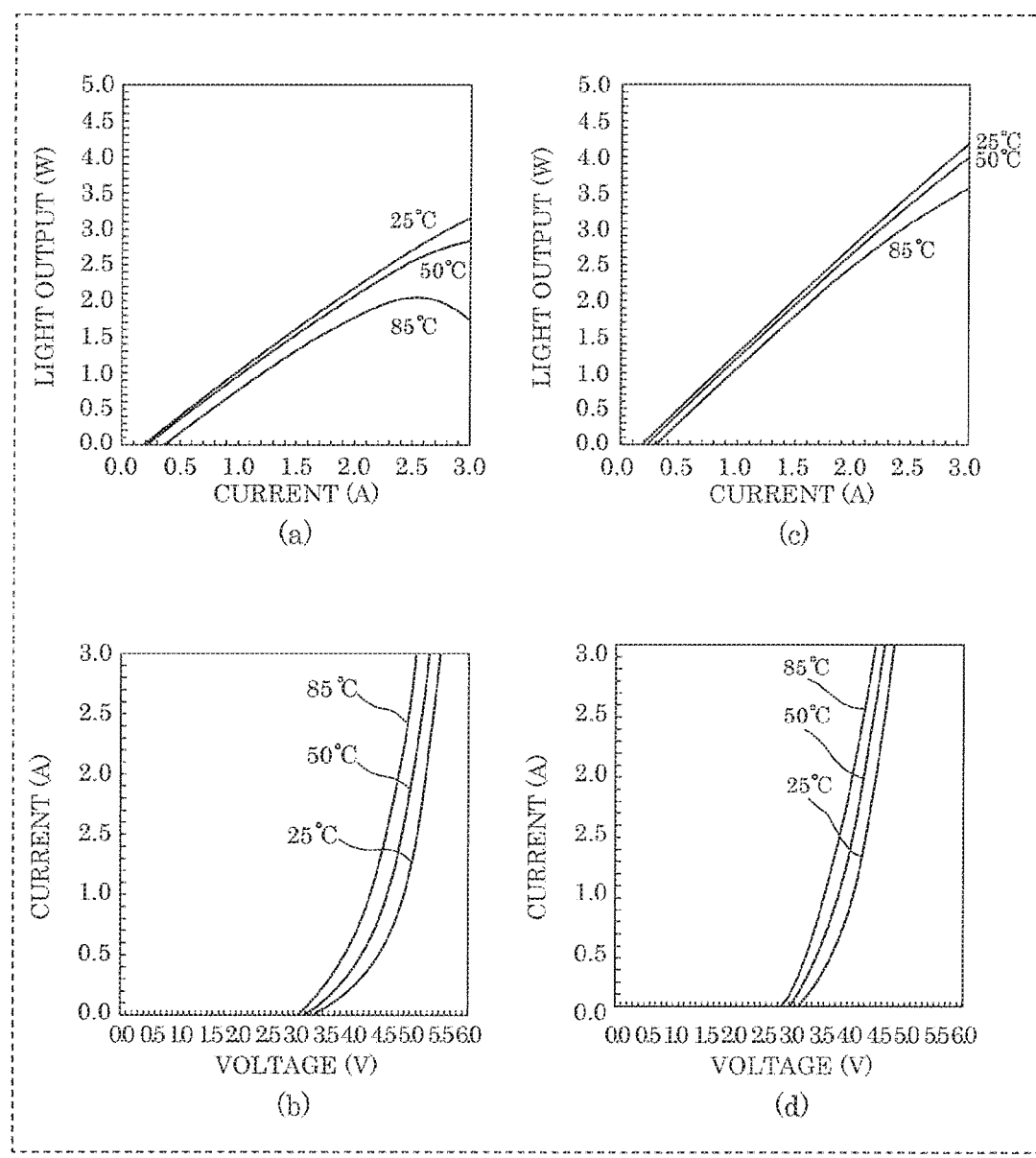
FIG. 13 is a diagram illustrating, in (a), the current-light output characteristics of a light-emitting device having a conventional structure, in (b), the current-voltage characteristics of the device having the conventional structure, in (c), the current-light output characteristics of a light-emitting device having the structure according to Embodiment 1 of the present disclosure, and in (d), the current-voltage characteristics of the light-emitting device having the structure according to Embodiment 1 of the present disclosure.

(a) and (b) in FIG. 13 illustrate the current-light output characteristics and the current-voltage characteristics of a light-emitting device having a structure in which electron barrier layer 18 (film thickness: 7 nm) has Al composition constant region 18b (35%) and P-type AlGaN cladding layer 19 is uniformly doped with Mg of a concentration of $1\times10^{19}$ cm$^{-3}$, respectively. In the conventional structure, thermal saturation occurs at a light output of 2 W in high-temperature operation of 85° C., as illustrated in the drawing.

(c) and (d) in FIG. 13 illustrate the current-light output characteristics and the current-voltage characteristics of a device having the structure of the light-emitting device according to this embodiment, respectively. In the structure of the light-emitting device according to this embodiment, a high power of 3 W or more is obtained even in high-temperature operation of 85° C. This can be attributed to the following three reasons: (1) First, as a result of forming Al composition increase region 18a on the multiquantum well active layer 15 side of electron barrier layer 18, the potential barrier against electrons increases by about 0.3 eV, so that leakage current is suppressed even in a high-temperature operation state. (2) Second, as a result of forming Al composition increase region 18a in which the Al composition changes (increases) on the multiquantum well active layer 15 side of electron barrier layer 18, the potential barrier of the spikes against holes in the valence band decreases, as illustrated in (b) and (d) in FIG. 13. Consequently, the operating voltage of the light-emitting device is reduced by about 0.3 V, and the self-heating of the light-emitting device is reduced. (3) Third, as a result of forming low-doped region 19a in P-type AlGaN cladding layer 19, the waveguide loss is reduced by 3 cm$^{-1}$. This allows the light-emitting device according to this embodiment to have a low-loss waveguide with a loss of about half of a conventional waveguide loss of 7 cm$^{-1}$, thus improving the slope efficiency. The structure of the light-emitting device according to this embodiment can therefore achieve high-power operation of 3 W or more even in high-temperature operation of 85° C.

[Advantageous Effects, Etc.]

In the nitride-based semiconductor light-emitting device according to this embodiment, the change in the band structure of the valence band of the electron barrier layer caused by the piezoelectric field is canceled out by the change in the valence band structure caused by the composition change of the electron barrier layer, so that an increase in the energy barrier against holes can be suppressed to suppress an increase in the operating voltage. Moreover, the energy barrier against electrons can be increased. Further, by reducing the impurity concentration of the second cladding layer on the side nearer the electron barrier layer, the waveguide loss can be reduced. Consequently, even when the impurity concentration of the second cladding layer is reduced, the waveguide loss can be reduced while suppressing leakage current without causing an increase in the operating voltage. The operating current value and the operating voltage are reduced in this way. A light-emitting device with low waveguide loss, low operating voltage, and little leakage current can thus be provided.

Embodiment 2

A light-emitting device according to Embodiment 2 is described below.

In the light-emitting device according to the foregoing Embodiment 1, the Al composition distribution of electron barrier layer 18 and the Mg doping profile of P-type AlGaN cladding layer 19 and electron barrier layer 18 are designed in detail to achieve all of low voltage, low waveguide loss, and ΔE increase. In the structure of the light-emitting device according to Embodiment 2 of the present disclosure, the doping profile of N-type layers including N-type AlGaN cladding layer 12, second light guide layer 13, and third light guide layer 14 is also adjusted to achieve further loss reduction and voltage reduction. The light-emitting device according to this embodiment is described below.

An N-type impurity doping profile is described first. In the structure of the light-emitting device according to Embodiment 1, N-type AlGaN cladding layer 12 and second light guide layer 13 are doped with Si of $1 \times 10^{18}$ cm$^{-3}$ as an N-type impurity, and third light guide layer 14 is not doped with an N-type impurity. The operating voltage and the waveguide loss of such a structure are estimated in Embodiment 1. To further reduce the waveguide loss, for the above-mentioned N-type layers (N-type AlGaN cladding layer 12, second light guide layer 13, and third light guide layer 14), the N-type impurity doping concentration is reduced in each region whose level of contribution to operating voltage increase is low. In this way, the waveguide loss can be reduced. The interface between N-type AlGaN cladding layer 12 and second light guide layer 13 and the interface between second light guide layer 13 and third light guide layer 14 are likely to have a high level of contribution to operating voltage increase in the N-type layers. In these interfaces, a difference in bandgap energy or a lattice misfit induces a piezoelectric polarization charge. This causes spikes in the band structure of the conduction band, as illustrated in (a) to (c) in FIG. 14. Such spikes hinder electric conduction of electrons, leading to an increase in the operating voltage of the light-emitting device.

Figure 14:
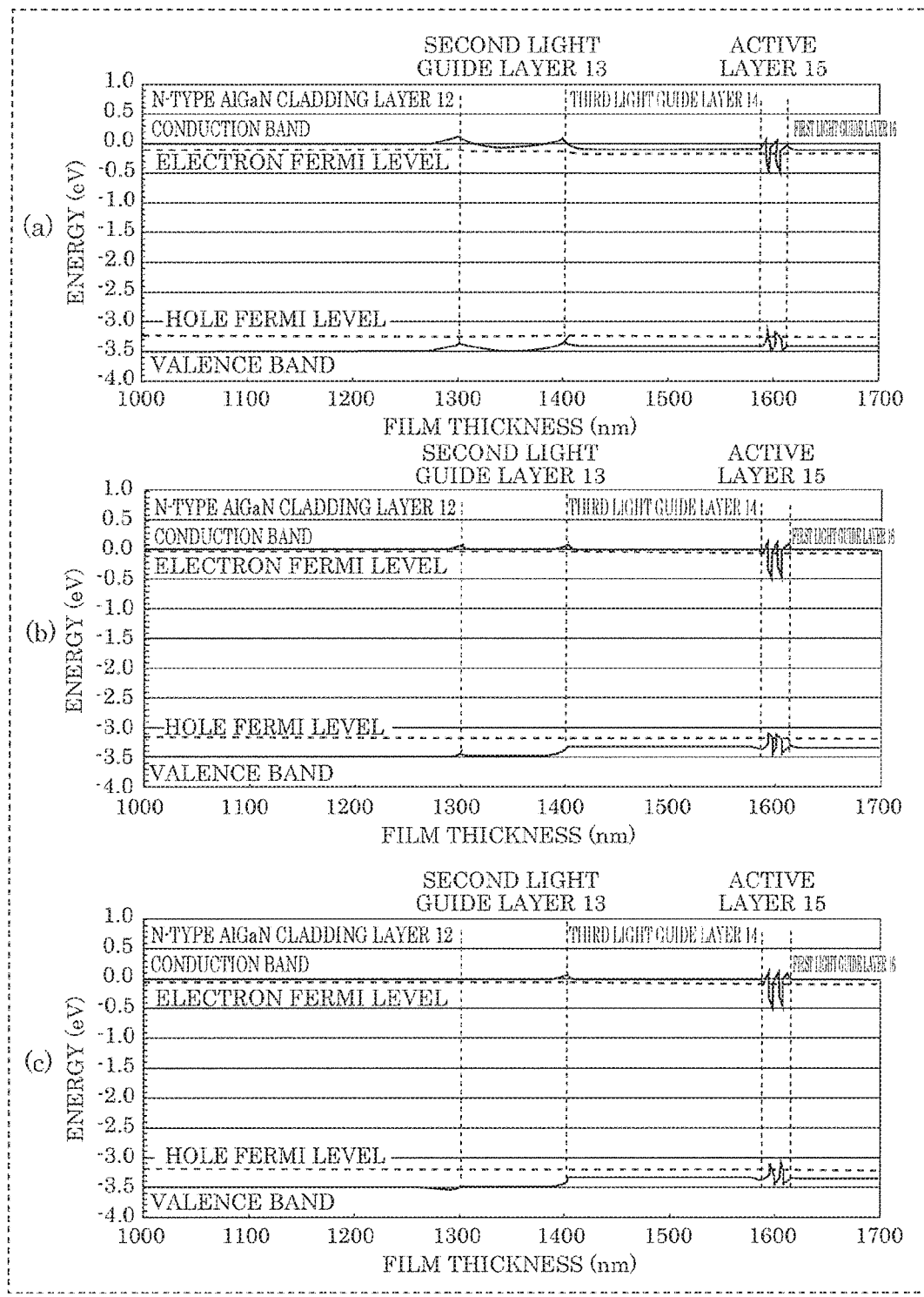
FIG. 14 is a diagram illustrating, in (a), a calculation result of the band structure of N-type layer regions in the case where an N-type AlGaN cladding layer and a second light guide layer are doped with Si of $1\times10^{17}$ cm$^{-3}$ from an interface, in (b), the band structure of the N-type layer regions in 100 mA operation in the case where the N-type AlGaN cladding layer and the second light guide layer are doped with Si of $1\times10^{18}$ cm$^{-3}$, and in (c), a calculation result of the band structure of the N-type layer regions in 100 mA operation for a light-emitting device according to Embodiment 2 of the present disclosure.

To reduce the influence of such spikes in the N-type layer interface, the N-type impurity doping concentration for each N-type layer is increased to increase the Fermi energy of electrons, thus enhancing the energy of the conduction band of each N-type layer. Spikes can be suppressed in this way. (a) in FIG. 14 illustrates a calculation result of the band structure of N-type layer regions in the case of doping N-type AlGaN cladding layer 12 and second light guide layer 13 with Si of $1 \times 10^{17}$ cm$^{-3}$. (b) in FIG. 14 illustrates a calculation result of the band structure of the N-type layer regions in the case of doping N-type AlGaN cladding layer 12 and second light guide layer 13 with Si of $1 \times 10^{18}$ cm$^{-3}$.

As illustrated in (a) and (b) in FIG. 14, by increasing the doping concentration of Si, the width of the region in which spikes are created in the energy band in the conduction band formed in the interface or the height of the barrier energy of spikes is reduced. However, when the doping concentration of Si for N-type AlGaN cladding layer 12 and second light guide layer 13 is increased from $1 \times 10^{17}$ cm$^{-3}$ to $1 \times 10^{18}$ cm$^{-3}$, the waveguide loss increases by 0.46 cm$^{-1}$ due to an increase in the free carrier loss in the N-type layer. This waveguide loss increase amount is about 10% of the total waveguide loss of the light-emitting device, and has significant influence on the decrease in slope efficiency.

In view of this, such an N-type impurity concentration profile that can suppress an increase in the operating voltage and the waveguide loss in the structure of the light-emitting device according to this embodiment is examined below. Spikes in the hetero interface have significant influence on the voltage increase in the N-type layer, as mentioned above. Hence, the operating voltage reduction effect is estimated for a structure in which, in the interface between N-type AlGaN cladding layer 12 and second light guide layer 13 and the interface between second light guide layer 13 and third light guide layer 14, respective regions of film thicknesses±z1 and ±z2 are high-doped with an N-type impurity, as illustrated in (a) and (b) in FIG. 15.

Figure 15:
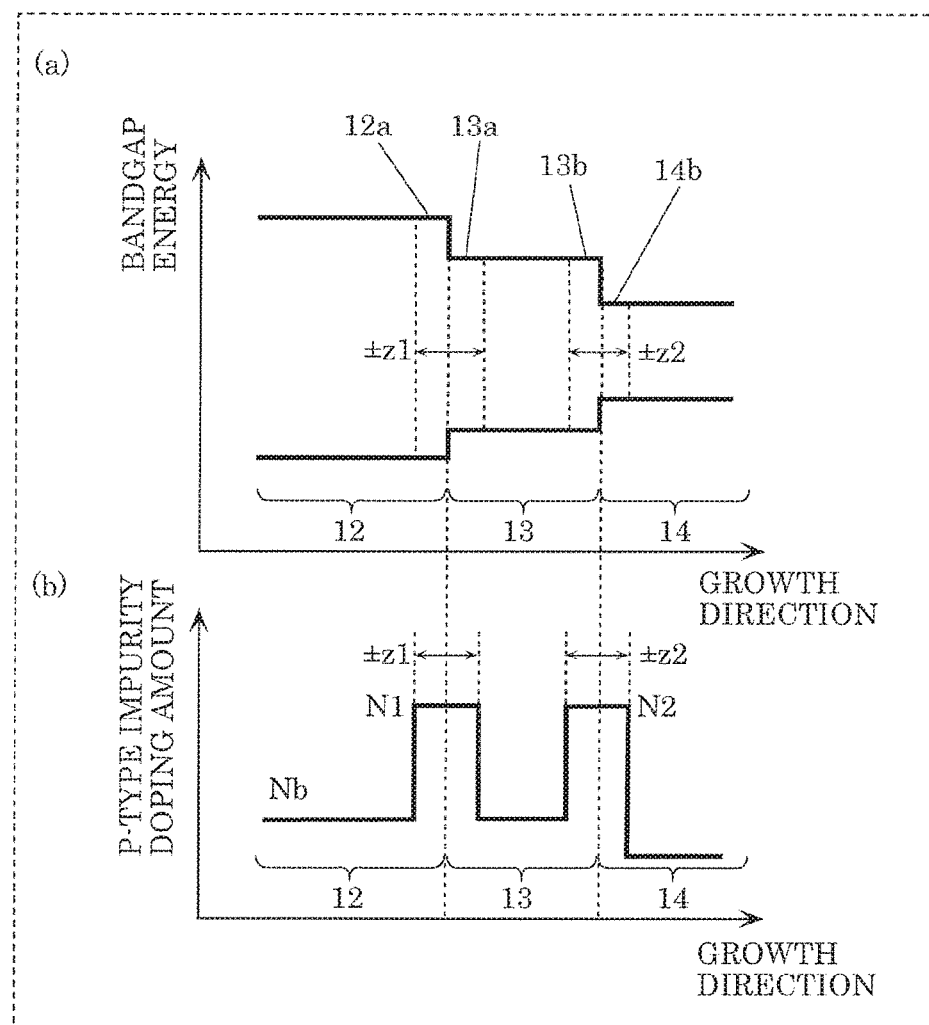
FIG. 15 is a diagram illustrating, in (a), the bandgap energy distribution in the light-emitting device according to Embodiment 2 of the present disclosure, and in (b), the impurity concentration distribution (doping amount) in the light-emitting device according to Embodiment 2 of the present disclosure.

In detail, as illustrated in (a) and (b) in FIG. 15, a near-interface region in N-type AlGaN cladding layer 12 from the interface between N-type AlGaN cladding layer 12 and second light guide layer 13 to film thickness z1 is set as high-concentration impurity region 12a, and a near-interface region in second light guide layer 13 from the interface between N-type AlGaN cladding layer 12 and second light guide layer 13 to film thickness z1 is set as high-concentration impurity region 13a. High-concentration impurity region 12a and high-concentration impurity region 13a are collectively referred to as a first high-concentration impurity region. The first high-concentration impurity region is doped with Si which is an N-type impurity, at a higher concentration than in the high-concentration impurity regions of N-type AlGaN cladding layer 12 other than high-concentration impurity region 12a and the high-concentration impurity regions of second light guide layer 13 other than high-concentration impurity region 13a.

Likewise, a near-interface region in second light guide layer 13 from the interface between second light guide layer 13 and third light guide layer 14 to film thickness z2 is set as high-concentration impurity region 13b, and a near-interface region in third light guide layer 14 from the interface between second light guide layer 13 and third light guide layer 14 to film thickness z2 is set as high-concentration impurity region 14b. High-concentration impurity region 13b and high-concentration impurity region 14b are collectively referred to as a second high-concentration impurity region. The second high-concentration impurity region is doped with Si which is an N-type impurity, at a higher concentration than in the high-concentration impurity regions of second light guide layer 13 other than high-concentration impurity region 13b and the high-concentration impurity regions of third light guide layer 14 other than high-concentration impurity region 14b.

Figure 16:
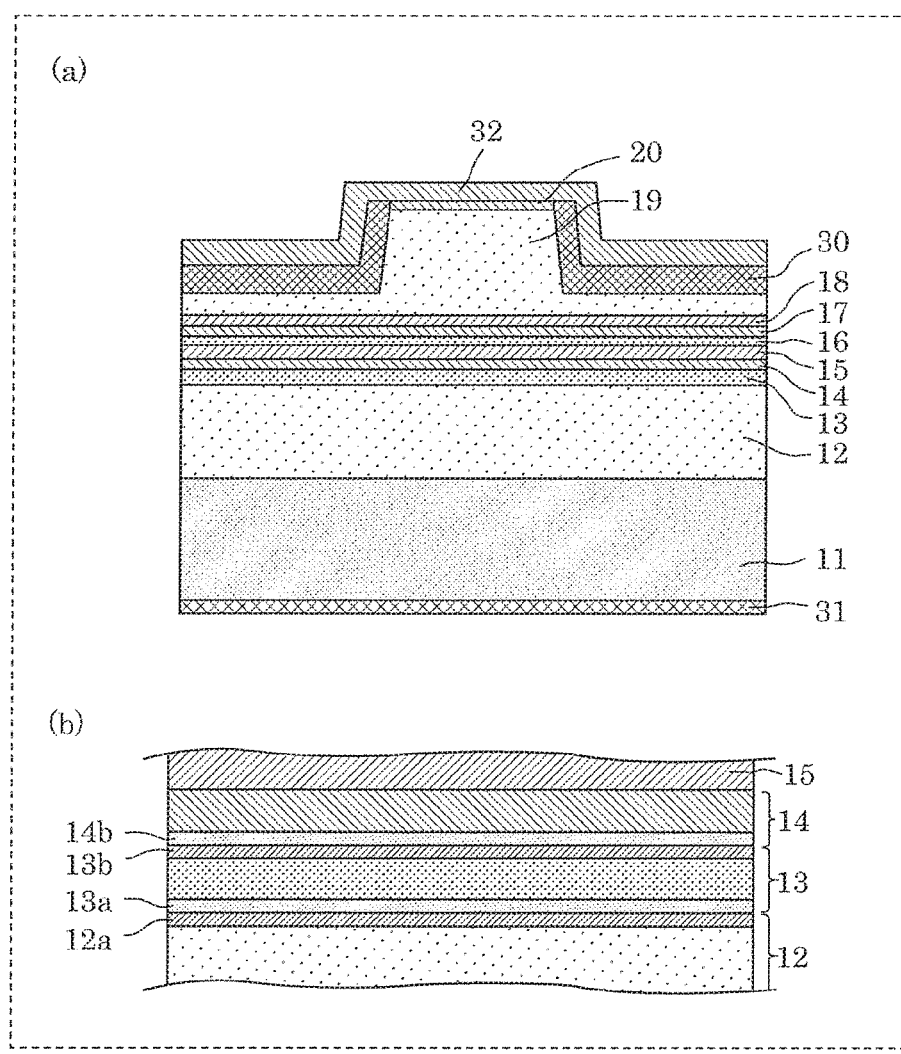
FIG. 16 is a diagram illustrating, in (a), the sectional structure of the light-emitting device according to Embodiment 2 of the present disclosure, and in (b), the vicinity of the interfaces of the N-type AlGaN cladding layer, the second light guide layer, and a third light guide layer in an enlarged view.

Let N1 be the N-type impurity doping amount from the interface between N-type AlGaN cladding layer 12 and second light guide layer 13 to a first interface region, N2 be the N-type impurity doping amount from the interface between second light guide layer 13 and third light guide layer 14 to a second interface region, and Nb be the N-type impurity doping amount in N-type AlGaN cladding layer 12 and second light guide layer 13 other than high-concentration impurity regions 12a, 13a, and 13b. The regions in third light guide layer 14 other than high-concentration impurity region 14b are not doped with an N-type impurity, to suppress an increase in the waveguide loss. As the N-type impurity, Si is used. (a) and (b) in FIG. 16 illustrate the sectional structure of the light-emitting device.

Figure 17:
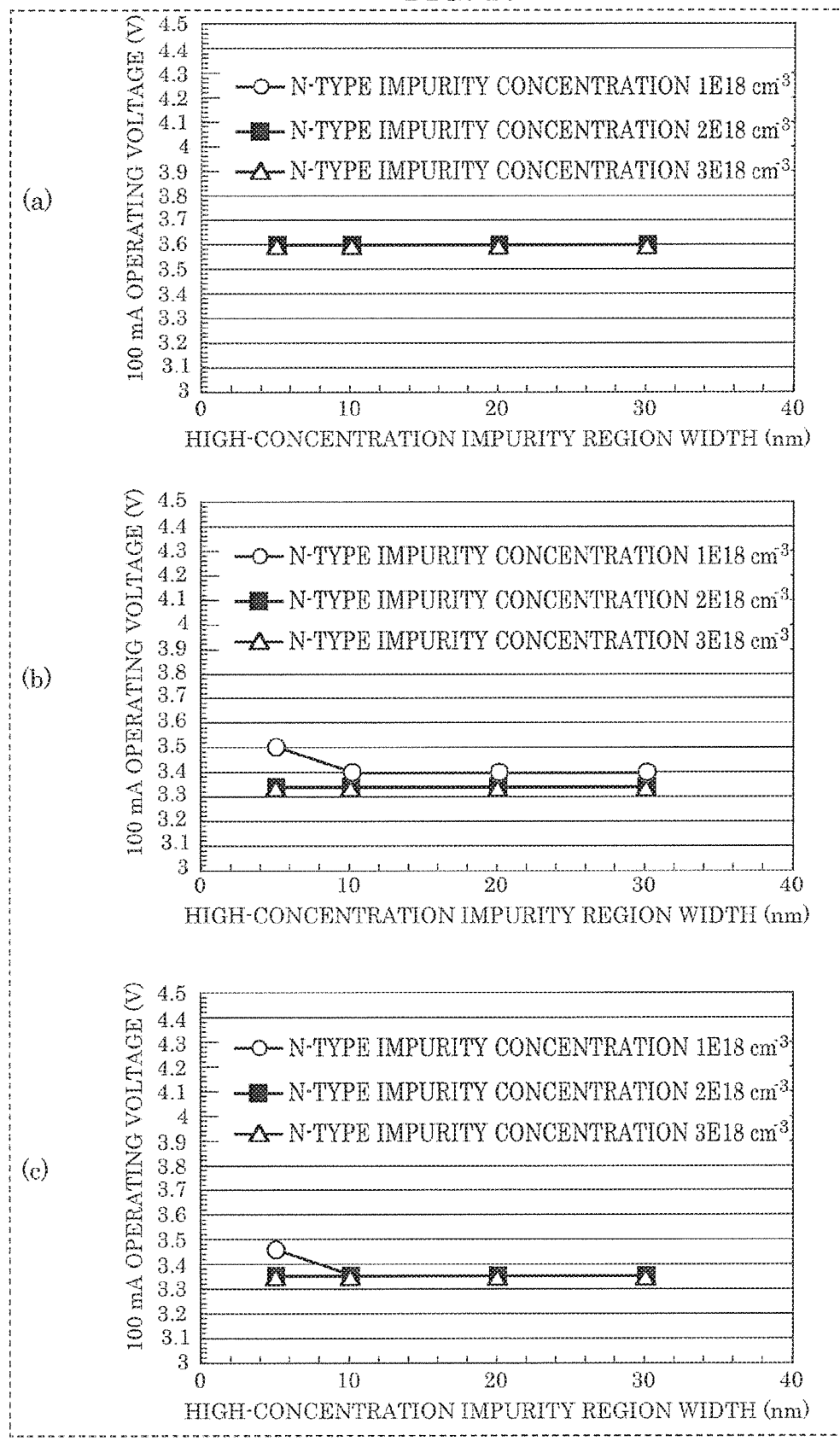
FIG. 17 is a diagram illustrating, in (a), a calculation result of the dependence of the operating voltage in 100 mA operation on the doped region width in the case of changing the doping amount of N-type impurity from the interface between the N-type AlGaN cladding layer and the second light guide layer, in (b), a calculation result of the dependence of the operating voltage in 100 mA operation on the doped region width in the case of changing the doping amount of N-type impurity from the interface between the second light guide layer and the third light guide layer, and in (c), a calculation result of the dependence of the operating voltage in 100 mA operation on the doped region width in the case of changing the doping amount of N-type impurity from the interface between the N-type AlGaN cladding layer and the second light guide layer and the interface between the second light guide layer and the third light guide layer.

(a) in FIG. 17 illustrates a calculation result of the dependence of the operating voltage in 100 mA operation on film thickness z1 in the case where Nb and N2 are $1 \times 10^{17}$ cm$^{-3}$ and N1 is changed as $1 \times 10^{18}$ cm$^{-3}$, $2 \times 10^{18}$ cm$^{-3}$, and $3 \times 10^{18}$ cm$^{-3}$. In this structure, only the first interface region within ±z1 from the interface between N-type AlGaN cladding layer 12 and second light guide layer 13 is doped with the N-type impurity of high-concentration.

In this case, when film thickness z1 is 5 nm or more and N1 is $1 \times 10^{18}$ cm$^{-3}$ or more, the operating voltage is reduced by about 0.2 V and becomes constant at 3.6 V, as illustrated in (a) in FIG. 17.

(b) in FIG. 17 illustrates a calculation result of the dependence of the operating voltage in 100 mA operation on film thickness z2 in the case where Nb and N1 are $1\times10^{17}$ cm$^{-3}$ and N2 is changed as $1\times10^{18}$ cm$^{-3}$, $2\times10^{18}$ cm$^{-3}$, and $3\times10^{18}$ cm$^{-3}$. In this structure, only the second interface region within ±z2 from the interface between second light guide layer 13 and third light guide layer 14 is doped with the N-type impurity of high-concentration.

In this case, when film thickness z2 is 10 nm or more and N2 is $1\times10^{18}$ cm$^{-3}$ or more, the operating voltage is reduced by about 0.4 V and becomes constant at 3.4 V, as illustrated in (b) in FIG. 17. When film thickness z2 is 10 nm or more and N2 is $2\times10^{18}$ cm$^{-3}$ or more, the operating voltage is reduced by about 0.45 V and becomes constant at 3.35 V. Thus, the operating voltage is the same as that in the case where N-type AlGaN cladding layer 12 and N-type GaN second light guide layer 13 are uniformly doped with Si of $1\times10^{18}$ cm$^{-3}$.

(c) in FIG. 17 illustrates a calculation result of the dependence of the operating voltage in 100 mA operation on film thicknesses z1 and z2 in the case where Nb is $1\times10^{17}$ cm$^{-3}$ and N1 and N2 are changed as $1\times10^{18}$ cm$^{-3}$, $2\times10^{18}$ cm$^{-3}$, and $3\times10^{18}$ cm$^{-3}$. In the calculation, N1 and N2 are the same value, and film thicknesses z1 and z2 are the same value.

In this case, when film thicknesses z1 and z2 are 10 nm or more and N1 and N2 are $1\times10^{18}$ cm$^{-3}$ or more, the operating voltage is reduced by about 0.45 V and becomes constant at 3.35 V, as illustrated in (c) in FIG. 17. Thus, the operating voltage is the same as that in the case where N-type AlGaN cladding layer 12 and N-type GaN second light guide layer 13 are uniformly doped with Si of $1\times10^{18}$ cm$^{-3}$.

These results demonstrate that, by doping only a region of ±10 nm or more from the interface between second light guide layer 13 and third light guide layer 14 with the N-type impurity of $2\times10^{18}$ cm$^{-3}$ or by doping the region of ±10 nm or more from the interface between N-type AlGaN cladding layer 12 and second light guide layer 13 and the region of ±10 nm or more from the interface between second light guide layer 13 and third light guide layer 14 with the N-type impurity of $1\times10^{18}$ cm$^{-3}$, an increase in the free carrier loss due to the N-type impurity can be reduced as much as possible while maintaining the same operating voltage as in the case where N-type AlGaN cladding layer 12 and second light guide layer 13 are uniformly doped with Si of $1\times10^{18}$ cm$^{-3}$.

Figure 18:
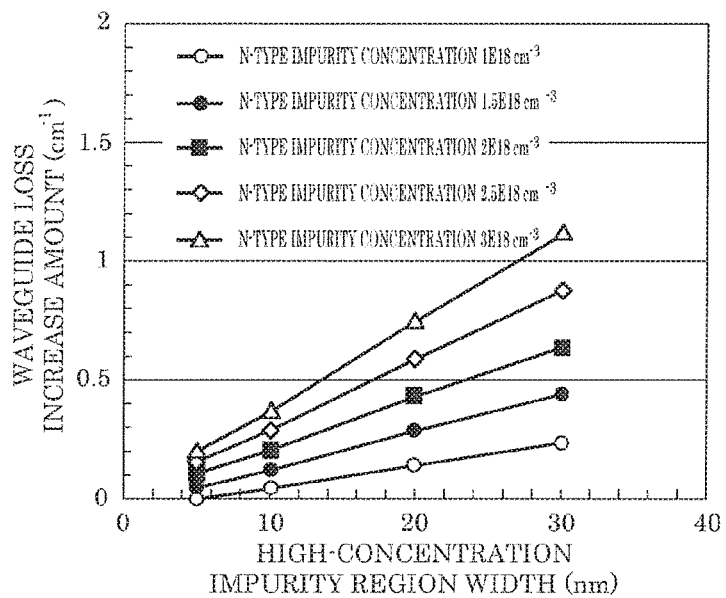
FIG. 18 is a diagram illustrating a calculation result of the dependence of the waveguide loss on the high-concentration impurity doped region width.

FIG. 18 illustrates a calculation result of the dependence of the waveguide loss increase amount on film thicknesses z1 and z2 in the case where Nb is $1\times10^{17}$ cm$^{-3}$ and N1 and N2 are changed as $1\times10^{18}$ cm$^{-3}$, $1.5\times10^{18}$ cm$^{-3}$, $2\times10^{18}$ cm$^{-3}$, $2.5\times10^{18}$ cm$^{-3}$, and $3\times10^{18}$ cm$^{-3}$, as with the structure illustrated in (c) in FIG. 17. In the calculation, N1 and N2 are the same value, and film thicknesses z1 and z2 are the same value. The waveguide loss increase amount in FIG. 18 is relative to a structure in which film thicknesses z1 and z2 are 5 nm, Nb is $1\times10^{17}$ cm$^{-3}$, and N1 and N2 are $1\times10^{18}$ cm$^{-3}$.

As illustrated in (c) in FIG. 17 and FIG. 18, by setting high-concentration impurity regions 12a and 13a to be ±10 nm (region width: 20 nm) or more and ±20 nm (region width: 40 nm) or less from the interface adjacent to high-concentration impurity regions 12a and 13a, i.e. the interface between N-type AlGaN cladding layer 12 and second light guide layer 13, and setting the N-type impurity concentration to $1\times10^{18}$ cm$^{-3}$ or more and $2\times10^{18}$ cm$^{-3}$ or less, an increase in the waveguide loss can be suppressed while maintaining the same operating voltage as in the case where N-type AlGaN cladding layer 12 and second light guide layer 13 are uniformly doped with Si of $1\times10^{18}$ cm$^{-3}$.

In particular, by setting N1 and N2 to $1\times10^{18}$ cm$^{-3}$ or more and $1.5\times10^{18}$ cm$^{-3}$ or less and setting high-concentration impurity regions 12a and 13a to be ±10 nm (region width: 20 nm) or more and ±20 nm (region width: 40 nm) or less from the interface between N-type AlGaN cladding layer 12 and second light guide layer 13, the waveguide loss increase can be reduced to 0.3 cm$^{-1}$ or less relative to the structure in which z1 and z2 are 5 nm, Nb is $1\times10^{17}$ cm$^{-3}$, and N1 and N2 are $1\times10^{18}$ cm$^{-3}$ while maintaining the same operating voltage as in the case where N-type AlGaN cladding layer 12 and second light guide layer 13 are uniformly doped with Si of $1\times10^{18}$ cm$^{-3}$.

In this embodiment, N1 and N2 are $1\times10^{18}$ cm$^{-3}$, and high-concentration impurity regions 12a and 13a are in a range of ±10 nm (region width: 20 nm) from the interface between N-type AlGaN cladding layer 12 and second light guide layer 13. In this case, a waveguide loss reduction of 0.4 cm$^{-1}$ can be achieved to realize a low waveguide loss of 3.6 cm$^{-1}$ while maintaining the same operating voltage as in the case where N-type AlGaN cladding layer 12 and second light guide layer 13 are uniformly doped with Si of $1\times10^{18}$ cm$^{-3}$.

(c) in FIG. 14 illustrates a calculation result of the band structure in 100 mA operation for the structure of this embodiment in which N1 and N2 are $1\times10^{18}$ cm$^{-3}$ and high-concentration impurity regions 12a and 13a are in a range of ±10 nm (region width: 20 nm) from the interface between high-concentration impurity regions 12a and 13a.

As illustrated in (c) in FIG. 14, spikes in the energy band of the conduction band formed in the interface are reduced by increasing the doping concentration of Si.

As described above, in the light-emitting device according to this embodiment, by increasing the impurity concentration relatively in at least one interface from among the interface between the first cladding layer and the second light guide layer and the interface between the second light guide layer and the third light guide layer, the Fermi energy of electrons in the interface can be increased. This flattens the energy band in the conduction band, and reduces the operating voltage of the light-emitting device.

Embodiment 3

A light-emitting device according to Embodiment 3 is described below.

In the structure illustrated in FIG. 15 in Embodiment 2, by setting N1 and N2 to $2\times10^{18}$ cm$^{-3}$ or more and $2.5\times10^{18}$ cm$^{-3}$ or less and setting high-concentration impurity regions 12a and 13a to be ±5 nm (region width: 10 nm) or more and ±10 nm (region width: 20 nm) or less from the interface between N-type AlGaN cladding layer 12 and second light guide layer 13, a waveguide loss reduction of 0.2 cm$^{-1}$ or more can be achieved while maintaining the same operating voltage as in the case where N-type AlGaN cladding layer 12 and second light guide layer 13 are uniformly doped with Si of $1\times10^{18}$ cm$^{-3}$.

In Embodiment 3 of the present disclosure, the structure in Embodiment 2 is modified so that N1 and N2 are $2\times10^{18}$ cm$^{-3}$ and high-concentration impurity regions 12a and 13a are in a range of ±5 nm (region width: 10 nm) from the interface between N-type AlGaN cladding layer 12 and second light guide layer 13. In this case, a waveguide loss reduction of 0.4 cm$^{-1}$ can be achieved to realize a low waveguide loss of 3.6 cm$^{-1}$ while maintaining the same operating voltage as in the case where N-type AlGaN cladding layer 12 and second light guide layer 13 are uniformly doped with Si of $1\times10^{18}$ cm$^{-3}$.

Embodiment 4

A light-emitting device according to Embodiment 4 is described below.

The vicinity of the interface between N-type AlGaN cladding layer 12 and second light guide layer 13 and the vicinity of the interface between second light guide layer 13 and third light guide layer 14 are likely to have a high level of contribution to operating voltage increase in the N-type layers, as mentioned earlier. In these regions near the interfaces (near-interface regions), a difference in bandgap energy or a lattice misfit induces a piezoelectric polarization charge. This causes spikes in the band structure of the conduction band, as illustrated in (a) in FIG. 14. Such spikes hinder electric conduction of electrons, leading to an increase in the operating voltage of the device. The foregoing embodiments each describe a structure that can achieve all of low voltage, low waveguide loss, and ΔE increase by examining in detail the Al composition distribution of electron barrier layer 18, the Mg doping profile of P-type AlGaN cladding layer 19 and electron barrier layer 18, and the doping profile of N-type AlGaN cladding layer 12, second light guide layer 13, and third light guide layer 14.

In the light-emitting device according to Embodiment 4 of the present disclosure, the atomic composition is gradually changed in the near-interface region of N-type AlGaN cladding layer 12 and second light guide layer 13 and the near-interface region of second light guide layer 13 and third light guide layer 14. With this structure, the steepness of spikes in the interface formed in the band structure in the conduction band or the piezoelectric polarization charge distribution can be alleviated, as illustrated in FIG. 18. This improves the electrical conductivity of electrons, so that the operating voltage can be reduced.

Further, with this structure, doping the vicinity of the interface with an N-type impurity of high concentration of $1\times10^{18}$ cm$^{-3}$ or more as described in Embodiments 2 and 3 of the present disclosure is unnecessary. Therefore, voltage reduction can be achieved without a significant increase in the waveguide loss.

Figure 19:
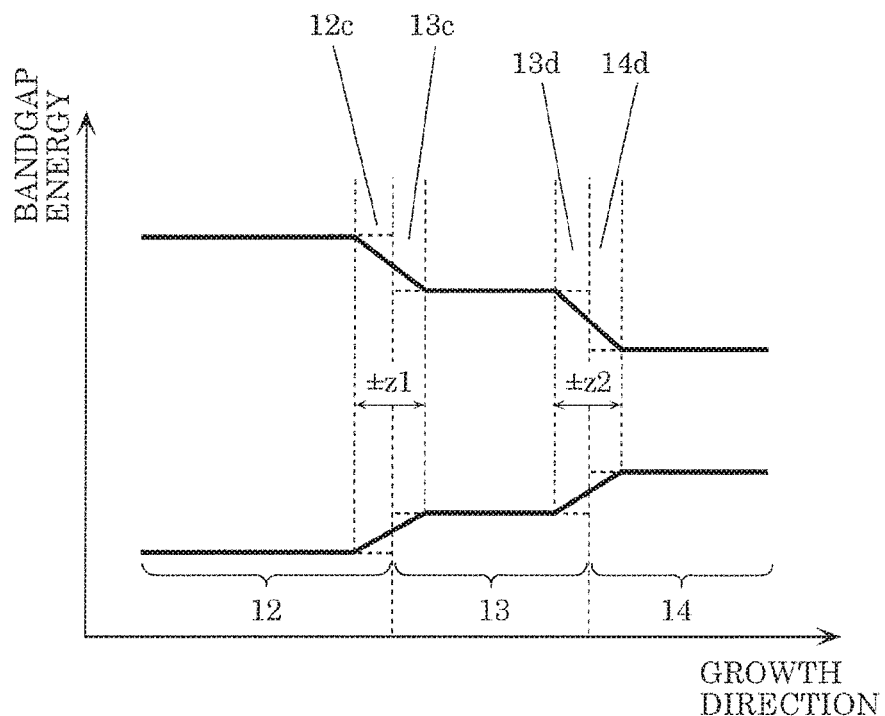
FIG. 19 is a diagram illustrating the bandgap energy distribution in a light-emitting device according to Embodiment 4 of the present disclosure.

The operating voltage reduction effect is estimated for a structure in which, in the vicinity of the interface between N-type AlGaN cladding layer 12 and second light guide layer 13 and the vicinity of the interface between second light guide layer 13 and third light guide layer 14, respective regions of film thicknesses±z1 and ±z2 are each subjected to interpolation of the atomic composition of the corresponding layer, as illustrated in FIG. 19.

In detail, as illustrated in FIG. 19, a near-interface region in N-type AlGaN cladding layer 12 from the interface between N-type AlGaN cladding layer 12 and second light guide layer 13 to film thickness z1 is set as composition change region 12c, and a near-interface region in second light guide layer 13 from the interface between N-type AlGaN cladding layer 12 and second light guide layer 13 to film thickness z1 is set as composition change region 13c. Composition change region 12c and composition change region 13c are collectively referred to as a first composition change region.

Likewise, a near-interface region in second light guide layer 13 from the interface between second light guide layer 13 and third light guide layer 14 to film thickness z2 is set as composition change region 13d, and a near-interface region in third light guide layer 14 from the interface between second light guide layer 13 and third light guide layer 14 to film thickness z2 is set as composition change region 14d. Composition change region 13d and composition change region 14d are collectively referred to as a second composition change region.

In the first composition change region of N-type AlGaN cladding layer 12 and second light guide layer 13, the Al composition is gradually changed. In the second composition change region of second light guide layer 13 and third light guide layer 14, the In composition is gradually changed.

Figure 20:
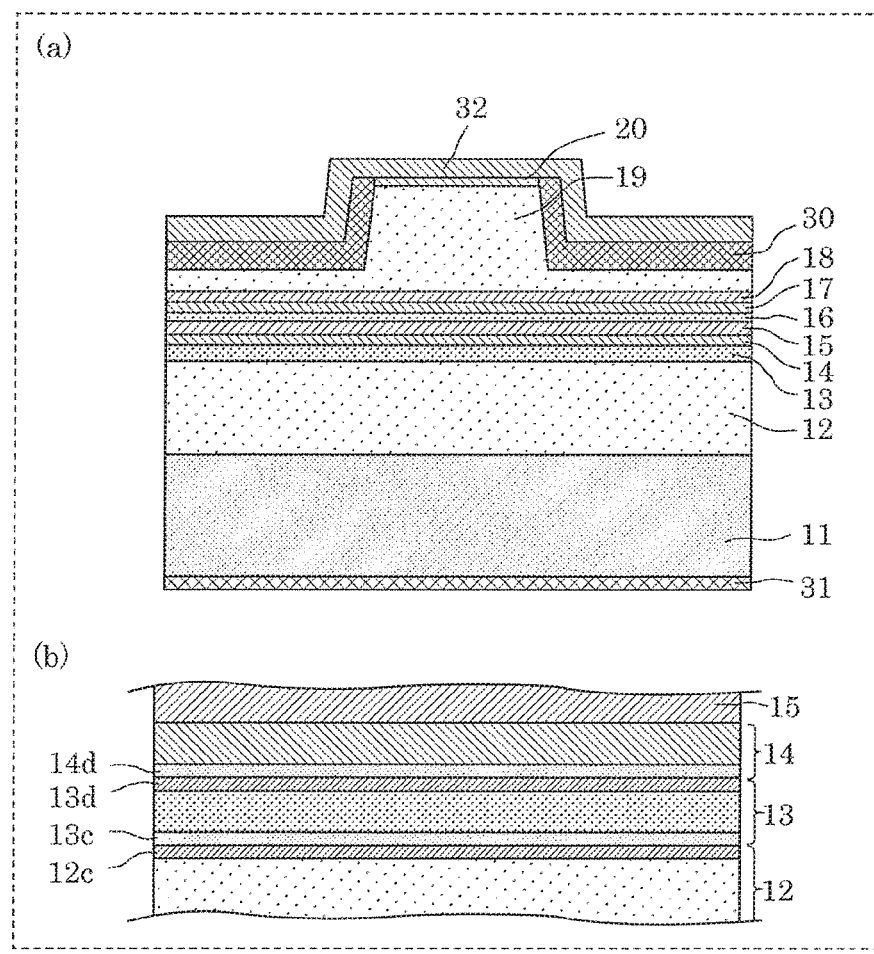
FIG. 20 is a diagram illustrating, in (a), the sectional structure of the light-emitting device according to Embodiment 4 of the present disclosure in a sectional view, and in (b), the vicinity of the interfaces of the N-type AlGaN cladding layer, the second light guide layer, and the third light guide layer in an enlarged view.

As the N-type impurity, Si is used. FIG. 20 illustrates the sectional structure of the light-emitting device.

Figure 21:
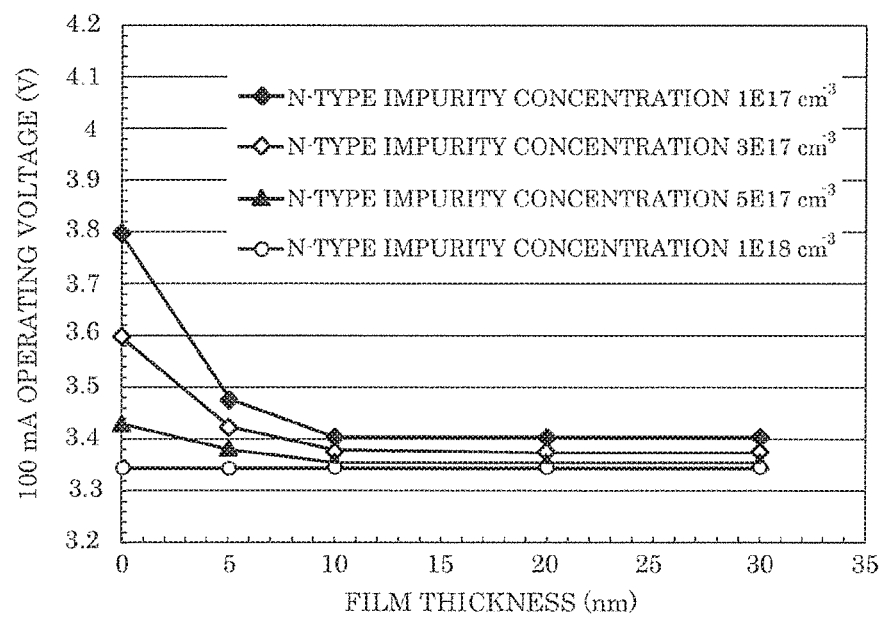
FIG. 21 is a diagram illustrating a calculation result of the dependence of the operating voltage in 100 mA operation on the impurity concentration in the light-emitting device according to Embodiment 4 of the present disclosure.

FIG. 21 illustrates a calculation result of the dependence of the operating voltage in 100 mA operation on film thicknesses z1 and z2 in the case where the N-type impurity concentration of N-type AlGaN cladding layer 12 and second light guide layer 13 is $1\times10^{17}$ cm$^{-3}$, $3\times10^{17}$ cm$^{-3}$, $5\times10^{17}$ cm$^{-3}$, and $1\times10^{18}$ cm$^{-3}$ and third light guide layer 14 is undoped. The other structural parameters are the same as those in the structure in Embodiment 1 of the present disclosure. In the calculation, film thicknesses z1 and z2 are simultaneously changed as the same film thickness.

As illustrated in FIG. 21, when film thicknesses z1 and z2 of the composition change region are increased, the operating voltage is reduced, and becomes approximately constant at film thicknesses z1 and z2 of 10 nm or more. Moreover, when the N-type impurity concentration of N-type AlGaN cladding layer 12 and second light guide layer 13 is $5\times10^{17}$ cm$^{-3}$ or more and film thicknesses z1 and z2 of the composition change region are both 10 nm or more (the film thickness of the composition change region is 20 nm or more), the same operating voltage as in the case where N-type AlGaN cladding layer 12 and second light guide layer 13 are both uniformly doped at an N-type impurity concentration of $1\times10^{18}$ cm$^{-3}$ is obtained.

In this embodiment, the N-type impurity concentration of N-type AlGaN cladding layer 12 and second light guide layer 13 is $5\times10^{17}$ cm$^{-3}$, and film thicknesses z1 and z2 of the composition change region are both 10 nm. Hence, the same operating voltage as in the case where N-type AlGaN cladding layer 12 and second light guide layer 13 are both uniformly doped at an N-type impurity concentration of $1\times10^{18}$ cm$^{-3}$ can be obtained, and a waveguide loss reduction of 0.2 cm$^{-1}$ can be achieved.

Figure 22:
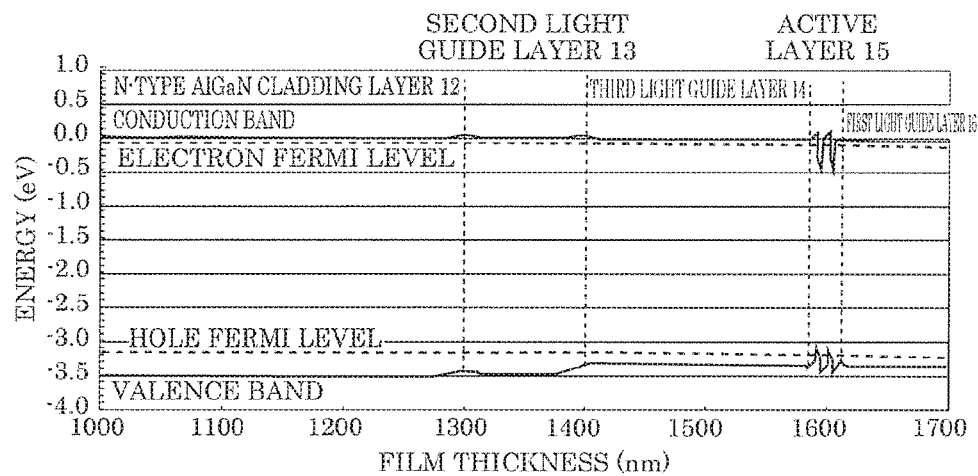
FIG. 22 is a diagram illustrating a calculation result of the band structure of the operating voltage in 100 mA operation in the light-emitting device according to Embodiment 4 of the present disclosure.

FIG. 22 illustrates a calculation result of the band structure in 100 mA operation for the structure of this embodiment in which the N-type impurity concentration of N-type AlGaN cladding layer 12 and second light guide layer 13 is $5\times10^{17}$ cm$^{-3}$ and film thicknesses z1 and z2 of the composition change region are both 10 nm.

As illustrated in FIG. 22, spikes in the energy band of the conduction band formed in the interface are reduced by forming the composition change region in the near-interface region of N-type AlGaN cladding layer 12 and second light guide layer 13 and the near-interface region of second light guide layer 13 and third light guide layer 14.

As described above, in the light-emitting device according to this embodiment, the composition change region in which the composition changes gradually is formed in at least one interface from among the interface between the first cladding layer and the second light guide layer and the interface between the second light guide layer and the third light guide layer. This eliminates the discontinuity of the energy band in the conduction band in the interface, and suppresses the concentration of the piezoelectric charge in the interface, so that the energy band in the conduction band is flattened. The operating voltage of the device can thus be reduced.

Embodiment 5

A light-emitting device according to Embodiment 5 is described below.

To suppress spikes in the band structure in the conduction band in the interface between N-type AlGaN cladding layer 12 and second light guide layer 13 and the interface between second light guide layer 13 and third light guide layer 14, Embodiment 3 describes doping the near-interface region (region of ±10 nm or more from the interface) with an N-type impurity of high concentration of $1\times10^{18}$ cm$^{-3}$ or more, and Embodiment 4 describes providing, in the near-interface region (region of ±10 nm or more from the interface), the composition change region in which the atomic composition is gradually changed so as to interpolate the composition.

Figure 23:
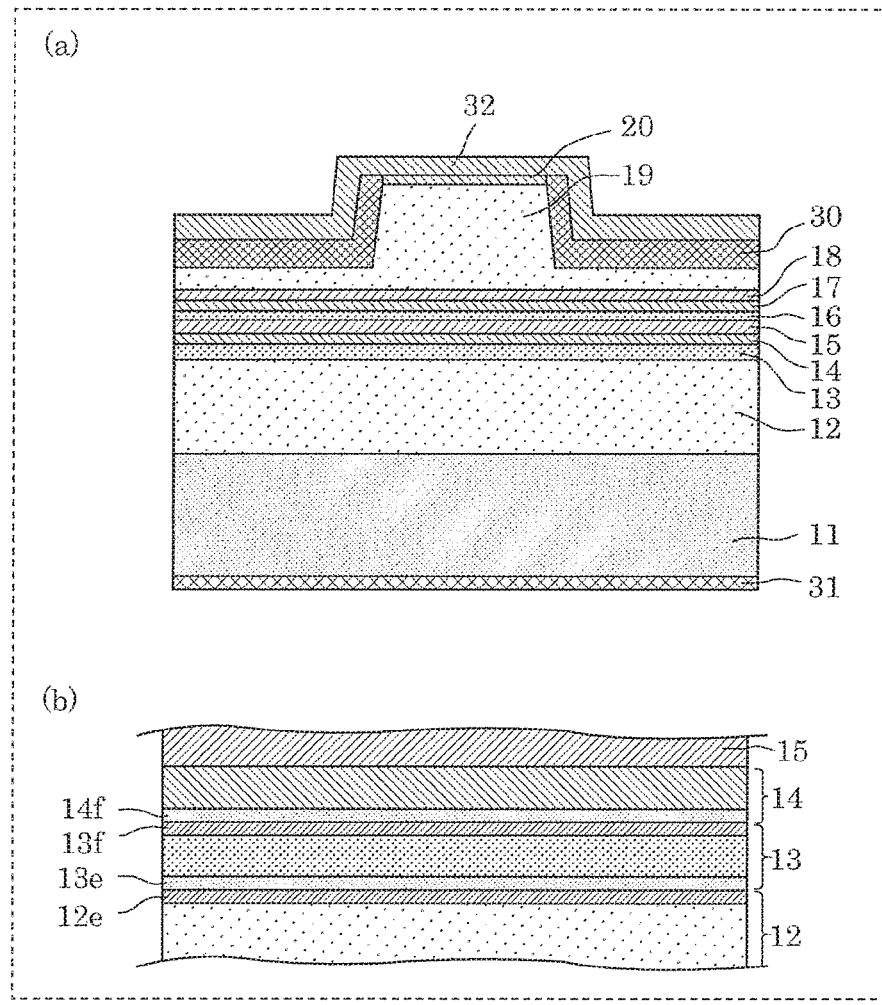
FIG. 23 is a diagram illustrating, in (a), the sectional structure of a light-emitting device according to Embodiment 5 of the present disclosure in a sectional view, and in (b), the vicinity of the interfaces of the N-type AlGaN cladding layer, the second light guide layer, and the third light guide layer in an enlarged view.
Figure 24:
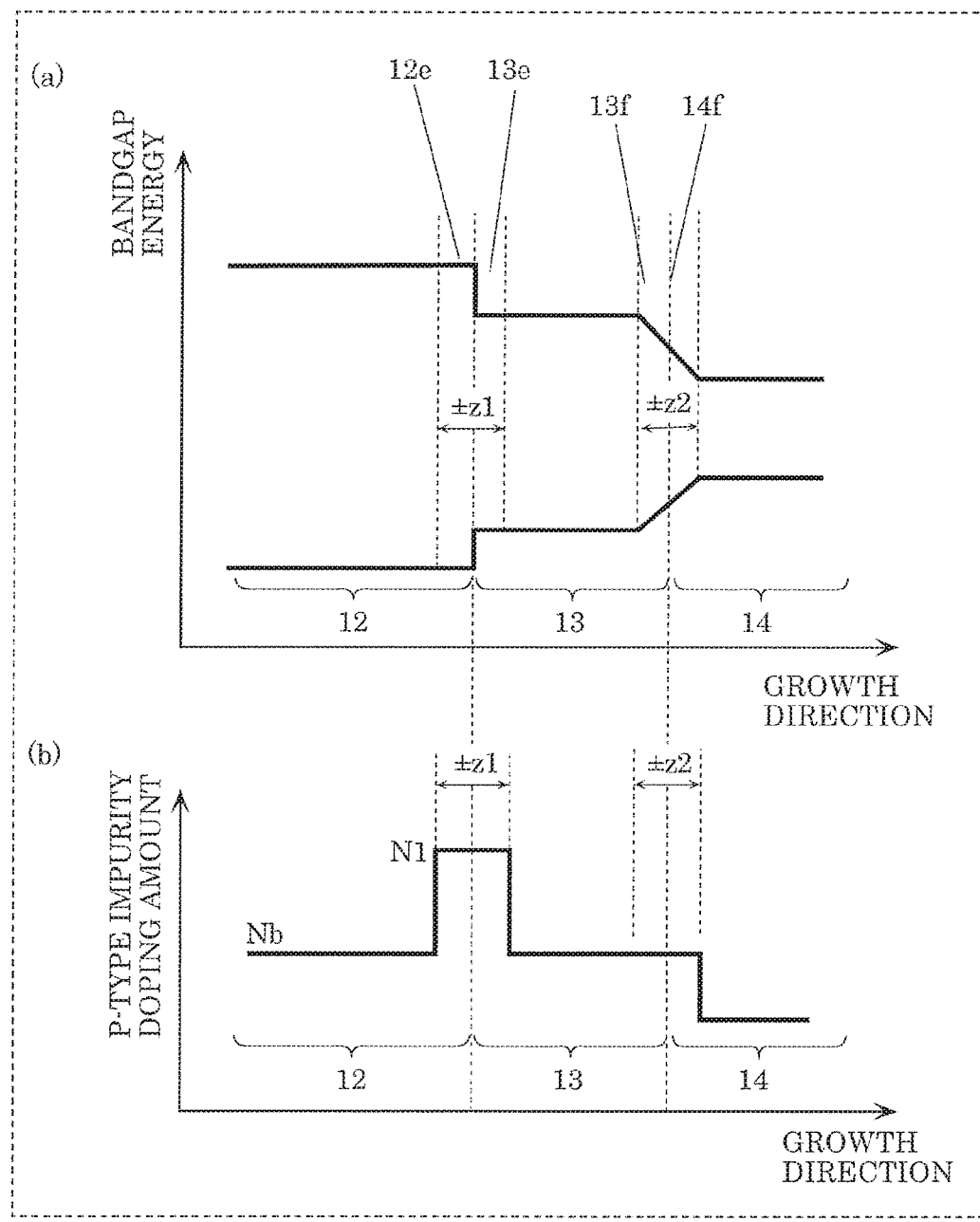
FIG. 24 is a diagram illustrating, in (a), the bandgap energy distribution of the light-emitting device according to Embodiment 5 of the present disclosure, and in (b), the impurity concentration distribution (doping amount) of the light-emitting device according to Embodiment 5 of the present disclosure.

In Embodiment 5 of the present disclosure as illustrated in FIGS. 23 and 24, near-interface regions 12$e$ and 13$e$ (region of ±10 nm or more from the interface) of N-type AlGaN cladding layer 12 and second light guide layer 13 are doped with an N-type impurity of high concentration of $1\times10^{18}$ cm$^{-3}$ or more. In addition, in near-interface regions 13$f$ and 14$f$ (region of ±10 nm or more from the interface) of second light guide layer 13 and third light guide layer 14, the atomic composition is gradually changed so as to interpolate the composition. The operating voltage of the light-emitting device can be reduced in this way.

In detail, as illustrated in (b) in FIG. 23 and FIG. 24, a near-interface region in N-type AlGaN cladding layer 12 from the interface between N-type AlGaN cladding layer 12 and second light guide layer 13 to film thickness z1 is set as high-concentration impurity region 12$e$, and a near-interface region in second light guide layer 13 from the interface between N-type AlGaN cladding layer 12 and second light guide layer 13 to film thickness z1 is set as high-concentration impurity region 13$e$. High-concentration impurity region 12$e$ and high-concentration impurity region 13$e$ are collectively referred to as a first high-concentration impurity region. The first high-concentration impurity region is doped with Si which is an N-type impurity, at a higher concentration than in the high-concentration impurity regions of N-type AlGaN cladding layer 12 other than high-concentration impurity region 12$e$ and the high-concentration impurity regions of second light guide layer 13 other than high-concentration impurity region 13$e$.

Moreover, a near-interface region in second light guide layer 13 from the interface between second light guide layer 13 and third light guide layer 14 to film thickness z2 is set as composition change region 13$f$, and a near-interface region in third light guide layer 14 from the interface between second light guide layer 13 and third light guide layer 14 to film thickness z2 is set as composition change region 14$f$. Composition change region 13$f$ and composition change region 14$f$ are collectively referred to as a second composition change region.

Thus, as illustrated in FIG. 24, in the sectional structure illustrated in FIG. 23, high-concentration impurity regions 12$e$ and 13$e$ (film thickness: 20 nm) within ±10 nm from the interface between N-type AlGaN cladding layer 12 and second light guide layer 13 are doped with an N-type impurity of $1\times10^{18}$ cm$^{-3}$. Here, Nb1 is $1\times10^{17}$ cm$^{-3}$, and Nb2 is $5\times10^{17}$ cm$^{-3}$. Moreover, in composition change regions 13$f$ and 14$f$ of ±10 nm or less from the interface between second light guide layer 13 and third light guide layer 14, the atomic composition is gradually changed.

With this structure, an increase in the operating voltage caused by spikes in the N-type layer interface can be suppressed. The same operating voltage as in the structure of doping N-type AlGaN cladding layer 12 and second light guide layer 13 uniformly with an N-type impurity of $1\times10^{18}$ cm$^{-3}$ and a loss reduction of 0.2 cm$^{-1}$ can thus be achieved.

Embodiment 6

A light-emitting device according to Embodiment 6 is described below.

To suppress spikes in the band structure in the conduction band in the interface between N-type AlGaN cladding layer 12 and second light guide layer 13 and the interface between second light guide layer 13 and third light guide layer 14, Embodiment 3 describes doping the near-interface region (region of ±10 nm or more from the interface) with an N-type impurity of high concentration of $1\times10^{18}$ cm$^{-3}$ or more, and Embodiment 4 describes providing, in the near-interface region (region of ±10 nm or more from the interface), the composition change region in which the atomic composition is gradually changed so as to interpolate the composition.

Figure 25:
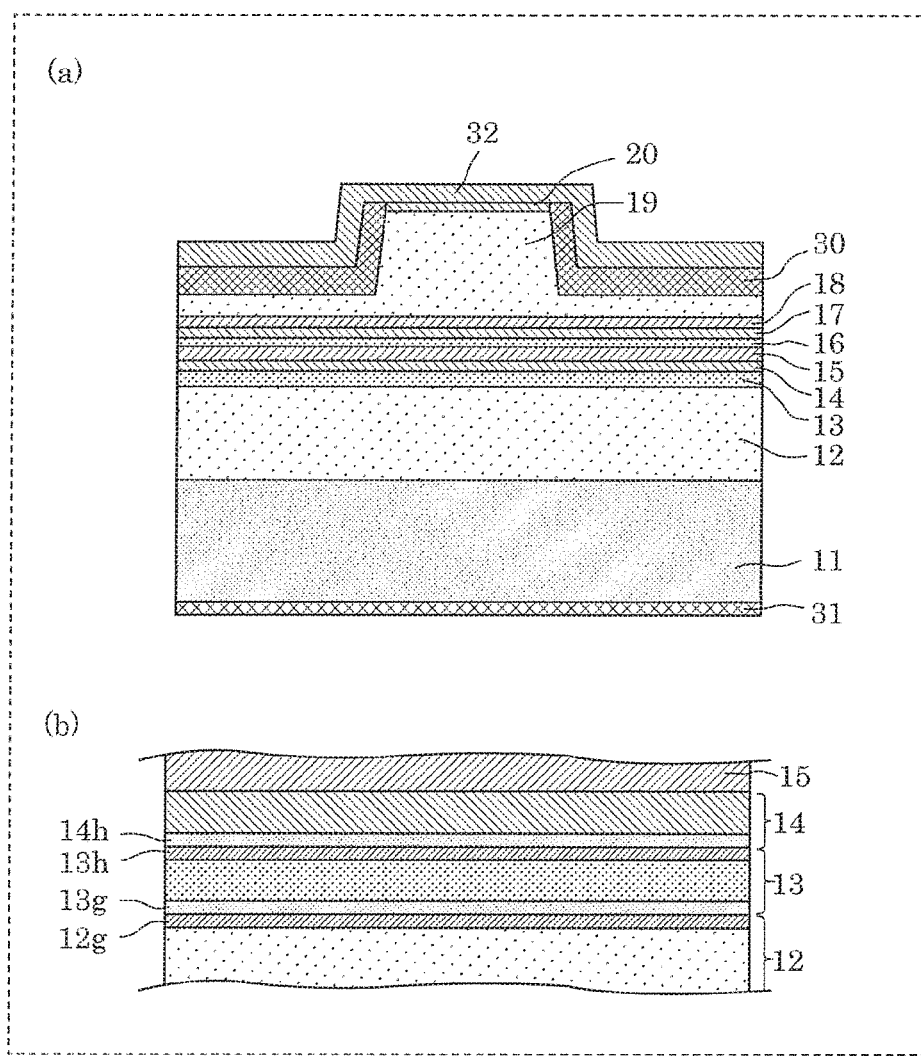
FIG. 25 is a diagram illustrating, in (a), the sectional structure of a light-emitting device according to Embodiment 6 of the present disclosure, and in (b), the vicinity of the interfaces of the N-type AlGaN cladding layer, the second light guide layer, and the third light guide layer in an enlarged view.
Figure 26:
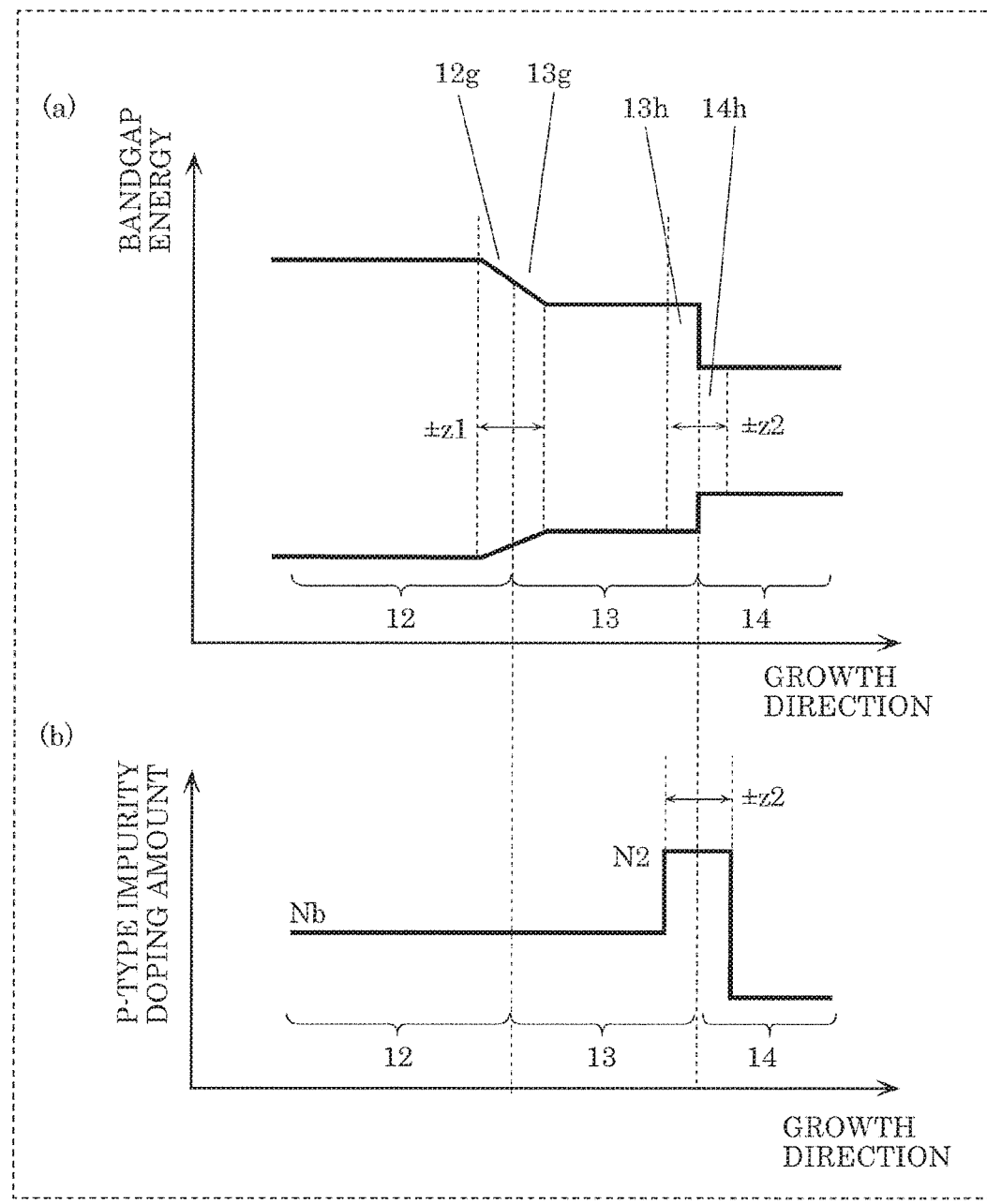
FIG. 26 is a diagram illustrating, in (a), the bandgap energy distribution of the light-emitting device according to Embodiment 6 of the present disclosure, and in (b), the impurity concentration distribution (doping amount) of the light-emitting device according to Embodiment 6 of the present disclosure.

In Embodiment 6 of the present disclosure as illustrated in FIGS. 25 and 26, near-interface regions (region of ±10 nm or more from the interface) of second light guide layer 13 and third light guide layer 14 are doped with an N-type impurity of high concentration of $1\times10^{18}$ cm$^{-3}$ or more. In addition, in near-interface regions (region of ±10 nm or more from the interface) of N-type AlGaN cladding layer 12 and second light guide layer 13, the atomic composition is gradually changed so as to interpolate the composition.

In detail, as illustrated in (b) in FIG. 25 and FIG. 26, a near-interface region in second light guide layer 13 from the interface between second light guide layer 13 and third light guide layer 14 to film thickness z2 is set as high-concentration impurity region 13$h$, and a near-interface region in third light guide layer 14 from the interface between second light guide layer 13 and third light guide layer 14 to film thickness z2 is set as high-concentration impurity region 14$h$. High-concentration impurity region 13$h$ and high-concentration impurity region 14$h$ are collectively referred to as a third high-concentration impurity region. The third high-concentration impurity region is doped with Si which is an N-type impurity, at a higher concentration than in the high-concentration impurity regions of N-type AlGaN cladding layer 12 other than high-concentration impurity region 12$g$ and the high-concentration impurity regions of second light guide layer 13 other than high-concentration impurity region 13$g$.

Moreover, a near-interface region in N-type AlGaN cladding layer 12 from the interface between N-type AlGaN cladding layer 12 and second light guide layer 13 to film thickness z1 is set as composition change region 12$g$, and a near-interface region in second light guide layer 13 from the interface between N-type AlGaN cladding layer 12 and second light guide layer 13 to film thickness z1 is set as composition change region 13$g$. Composition change region 12$g$ and composition change region 13$g$ are collectively referred to as a first composition change region.

Thus, as illustrated in FIG. 26, in the sectional structure illustrated in FIG. 25, high-concentration impurity regions 13$h$ and 14$h$ (film thickness: 20 nm) within ±10 nm from the interface between second light guide layer 13 and third light guide layer 14 are doped with an N-type impurity of $1\times10^{18}$ cm$^{-3}$. Here, Nb1 is 5×10$^{17}$ cm$^{-3}$, and Nb2 is undoped. Moreover, in composition change regions 12g and 13g of ±10 nm or less from the interface between N-type AlGaN cladding layer 12 and second light guide layer 13, the atomic composition is gradually changed.

With this structure, an increase in the operating voltage caused by spikes in the N-type layer interface can be suppressed. The same operating voltage as in the structure of doping N-type AlGaN cladding layer 12 and second light guide layer 13 uniformly with an N-type impurity of 1×10$^{18}$ cm$^{-3}$ and a loss reduction of 0.2 cm$^{-1}$ can thus be achieved.

Other Embodiments

The present disclosure is not limited to the structures described in the foregoing embodiments. For example, the following modifications may be made as appropriate.

Figure 27:
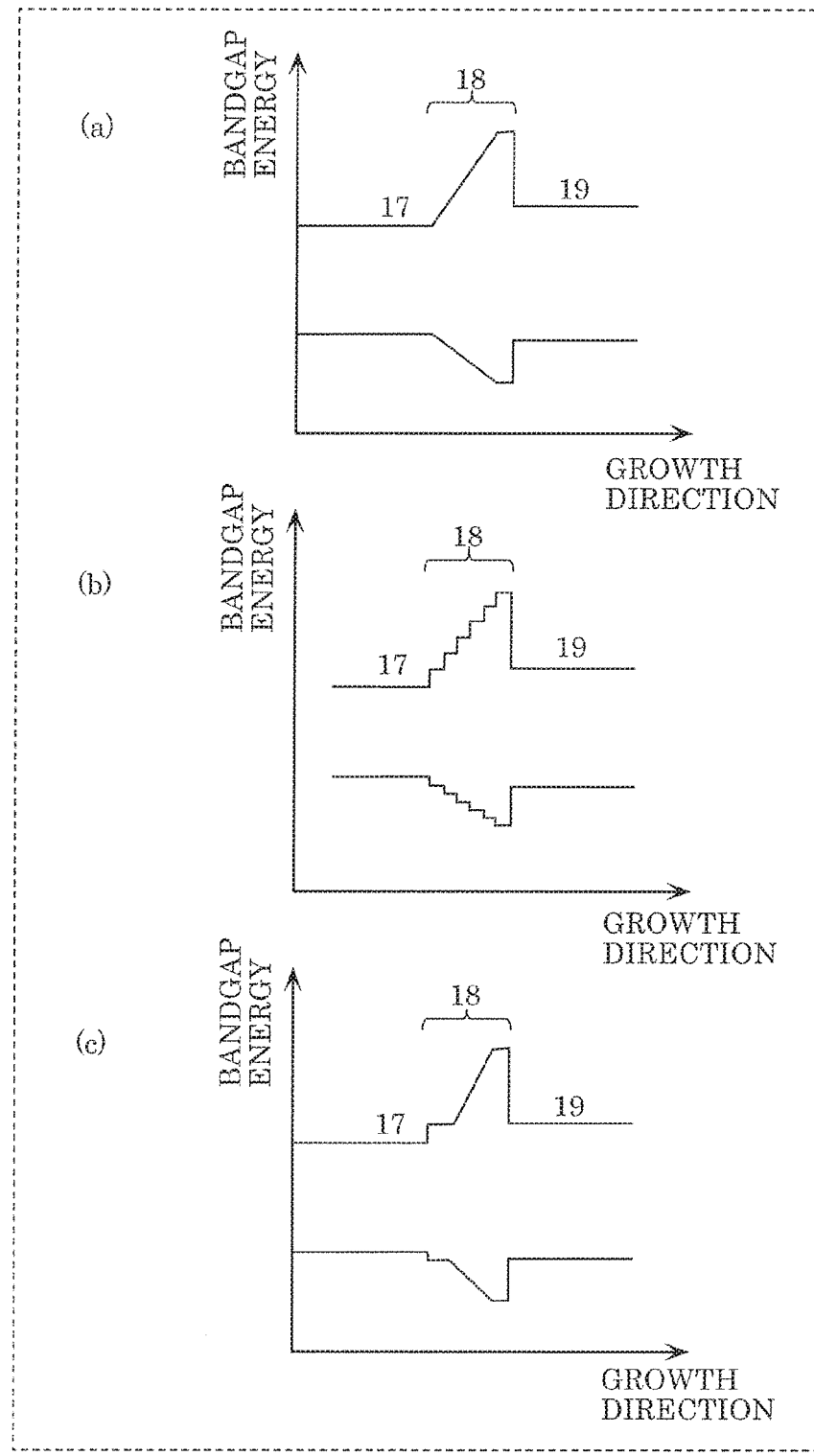
FIG. 27 is a diagram illustrating, in (a), an example of the band structure distribution of the electron barrier layer in the light-emitting device according to Embodiment 6 of the present disclosure, in (b), another example of the band structure distribution, and in (c), yet another example of the band structure distribution.

In foregoing Embodiments 1 to 6, the Al composition change region of electron barrier layer 18 has a structure in which the Al composition gradually changes, as illustrated in (a) in FIG. 27. Alternatively, in the Al composition change region of electron barrier layer 18, the Al composition may be changed step-like as illustrated in (b) in FIG. 27, or a region having the step-like change and a region having the gradual continuous change may be used in combination as illustrated in (c) in FIG. 27. In the present disclosure, "monotonic increase" is any change that increases in value, and includes any of linear, curved, step-like, and other changes.

With the structures illustrated in (b) and (c) in FIG. 27, too, the piezoelectric charge generated in the region of electron barrier layer 18 on the multiquantum well active layer 15 side can be dispersed in the interface of each step, so that the piezoelectric field can be canceled out by the bandgap change in electron barrier layer 18. Hence, spikes forming a potential barrier against holes in the valence band structure can be suppressed.

Although the foregoing embodiments describe the case where P-type AlGaN cladding layer 19 is made of AlGaN as a single composition, P-type AlGaN cladding layer 19 may be, for example, a superlattice layer composed of P-type AlGaN and P-type GaN.

Although the foregoing embodiments describe the case where the structure of the light-emitting device in which one of a high-concentration impurity region and a composition change region is provided in the near-interface region of N-type AlGaN cladding layer 12 and second light guide layer 13 and the near-interface region of second light guide layer 13 and third light guide layer 14 has the effect of voltage reduction and waveguide loss reduction, this is not a limitation. The near-interface region may have both a high-concentration impurity region and a composition change region. This also has the effect of voltage reduction and waveguide loss reduction.

Likewise, the interface between GaN substrate 11 and N-type AlGaN cladding layer 12 may have at least one of a high-concentration impurity region and a composition change region. This has the voltage reduction effect. In particular, since the light distribution intensity of the waveguide decays near GaN substrate 11, even when a high-concentration N-type impurity is provided in the interface between GaN substrate 11 and N-type AlGaN cladding layer 12, the free carrier loss hardly increases. Thus, voltage reduction can be achieved without a waveguide loss increase.

Although the foregoing embodiments describe the case where the structure of the light-emitting device in which one of a high-concentration impurity region and a composition change region is provided in the near-interface region of N-type AlGaN cladding layer 12 and second light guide layer 13 and the near-interface region of second light guide layer 13 and third light guide layer 14 has the effect of voltage reduction and waveguide loss reduction, this is not a limitation. The light-emitting device may have at least one of a high-concentration impurity region and a composition change region only in one of the near-interface region of N-type AlGaN cladding layer 12 and second light guide layer 13 and the interface between second light guide layer 13 and third light guide layer 14. This also has the effect of voltage reduction and waveguide loss reduction.

Other modifications obtained by applying various changes conceivable by a person skilled in the art to each embodiment and any combinations of the structural elements and functions in each embodiment without departing from the scope of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The presently disclosed technique can be used for light sources for vehicle headlights capable of ultrahigh-power operation and having excellent temperature characteristics.

What is claimed is:

1. A nitride-based light-emitting device comprising, on a GaN substrate:
   a first-conductivity-side first semiconductor layer including a nitride-based semiconductor of a first conductivity type;
   an active layer including a nitride-based semiconductor containing Ga or In;
   a second-conductivity-side first semiconductor layer including a nitride-based semiconductor of a second conductivity type, in the stated order;
   a first-conductivity-side second semiconductor layer located between the first-conductivity-side first semiconductor layer and the active layer; and
   an electron barrier layer of the second conductivity type between the active layer and the second-conductivity-side first semiconductor layer, the electron barrier layer including a nitride-based semiconductor containing at least Al, wherein:
   the electron barrier layer has a first region in which an Al composition changes,
   the Al composition in the first region monotonically increases in a direction from the active layer to the second-conductivity-side first semiconductor layer,
   an impurity concentration in the second-conductivity-side first semiconductor layer is lower in a region nearer the electron barrier layer than in a region farther from the electron barrier layer,
   E1>E2 is satisfied, where E1 is a bandgap energy of the first-conductivity-side first semiconductor layer, and E2 is a bandgap energy of the first-conductivity-side second semiconductor layer, and
   at least one of a second region in the first-conductivity-side first semiconductor layer adjacent to an interface between the first-conductivity-side first semiconductor layer and the first-conductivity-side second semiconductor layer and a third region in the first-conductivity-side second semiconductor layer adjacent to an interface between the first-conductivity-side second semiconductor layer and the first-conductivity-side first semiconductor layer forms at least one of a high-concentration impurity region and a composition change region, the high-concentration impurity region being a region doped with an impurity of a concentration higher than an impurity concentration in a fourth region in the first-conductivity-side first semiconductor layer adjacent to the second region and a fifth region in the first-conductivity-side second semiconductor layer adjacent to the third region, and the composition change region being a region in which a composition changes to interpolate an atomic composition from the fourth region to the fifth region.

2. The nitride-based light-emitting device according to claim 1, further comprising:
a first-conductivity-side third semiconductor layer located between the first-conductivity-side second semiconductor layer and the active layer,
wherein E2>E3, where E3 is a bandgap energy of the first-conductivity-side third semiconductor layer.

3. The nitride-based light-emitting device according to claim 2,
wherein at least one of a sixth region in the first-conductivity-side second semiconductor layer adjacent to an interface between the first-conductivity-side second semiconductor layer and the first-conductivity-side third semiconductor layer and a seventh region in the first-conductivity-side third semiconductor layer adjacent to an interface between the first-conductivity-side third semiconductor layer and the first-conductivity-side second semiconductor layer forms at least one of a high-concentration impurity region and a composition change region, the high-concentration impurity region being a region doped with an impurity of a concentration higher than an impurity concentration in an eighth region in the first-conductivity-side second semiconductor layer adjacent to the sixth region and a ninth region in the first-conductivity-side third semiconductor layer adjacent to the seventh region, and the composition change region being a region in which a composition changes to interpolate an atomic composition from the eighth region to the ninth region.

4. The nitride-based light-emitting device according to claim 2,
wherein a film thickness of the first-conductivity-side third semiconductor layer is thicker than a film thickness of the first-conductivity-side second semiconductor layer.

5. The nitride-based light-emitting device according to claim 1,
wherein an impurity concentration in the high-concentration impurity region is $1\times10^{18}$ cm$^{-3}$ or more and $1.5\times10^{18}$ cm$^{-3}$ or less, and
the high-concentration impurity region is formed in a region from an interface adjacent to the high-concentration impurity region to a distance of 10 nm or more and 20 nm or less from the interface.

6. The nitride-based light-emitting device according to claim 1,
wherein an impurity concentration in the high-concentration impurity region is $2\times10^{18}$ cm$^{-3}$ or more and $2.5\times10^{18}$ cm$^{-3}$ or less, and the high-concentration impurity region is formed in a region from an interface adjacent to the high-concentration impurity region to a distance of 5 nm or more and 10 nm or less from the interface.

7. The nitride-based light-emitting device according to claim 1,
wherein an impurity concentration in the composition change region is $5\times10^{17}$ cm$^3$ or more, and
the composition change region is formed in a region from an interface adjacent to the composition change region to a distance of 10 nm or more from the interface.

8. The nitride-based light-emitting device according to claim 1,
wherein the electron barrier layer has a tenth region in which an Al composition is constant, and
the tenth region is located between the first region and the second-conductivity-side first semiconductor layer.

9. The nitride-based light-emitting device according to claim 8,
wherein a film thickness of the tenth region is thinner than a film thickness of the first region.

10. The nitride-based light-emitting device according to claim 8,
wherein the electron barrier layer has an Al composition decrease region,
the Al composition decrease region is located between the tenth region and the second-conductivity-side first semiconductor layer,
an Al composition in the Al composition decrease region monotonically decreases in the direction from the active layer to the second-conductivity-side first semiconductor layer,
a film thickness of the tenth region is 2 nm or less, and
a film thickness of the Al composition decrease region is 5 nm or less.

11. The nitride-based light-emitting device according to claim 1,
wherein a maximum ratio of an Al composition in the electron barrier layer is 25% or more.

12. The nitride-based light-emitting device according to claim 1,
wherein an impurity concentration in the electron barrier layer is $1\times10^{19}$ cm$^{-3}$ or more.

13. The nitride-based light-emitting device according to claim 1,
wherein a film thickness of the region nearer the electron barrier layer in the second-conductivity-side first semiconductor layer is 200 nm or more and 300 nm or less, and
an impurity concentration in the region nearer the electron barrier layer in the second-conductivity-side first semiconductor layer is $1\times10^{18}$ cm$^{-3}$ or more and $5\times10^{18}$ cm$^{-3}$ or less.

14. The nitride-based light-emitting device according to claim 1, further comprising:
a second-conductivity-side second semiconductor layer located between the active layer and the electron barrier layer.

15. The nitride-based light-emitting device according to claim 14, further comprising:
a second-conductivity-side third semiconductor layer located between the second-conductivity-side second semiconductor layer and the second-conductivity-side first semiconductor layer, and having a bandgap energy that is higher than a bandgap energy of the second-conductivity-side second semiconductor layer and not higher than a bandgap energy of the first region.

16. The nitride-based light-emitting device according to claim 1,
wherein a change in a band structure of a valence band of the electron barrier layer caused by a piezoelectric field is canceled out by a change in the valence band structure caused by the Al composition change of the first region.

17. A nitride-based light-emitting device comprising, on a GaN substrate:
a first-conductivity-side first semiconductor layer including a nitride-based semiconductor of a first conductivity type;
an active layer including a nitride-based semiconductor containing Ga or In;
a second-conductivity-side first semiconductor layer including a nitride-based semiconductor of a second conductivity type, in the stated order;
a first-conductivity-side second semiconductor layer located between the first-conductivity-side first semiconductor layer and the active layer;
a first-conductivity-side third semiconductor layer located between the first-conductivity-side second semiconductor layer and the active layer, and
an electron barrier layer of the second conductivity type between the active layer and the second-conductivity-side first semiconductor layer, the electron barrier layer including a nitride-based semiconductor containing at least Al, wherein:
the electron barrier layer has a first region in which an Al composition changes,
the Al composition in the first region monotonically increases in a direction from the active layer to the second-conductivity-side first semiconductor layer,
an impurity concentration in the second-conductivity-side first semiconductor layer is lower in a region nearer the electron barrier layer than in a region farther from the electron barrier layer,
E1>E2 is satisfied, where E1 is a bandgap energy of the first-conductivity-side first semiconductor layer, and E2 is a bandgap energy of the first-conductivity-side second semiconductor layer,
E2>E3 is satisfied, where E3 is a bandgap energy of the first-conductivity-side third semiconductor layer, and
at least one of a second region in the first-conductivity-side second semiconductor layer adjacent to an interface between the first-conductivity-side second semiconductor layer and the first-conductivity-side third semiconductor layer and a third region in the first-conductivity-side third semiconductor layer adjacent to an interface between the first-conductivity-side third semiconductor layer and the first-conductivity-side second semiconductor layer forms at least one of a high-concentration impurity region and a composition change region, the high-concentration impurity region being a region doped with an impurity of a concentration higher than an impurity concentration in a fourth region in the first-conductivity-side second semiconductor layer adjacent to the second region and a fifth region in the first-conductivity-side third semiconductor layer adjacent to the third region, and the composition change region being a region in which a composition changes to interpolate an atomic composition from the fourth region to the fifth region.

18. The nitride-based light-emitting device according to claim 17,
wherein an impurity concentration in the high-concentration impurity region is $1\times10^{18}$ cm$^{-3}$ or more and $1.5\times10^{18}$ cm$^{-3}$ or less, and
the high-concentration impurity region is formed in a region from an interface adjacent to the high-concentration impurity region to a distance of 10 nm or more and 20 nm or less from the interface.

19. The nitride-based light-emitting device according to claim 17,
wherein an impurity concentration in the high-concentration impurity region is $2\times10^{18}$ cm$^{-3}$ or more and $2.5\times10^{18}$ cm$^{-3}$ or less, and
the high-concentration impurity region is formed in a region from an interface adjacent to the high-concentration impurity region to a distance of 5 nm or more and 10 nm or less from the interface.

20. The nitride-based light-emitting device according to claim 17,
wherein an impurity concentration in the composition change region is $5\times10^{17}$ cm$^{-3}$ or more, and
the composition change region is formed in a region from an interface adjacent to the composition change region to a distance of 10 nm or more from the interface.

* * * * *